(12) United States Patent
Sakurai et al.

(10) Patent No.: US 7,541,619 B2
(45) Date of Patent: Jun. 2, 2009

(54) ELECTRO-OPTICAL DEVICE, IMAGE FORMING APPARATUS, AND IMAGE READER

(75) Inventors: Kazunori Sakurai, Chino (JP); Toshinori Tanaka, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 152 days.

(21) Appl. No.: 11/217,455

(22) Filed: Sep. 2, 2005

(65) Prior Publication Data

US 2006/0065903 A1    Mar. 30, 2006

(30) Foreign Application Priority Data

| Sep. 29, 2004 | (JP) | ............................ 2004-283650 |
| Sep. 30, 2004 | (JP) | ............................ 2004-288717 |
| Sep. 30, 2004 | (JP) | ............................ 2004-288718 |
| Sep. 30, 2004 | (JP) | ............................ 2004-288719 |
| Dec. 1, 2004 | (JP) | ............................ 2004-348232 |
| Jan. 11, 2005 | (JP) | ............................ 2005-003431 |

(51) Int. Cl.
*H01L 29/16* (2006.01)
*H01L 29/18* (2006.01)

(52) U.S. Cl. ............................ 257/82; 257/88; 257/100

(58) Field of Classification Search ................. 257/100, 257/59, 67, 68, 71, 72, 82, 88, E33.057–E33.06, 257/E21.499; 438/22, 24

See application file for complete search history.

(56) References Cited

U.S. PATENT DOCUMENTS

| 5,696,607 | A | * | 12/1997 | Yamana et al. | ............... 358/474 |
| 6,359,606 | B1 | | 3/2002 | Yudasaka | |
| 6,504,565 | B1 | * | 1/2003 | Narita et al. | ................. 347/237 |
| 6,825,867 | B2 | * | 11/2004 | Koga et al. | ................... 347/238 |
| 2003/0197475 | A1 | * | 10/2003 | Takamura et al. | ........ 315/169.4 |
| 2005/0087747 | A1 | * | 4/2005 | Yamada et al. | ................. 257/80 |

FOREIGN PATENT DOCUMENTS

| JP | A 11-274569 | 10/1999 |
| JP | A 2000-058255 | 2/2000 |
| JP | 2001-117509 | * 4/2001 |
| JP | A 2001-130048 | 5/2001 |
| JP | A 2001-343933 | 12/2001 |
| KR | 2000-68846 A | 11/2000 |
| KR | 1020020047889 | * 6/2002 |
| KR | 1020030084233 | * 11/2003 |
| KR | 1020040079476 | * 9/2004 |
| WO | WO 02/078101 | * 3/2002 |

* cited by examiner

*Primary Examiner*—Hung Vu
(74) *Attorney, Agent, or Firm*—Oliff & Berridge, PLC

(57) ABSTRACT

An electro-optical device includes a substrate, a plurality of self-emitting elements formed in the substrate, a sealing member attached to the substrate so as to seal the self-emitting elements in cooperation with the substrate, and a circuit that is disposed to overlap the sealing member and that drives or controls the self-emitting elements.

2 Claims, 30 Drawing Sheets

ELECTRO-OPTICAL DEVICE, IMAGE FORMING APPARATUS, AND IMAGE READER

This application claims the benefit of Japanese Patent Applications No. 2004-283650 filed Sep. 29, 2004, No. 2004-288717 filed Sep. 30, 2004, No. 2004-288718 filed Sep. 30, 2004, No. 2004-288719 filed Sep. 30, 2004, No. 2004-348232 filed Dec. 1, 2004 and No. 2005-003431 filed Jan. 11, 2005. The entire disclosure of the prior applications is hereby incorporated by reference herein in its entirety.

BACKGROUND

The present invention relates to an electro-optical device including self-emitting elements, and to an image forming apparatus and an image reader each including the electro-optical device.

Attention has been recently paid to organic light-emitting diode (hereinafter, referred to as OLED) elements, such as organic electroluminescent elements or light-emitting polymer elements, as next-generation light-emitting devices that replaces liquid crystal elements. The OLED elements are self-emitting elements which emit light according to an applied voltage, unlike light valves such as liquid crystal. For example, as disclosed in Japanese Unexamined Patent Application Publication No. 2000-58255 and Japanese Unexamined Patent Application Publication No. 2001-343933, the OLED elements are used in display devices.

Electrophotographic image forming apparatuses in which a line head having a plurality of OLED elements arrayed therein are used as an exposing unit, i.e., a latent image writing unit, have been developed. In addition to the OLED elements, the line head is provided with a plurality of pixel circuits including transistors to drive the OLED elements. For example, Japanese Unexamined Patent Application Publication No. 11-274569 and Japanese Unexamined Patent Application Publication No. 2001-130048 disclose such line heads.

For example, an electro-optical device like the above line head includes a substrate (element substrate) having an area larger than a certain size such that the OLED element are formed. For example, in the techniques disclosed in Japanese Unexamined Patent Application Publication No. 2000-58255 and Japanese Unexamined Patent Application Publication No. 2001-130048, since a circuit element that drives or controls an OLED element is disposed on the element substrate, the element substrate could not keep having an area larger than a certain size. The element substrate is obtained by, first, forming a plurality of OLED elements on one large original substrate, and then dicing the original substrate into a plurality of element substrates. The larger the size of an element substrate corresponding to one electro-optical device is, the fewer the resulting number of element substrates obtained from the original substrate is and the fewer the number of OLED elements obtained from the original substrate is.

Many kinds of materials or many processes are required for forming the OLED elements. Among these processes, there are processes that require cost and time unique to the OLED elements. If a plurality of OLED elements are collectively formed in one original substrate, the resulting manufacturing cost of the element substrates is reduced. Also, the more the number of OLED elements which can be formed on one large original substrate is, the smaller the resulting manufacturing cost of element substrates becomes.

SUMMARY

An advantage of the invention is that it provides an electro-optical device which allows the area of an element substrate to be reduced more easily, and an image forming apparatus and an image reader each including the electro-optical device.

According to one aspect of the invention, an electro-optical device includes a substrate, a plurality of self-emitting elements formed in the substrate, a sealing member attached to the substrate so as to seal the self-emitting elements in cooperation with the substrate, and a circuit that is disposed to overlap the sealing member and that drives or controls the self-emitting elements. According to this arrangement, since the circuit that drives or controls the self-emitting elements overlaps the sealing member that seals the self-emitting elements, it is possible to reduce the area of the substrate having the self-emitting elements formed thereon. Accordingly, it is possible to increase the number of element substrates obtained from one large original substrate, and it is thus possible to increase the number of OLED elements which can be formed on one large original substrate.

Preferably, the electro-optical device further includes a second substrate attached to the side of the sealing member opposite to the substrate. The circuit is provided on the second substrate, and the second substrate is provided with a power line that feeds at least any one of the circuit and the self-emitting elements with power. Since the power line for feeding the plurality of self-emitting elements and the circuit with power need to flow a large amount of current therethrough, it have large cross-sectional area. If such a power line is provided on the substrate having the self-emitting elements formed thereon, a substrate having large area becomes necessary. However, according to this arrangement, the power line for feeding at least one of the circuit and the self-emitting elements with power is provided on the second substrate provided with the circuit, so that the area of the substrate having the self-emitting elements formed thereon can be reduced.

Preferably, the circuit includes a thin film transistor formed on the sealing member. Also, the sealing member is provided with a power line that feeds at least one of the TFT and the self-emitting elements with power. According to this arrangement, since not only the TFT that drives or controls the self-emitting elements, but also the power line that feeds at least one of the TFT and the self-emitting elements with power are formed on the sealing member that seals the self-emitting elements, it is possible to reduce the area of the substrate having the self-emitting elements formed thereon.

Preferably, the circuit is attached to the sealing member, and the thermal conductivity of the sealing member is higher than that of the substrate. According to this arrangement, since the circuit that drives or controls the self-emitting elements overlaps the sealing member that seals the self-emitting elements, it is possible to reduce the area of the substrate having the self-emitting elements formed thereon. The self-emitting elements, such as OLED elements, radiate heat at the time of its light emission, and vary in luminance depending on temperature. Accordingly, it is considered that heat-radiating fins are provided as measures for dissipating the heat from the self-emitting elements. However, in this form, since the heat generated in the self-emitting elements is efficiently radiated through the sealing member having a higher thermal conductivity than the substrate, other measures for heat radiation can be minimized, so that an increase in number of parts or size of the electro-optical device can be suppressed.

Preferably, the electro-optical device further includes a power line that is provided in the sealing member so as to overlap the substrate and that feeds at least one of the circuit and the self-emitting elements with power. The circuit is also provided on the sealing member so as not to overlap the substrate. According to this arrangement, since the circuit and the power lines are provided in the sealing member, it is possible to reduce the area of the substrate having the self-emitting elements formed thereon, compared to the case in which only one of both the circuit and the power lines is provided in the element substrate.

Further, according to this arrangement, the circuit and the power line do not overlap the substrate. Accordingly, even if the electro-optical device is a type (bottom emission type) in which the light from the self-emitting elements travels through the substrate, or even if it is a type (top emission type) in which the light from the self-emitting elements travels through the sealing member, the light from the self-emitting elements is not shielded by the circuit and the power line. In other words, the electro-optical device of the invention can be applied to both the types.

Preferably, the circuit is a laminate formed on the sealing member. In this form, since electrical connection by some connecting terminals becomes unnecessary, the manufacturing processes of the electro-optical device can be saved. Also, since the electrical connection by some connecting terminals becomes unnecessary and thereby probability of occurrence of poor electrical conduction decreases, the reliability of the electro-optical device improves. Further, the electro-optical device can be made small compared to the case in which the circuit elements are attached to the sealing member.

The electro-optical device may further include a heat-radiating mechanism that is attached to the sealing member to radiate conducted heat into ambient air. Thereby, since the heat emitted by the power line and the circuit is easily discharged to ambient air, the heat transferred to the self-emitting elements from the power line and the circuit can be reduced. Thus, bad influence of the heat from the power line and the circuit on the self-emitting elements can be reduced.

Preferably, the electro-optical device further includes a wiring board attached to the sealing member, and a power line provided on the wiring board to feed at least one of the circuit and the self-emitting elements with power. Since the power line for feeding the plurality of self-emitting elements and the circuit with power need to flow a large amount of current therethrough, it have large cross-sectional area. If such a power line is provided on the substrate having the self-emitting elements formed thereon, a substrate having large area becomes necessary. However, according to this arrangement, since such a power line overlaps the sealing member that seals the self-emitting elements, it is possible to reduce the area of the substrate having the self-emitting elements formed thereon.

Preferably, the circuit is attached to the sealing member. According to this arrangement, since the circuit that drives or controls the self-emitting elements overlaps the sealing member that seals the self-emitting elements, it is possible to further reduce the area of the substrate having the self-emitting elements formed thereon.

Preferably, the power line is separated from the substrate and the sealing member. As a method of electrically connecting the power line to the circuit or the self-emitting elements, there is a method applying heat to the power line. Since the self-emitting elements are weak to heat, the self-emitting elements may be damaged or deteriorated when the heat from the power line reaches the self-emitting elements. Accordingly, when the method is employed in manufacturing general electro-optical devices, manufacturing processes are limited. However, according to this arrangement, since it is hard for the heat from the power line to reach the self-emitting elements, the degree of freedom in manufacturing processes can be increased.

Preferably, the circuit is composed of a semiconductor, and a part or all of the circuit is covered with a light-shielding film. The circuit formed using semiconductors may malfunction when exposed to light. However, according to this form, since the quantity of light to arrive at the circuit decreases, the probability of malfunction of the circuit can be reduced.

According to another aspect of the invention, an electro-optical device includes a substrate, a plurality of self-emitting elements formed in the substrate, a sealing member attached to the substrate so as to seal the self-emitting elements in cooperation with the substrate, a circuit that drives or controls the self-emitting elements, and a power line provided on the sealing member to feed at least one of the circuit and the self-emitting elements with power. Since the power line for feeding the plurality of self-emitting elements and the circuit with power need to flow a large amount of current therethrough, it has large cross-sectional area. If such a power line is provided on the substrate having the self-emitting elements formed thereon, a substrate having large area becomes necessary. However, according to this arrangement, since such a power line overlaps the sealing member that seals the self-emitting elements, it is possible to reduce the area of the substrate having the self-emitting elements formed thereon.

Preferably, the circuit is attached to the sealing member. According to this arrangement, since the circuit that drives or controls the self-emitting elements is attached to the sealing member that seals the self-emitting elements, it is possible to further reduce the area of the substrate having the self-emitting elements formed thereon.

Preferably, the circuit is attached to the substrate. According to this arrangement, since the circuit that drives or controls the self-emitting elements is attached to substrate having the self-emitting elements formed thereon, it is possible to reduce the area of the substrate having the self-emitting elements formed thereon.

Preferably, the circuit is a laminate formed on the substrate. According to this construction, since the circuit that drives or controls the self-emitting elements is formed on the substrate having the self-emitting elements formed thereon, it is possible to reduce the area of the substrate having the self-emitting elements formed thereon.

Preferably, the thermal conductivity of the sealing member is higher than that of the substrate. Since the heat generated in the self-emitting elements is efficiently radiated through the sealing member having a higher thermal conductivity than the substrate, other measures for heat radiation can be minimized, so that an increase in number of parts or size of the electro-optical device can be suppressed. The circuit that drives or controls the self-emitting elements, other than the power line, may be attached to the sealing member. In this case, it is possible to further reduce the area of the substrate.

According to still another aspect of the invention, an image forming apparatus includes an image carrier, a charging device that charges the image carrier, the electro-optical device having a plurality of the self-emitting elements arrayed therein to form a latent image by irradiating a charged surface of the image carrier with light from the plurality of self-emitting elements, a developing device that deposits toner on the latent image to form a visualized image on the image carrier, and a transferring device that transfers the visualized image from the image carrier to an object. As described above, in the electro-optical device according to the invention, a substrate having self-emitting elements formed thereon can be saved and thus the manufacturing cost thereof can be reduced. Therefore, it is possible to reduce the manufacturing cost of an image forming apparatus comprising the electro-optical device.

According to still another aspect of the invention, an image reader includes the electro-optical device having a plurality of the self-emitting elements arrayed therein, and a light receiver that converts light emitted from the self-emitting elements and deflected by an object to be read into electrical signals. As described above, in the electro-optical device according to the invention, the manufacturing cost of a substrate having self-emitting elements formed thereon can be reduced, it is also possible to reduce the manufacturing cost of an image reader including the electro-optical device.

BRIEF DESCRIPTION OF THE DRAWINGS

The invention will be described with reference to the accompanying drawings, wherein like numbers reference like elements, and wherein.

DETAILED DESCRIPTION OF EMBODIMENTS

Figure 1:
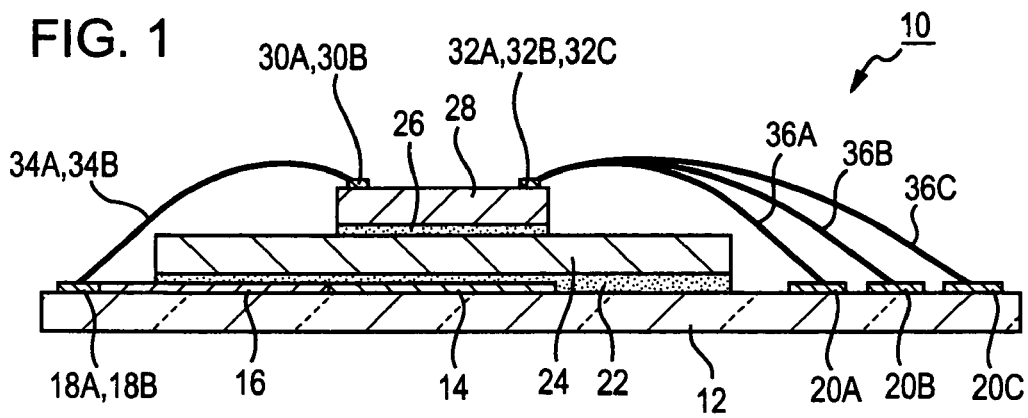
FIG. 1 is a cross-sectional view showing an electro-optical device according to a first embodiment of the invention.

In the drawings which will be referred to in the description of the following various preferred embodiments, scales of dimensions of respective parts are made appropriately different from actual ones.

First Embodiment

Figure 2:
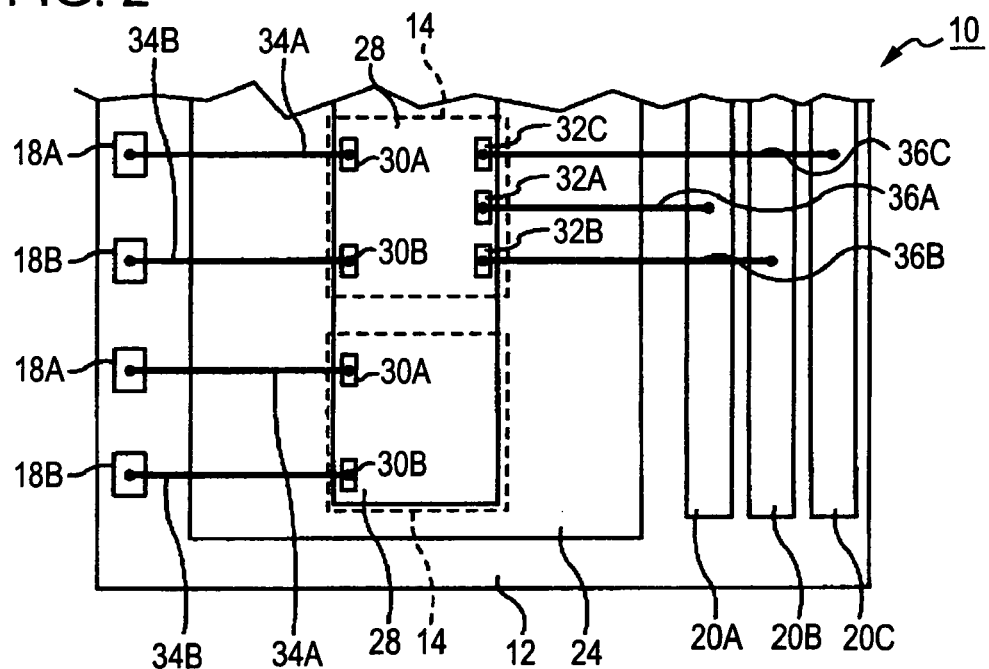
FIG. 2 is a partial plan view of the electro-optical device shown in FIG. 1.

FIG. 1 is a cross-sectional view showing an electro-optical device according to a first embodiment of the invention, and FIG. 2 is a partial plan view of the electro-optical device. The electro-optical device is used as a line-type optical head for writing a latent image in an image carrier in an image forming apparatus utilizing an electrophotographic method. As shown in these figures, the electro-optical device 10 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 1. In other words, the electro-optical device is a bottom emission type.

Electrodes 18A and 18B for feeding the OLED elements 14 with power and wiring 16 for connecting the OLED elements 14 with the electrodes 18A and 18B are formed on the substrate 12. Further, power lines 20A, 20B, and 20C are formed on the substrate 12 to drive the OLED elements 14. The wiring 16, the electrodes 18A and 18B, and the power lines 20A, 20B, and 20C are formed of, for example, a conductive material, such as copper or aluminum.

Further, a sealing member 24 is attached to the substrate 12 so as to seal the OLED elements 14 in cooperation with the substrate 12. This sealing allows the OLED elements 14 to be isolated from ambient air, particularly moisture and oxygen, thereby suppressing deterioration thereof. The sealing member 24 is formed of, for example, glass, metal, ceramic, or plastic. Adhesive 22 is preferably used for attachment of the sealing member 24 to the substrate 12. As the adhesive, for example, a heat-curable adhesive or an ultraviolet curable adhesive is used.

As the type of sealing used in the art of OLEDs, there are film sealing that bonds one entire surface of the sealing member 24 to the substrate 12 with the adhesive 22, and gap sealing that bonds a peripheral edge of the sealing member 24 to the substrate 12 with the adhesive 22 to form a space defined around each of the OLED elements 14 by the sealing member 24 and the substrate 12. In the gap sealing, a drying agent is placed within the space. In this embodiment, any one of the film sealing and the gap sealing may be used. In order to isolate the OLED elements 14 from ambient air to protect them, one or more passivation layers may be provided around the sealing member 24.

Moreover, a driver IC, i.e., a circuit element 28 is attached on the sealing member 24 to drive the plurality of OLED elements 14. Adhesive 26 is preferably used for attachment of the circuit element 28 to the sealing member 24. As the adhesive, for example, a heat-curable adhesive or an ultraviolet curable adhesive is used.

As described below, wiring lines for feeding the plurality of OLED elements 14 with power and components that switches ON/OFF of power to these OLED elements 14 are incorporated into the circuit element 28. The circuit element 28 has electrodes 30A, 30B, 32A, 32B, and 32C on its surface. The electrodes 30A and 30B are respectively connected to the electrodes 18A and 18B on the substrate 12 via bonding wires 34A and 34B, and finally connected to a negative electrode and a positive electrode of each OLED element 14. The electrodes 32A, 32B, and 32C are connected to the power lines 20A, 20B, and 20C via bonding wires 36A, 36B, and 36C, respectively.

The power line 20A is a low potential power line common to the OLED elements 14 and the circuit element 28. The power line 20B is a high potential power line of the OLED elements 14. The power line 20C is a high potential power line of the circuit element 28. These power lines 20A, 20B, and 20C are connected to a power unit via a flexible board (not shown).

Figure 3:
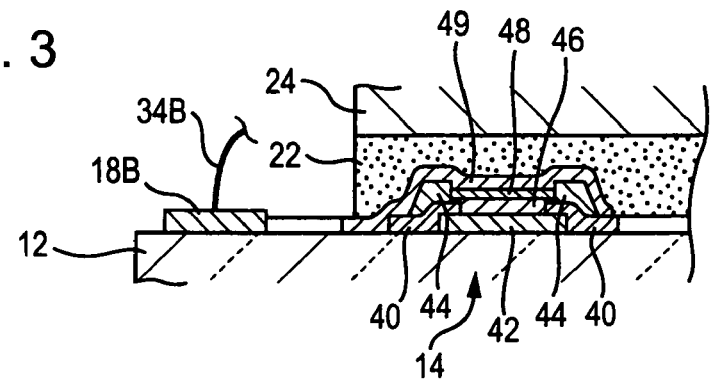
FIG. 3 is a cross-sectional view showing details on an OLED element within the electro-optical device shown in FIG. 1.

FIG. 3 is a cross-sectional view showing details on each OLED element 14. The OLED element 14 has a hole injection layer 46 film-formed on a positive electrode 42 made of transparent ITO (Indium Tin Oxide), a light-emitting layer 48 film-formed on the hole injection layer, and a negative electrode 49 film-formed on the light-emitting layer. The hole injection layer 46 and the light-emitting layer 48 is formed within a concave portion defined by an insulating layer 40 and a partition wall 44. As the material for forming the insulating layer 40, for example, $SiO_2$ is used, and as the material for forming the partition wall 44, for example, polyimide is used.

The positive electrode 42 is connected to the electrode 18B via a lead wire which is not shown in FIG. 3, and although not shown in detail in FIG. 3, the negative electrode 49 is connected to the electrode 18A behind the electrode 18B via a lead wire. These lead wires are schematically shown as the wiring 16 in FIG. 1. Although the OLED element 14 of this embodiment is constructed as described above, the variation of the OLED element 14 according to the invention may be of a type having other layer, such as a type in which an electron injection layer is provided between a negative electrode and a light-emitting layer or a type in which an insulating layer is provided between a positive electrode and a transparent substrate.

Figure 4:
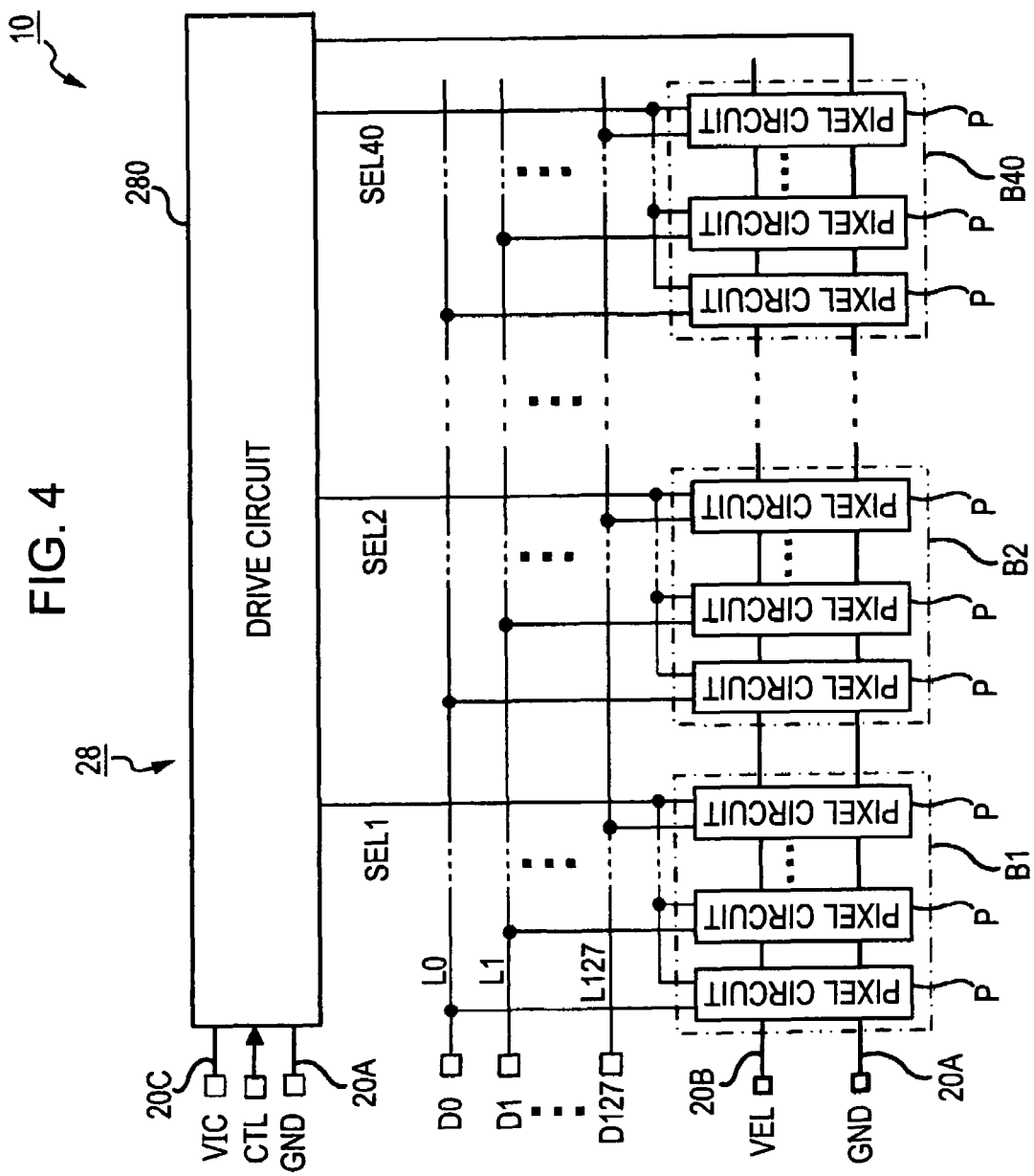
FIG. 4 is block diagram showing a drive system of the electro-optical device shown in FIG. 1.

FIG. 4 is block diagram showing a drive system of the electro-optical device 10. As shown in FIG. 4, the above-described circuit element 28 includes, a plurality of, for example, 128 data lines L0 to L127, and a drive circuit 280. Various control signals CTL, a first power potential VIC, and a ground potential GND other than data signals D0 to D127, are supplied to the circuit element 28. The data signals D0 to D127 are supplied to the data lines L0 to L127 from a data control circuit (not shown). The first power potential VIC is applied from the high potential power line 20C of the circuit element 28, and the ground potential GND is applied from the low potential power line 20A common to the OLED element 14 and the circuit element 28.

Each of pixel blocks B1 to B40 shown in FIG. 4 is a set of a plurality of for example, 128 pixel circuits P which are driven during one unit time. Clock signals as the control signals CTL are supplied to the drive circuit 280, and the drive circuit 280 sequentially outputs the selection signals SEL1 to SEL 40 according to the clock signals. The selection signals SEL1 to SEL 40 are respectively input to the pixel blocks B1 to B40 to be supplied to 128 pixel circuits P within the corresponding pixel blocks. Each of the selection signals SEL1 to SEL 40 becomes active during a 1/40 period (selection period) of a main scan period for latent image writing.

The first to fortieth pixel blocks B1 to B40 are sequentially and exclusively selected by the selection signals SEL1 to SEL 40. In this way, since the main scan period is divided into a plurality of selection periods (writing periods) so that the pixel blocks B1 to B40 are driven in a time-division way, it is not necessary to provide dedicated data lines in the 5120 (128·40) pixel circuits P, respectively. Thus, the number of data lines can be reduced. In other words, the 5120 pixel circuits P can be controlled using the 128 data lines L0 to L127. Each of the first to fortieth pixel blocks B1 to B40 has 128 pixel circuits P corresponding to each of the data lines L0 to L127. A second power potential VEL and the ground potential GND are supplied to these pixel circuits P. The second power potential VEL is applied from the high potential power line 20B of the OLED element 14, and the ground potential GND is applied from the low potential power line 20A common to the OLED element 14 and the circuit element 28. Also, during each selection period, the data signals D0 to D127 supplied via the data lines L0 to L127 are read into the pixel circuits P. Incidentally, the data signals D0 to D127 are binary signals indicative of ON/OFF of OLED elements.

Figure 5:
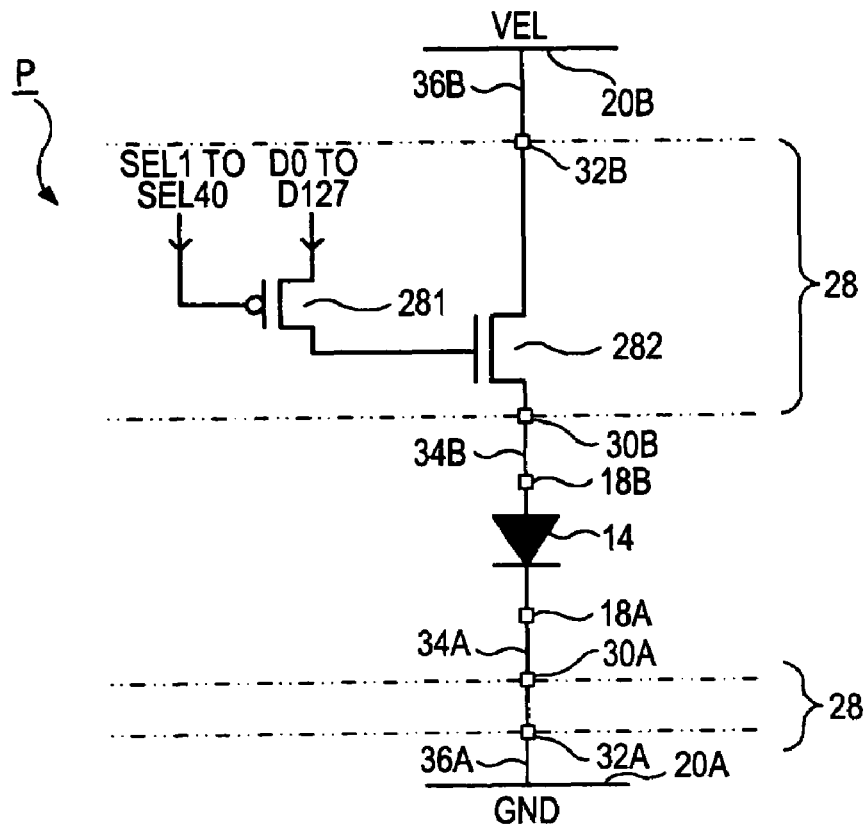
FIG. 5 is a circuit diagram showing each pixel circuit within the drive system in FIG. 4.

FIG. 5 is a circuit diagram of each pixel circuit P. Each pixel circuit P includes a storage transistor 281, a driving transistor 282, and an OLED element 14. In the figure, a portion incorporated into the circuit element 28 is denoted by reference numeral 28. As apparent from this, the storage transistor 281 and the driving transistor 282 are incorporated into the circuit element 28. A gate of the storage transistor 281 is supplied with any one of the selection signals SEL1 to SEL 40 from the drive circuit 280, and a source of the storage transistor is connected to any one of data lines L0 to L127 so as to be supplied with any one of data signals D0 to D127. A drain of the storage transistor 281 is connected to a gate of the driving transistor 282 by a connection line. A floating capacitor is annexed to the connection line. The floating capacitor serves as a storage capacitor. A binary voltage is written in the storage capacitor during a selection period, and the written voltage is stored therein until the next selection period. Accordingly, the OLED element 14 emits light only during the period in which the data signals D0 to D127 are signals indicative of ON of the OLED element 14 in a period in which the storage transistor has been selected by the selection signals SEL1 to SEL 40.

A drain of the driving transistor 282 is supplied with the second power potential VEL via the bonding wire 36B, and the electrode 32B of the circuit element 28 from the high potential power line 20B. A source of the driving transistor 282 is connected to the positive electrode of the OLED element 14 via the electrode 30B of the circuit element 28, the binding wire 34B, and the electrode 18B of the substrate 12. The driving transistor 282 supplies the OLED element 14 with a driving current corresponding to a (binary) voltage written in the storage capacitor. The negative electrode of the OLED element 14 is supplied with the ground potential GND via the bonding wire 36A, the electrode 32A of the circuit element 28, the electrode 30A of the circuit element 28, the bonding wire 34A, and the electrode 18B on the substrate 12 from the low potential power line 20A. The OLED element 14 emits light with a quantity corresponding to the magnitude of a driving current.

As described above, the drive circuit 280 that selects to which pixel block power is supplied, the pixel circuit P (more specifically, and the storage transistor 281 and the driving transistor 282) that commands whether or not power is supplied to an OLED element 14 in the selected pixel block (that switches ON/OFF of power to the OLED element 14) are incorporated into the circuit element 28. It should be noted herein that a circuit equivalent to the drive circuit 280 may be provided outside the circuit element 28, and a control circuit that generates the data signals D0 to D127 or the various control signals CTL may be provided inside the circuit element 28. Theses variations are also within the scope of the invention. Further, components of the circuit element 28 may be provided in one element, i.e., an IC chip, or may be distributed to a plurality of elements.

Figure 6:
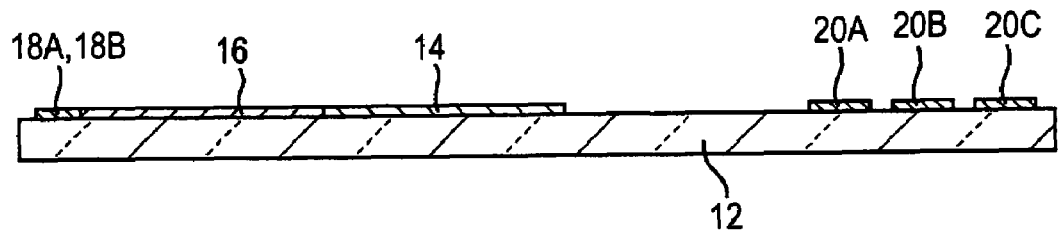
FIG. 6 shows a first process of a procedure of manufacturing the electro-optical device shown in FIG. 1.

Next, a procedure of manufacturing the electro-optical device 10 of the first embodiment will be described. First, as shown in FIG. 6, the OLED element 14, the wiring 16, the electrodes 18A and 18B, and the power lines 20A, 20B, and 20C are formed on a substrate 12. Although not shown, thereafter, the power lines 20A, 20B, and 20C may be protected by an overcoat film. As the overcoat film, for example, there are an $SiO_2$ film, an SiN film, and a combination of them. The forming method may be any one of the well-known methods, and description thereof will be omitted herein.

Figure 7:
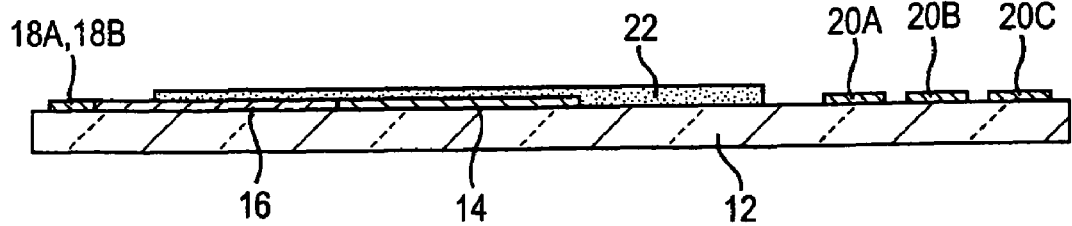
FIG. 7 shows a process subsequent to the process in FIG. 6.
Figure 8:
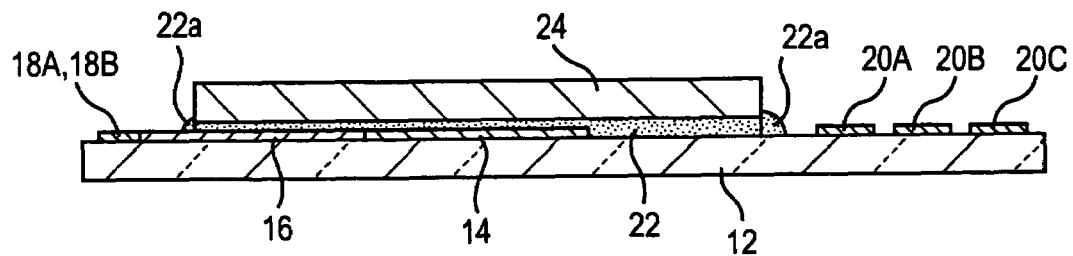
FIG. 8 shows a process subsequent to the process in FIG. 7.

As shown in FIG. 7, a heat-curable or ultraviolet curable adhesive 22 for sealing are coated on the substrate 12. Further, as shown in FIG. 8, the sealing member 24 is put on the adhesive 22 to be adhered to the substrate 12, and thereafter, the adhesive 22 is cured. The adhesive 22 for sealing, as shown in FIG. 8, may have a protrusion 22a that protrudes from a space between the substrate 12 and the sealing member 24 to partially cover a side end of the sealing member 24. The provision of such a protrusion 22a enables the sealing effect to be further enhanced. The provision of the protrusion 22a may be made by coating a larger amount of adhesive than the amount to be actually disposed in the space between the substrate 12 and the sealing member 24, on the substrate 12 so that the adhesive protrudes from the space, or by further coating adhesive 22 on the outside thereof after the adhesive is cured.

Figure 9:
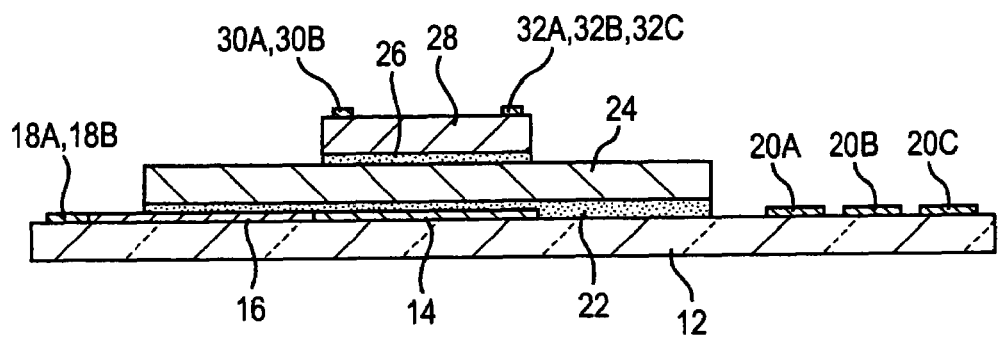
FIG. 9 shows a process subsequent to the process in FIG. 8.

Thereafter, the heat-curable or ultraviolet curable adhesive 22 is coated on the bottom surface of the circuit element 28 (its surface opposite to the electrodes 30A, 30B, 32A, 32B, and 32C). Then, as shown in FIG. 9, the circuit element 28 is adhered to the sealing member 24, and then the adhesive 26 is cured. Further, as shown in FIGS. 1 and 2, by means of a wire bonding method, the bonding wires 34A, 34B, 36A, 36B, and 36C are attached to the above-described predetermined positions, thereby completing the electro-optical device 10.

According to the arrangement of this embodiment, since the circuit element 28 which drives the OLED element 14 overlaps the sealing member 24 which seals the OLED elements 14, the area of the substrate 12 on which the OLED element 14 is formed can be reduced. Accordingly, the substrate 12 can be saved, which contributes to miniaturization of a whole apparatus including the electro-optical device 10.

Second Embodiment

Figure 10:
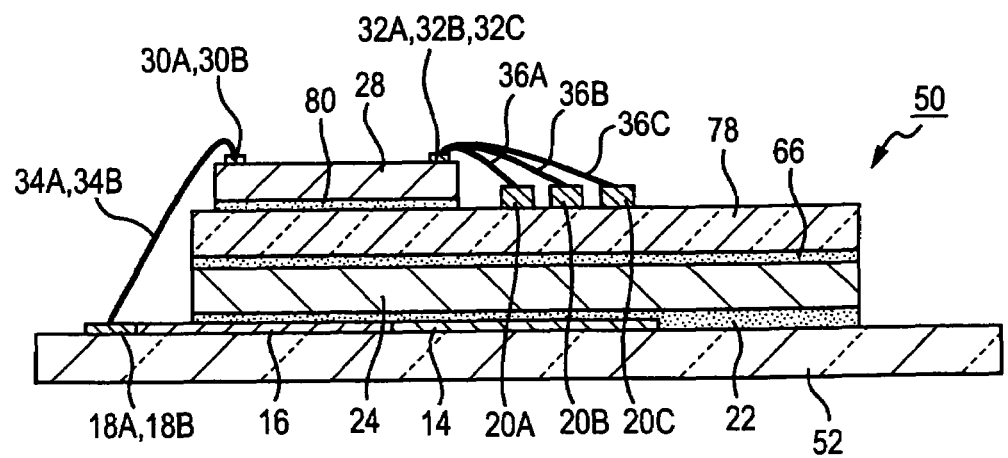
FIG. 10 is a cross-sectional view showing an electro-optical device according to a second embodiment of the invention.
Figure 11:
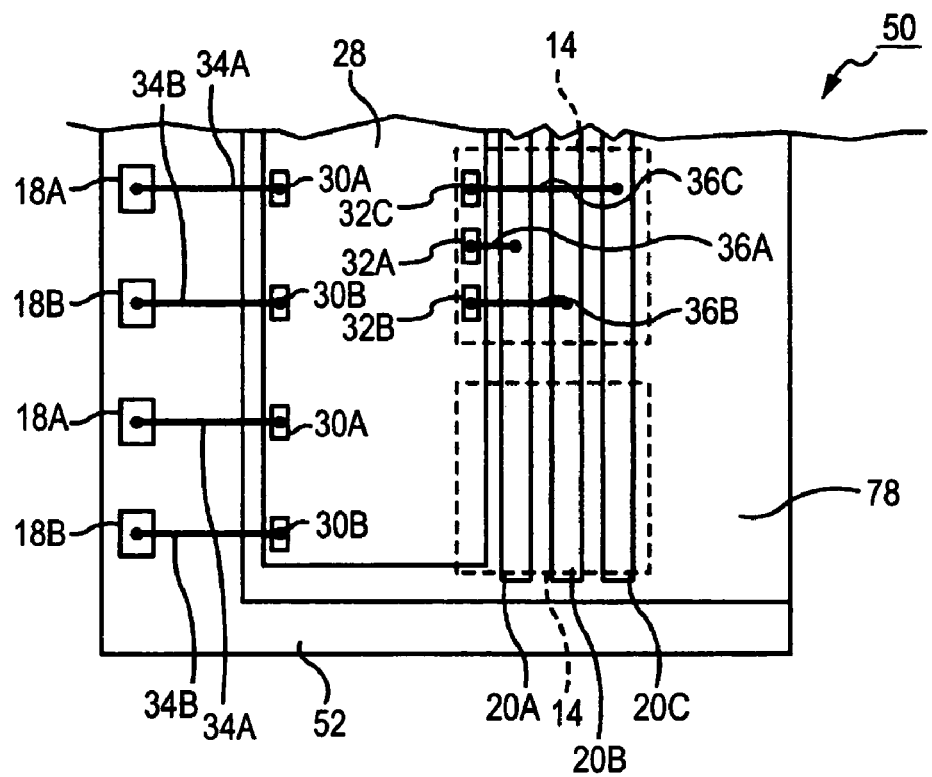
FIG. 11 is a partial plan view of the electro-optical device shown in FIG. 10.

FIG. 10 is a cross-sectional view showing an electro-optical device according to a first embodiment of the invention, and FIG. 11 is a partial plan view of the electro-optical device. The electro-optical device is also used as a line-type optical head for writing a latent image in an image carrier in an image forming apparatus utilizing an electrophotographic method. As shown in these figures, the electro-optical device 50 preferably includes a transparent substrate 52 that is a flat plate formed of, for example, glass such as quartz glass, or plastic. Similar to the substrate 12 of the first embodiment, the plurality of OLED elements (self-emitting element) 14 is formed on the substrate 52. The electro-optical device is also a bottom emission type.

Electrodes 18A and 18B for feeding the OLED elements 14 with power and wiring 16 for connecting the OLED elements 14 with the electrodes 18A and 18B are formed on the substrate 52. The wiring 16 and the electrodes 18A and 18B are formed of, for example, a conductive material, such as copper or aluminum.

Similar to the first embodiment, a sealing member 24 formed of, for example, glass, metal, ceramic, or plastic is attached to the substrate 52 with adhesive 22, such as a heat-curable adhesive or an ultraviolet curable adhesive so as to seal the OLED elements 14 in cooperation with the substrate 52. As the type of sealing, any one of the above-described film sealing and the gap sealing may be used. In order to isolate the OLED elements 14 from ambient air to protect them, one or more passivation layers may be provided around the sealing member 24.

Further, a second substrate 78 is attached on the sealing member 24 with a heat-curable or ultraviolet curable adhesive 66, or other appropriate attaching means. Although the second substrate 78 may be formed of the same material as the substrate 52, it is preferably a glass epoxy substrate in which nonwoven fabric made of glass is disposed inside epoxy resin.

Further, power lines 20A, 20B, and 20C are formed on the second substrate 78 to drive the OLED elements 14. The power lines 20A, 20B, and 20C are formed of, for example, a conductive material, such as copper or aluminum.

Further, a driver IC, i.e., a circuit element 28 is attached on the second substrate 78 to drive the plurality of OLED elements 14. Adhesive 80 is preferably used for attachment of the circuit element 28 to the sealing member 24. As the adhesive, for example, a heat-curable adhesive or an ultraviolet curable adhesive is used.

The circuit element 28 is the same as the circuit element 28 as described in detail with relation to the first embodiment. Similar to the first embodiment, the electrodes 30A and 30B of the circuit element 28 are respectively connected to the electrodes 18A and 18B on the substrate 12 via bonding wires 34A and 34B, and finally connected to a negative electrode and a positive electrode of each OLED element 14. The electrodes 32A, 32B, and 32C of the circuit elements 28 are connected to the power lines 20A, 20B, and 20C, respectively, via bonding wires 36A, 36B, and 36C.

The power line 20A is a low potential power line common to the OLED elements 14 and the circuit element 28. The power line 20B is a high potential power line of the OLED elements 14. The power line 20C is a high potential power line having a higher than that of the circuit element 28. These power lines 20A, 20B, and 20C are connected to a power unit via a flexible board (not shown).

Details on each OLED elements 14 is the same as those as described in detail in relation to the first embodiment referring to FIG. 3. The variations of the OLED elements as described above in relation to the first embodiment may be used.

A drive system of the electro-optical device 50 is similar to the drive system of the electro-optical device 10 as described in detail in relation to the first embodiment referring to FIGS. 4 and 5. The variations of the circuit element 28 as described above in relation to the first embodiment may be used.

Figure 12:
FIG. 12 shows a first process of a procedure of manufacturing the electro-optical device shown in FIG. 10.

Next, a procedure of manufacturing the electro-optical device 50 of the second embodiment will be described. First, as shown in FIG. 12, the OLED element 14, the wiring 16 and the electrodes 18A and 18B are formed on the substrate 52. The forming method may be any one of the well-known methods, and description thereof will be omitted herein.

Figure 13:
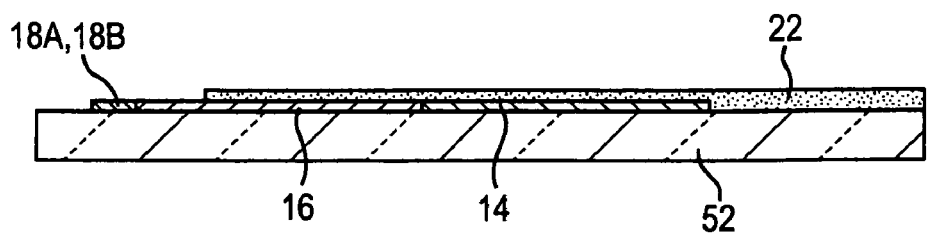
FIG. 13 shows a process subsequent to the process in FIG. 12.
Figure 14:
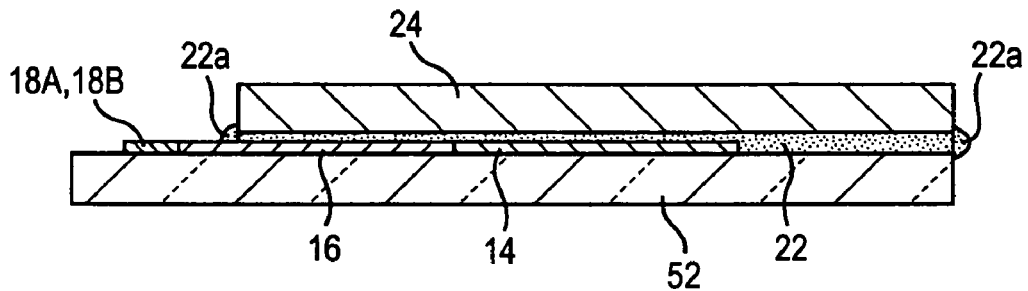
FIG. 14 shows a process subsequent to the process in FIG. 13.

As shown in FIG. 13, the heat-curable or ultraviolet curable adhesive 22 for sealing are coated on the substrate 52. Further, as shown in FIG. 14, the sealing member 24 is put on the adhesive 22 to be adhered to the substrate 52, and thereafter, the adhesive 22 is cured. Similar to the first embodiment, the adhesive 22 for sealing, as shown in FIG. 14, may have a protrusion 22a that protrudes from a space between the substrate 52 and the sealing member 24 to partially cover a side end of the sealing member 24.

Figure 15:
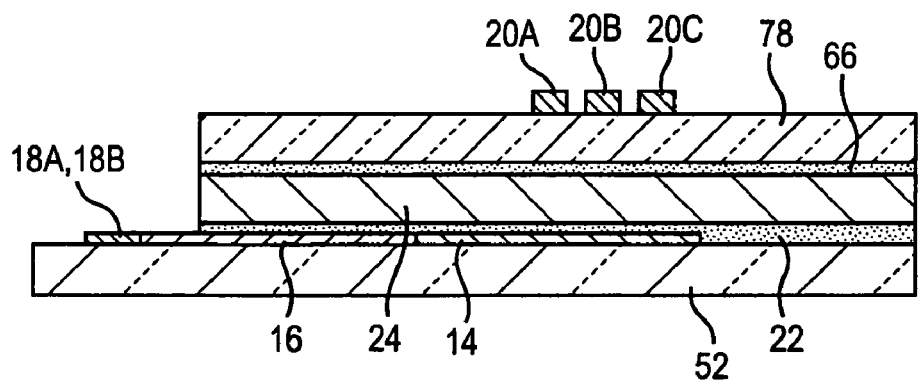
FIG. 15 shows a process subsequent to the process in FIG. 14.

Thereafter, as shown in FIG. 15, the adhesive 66 is coated on the sealing member 24, then the adhesive 66 is put on the second substrate 78 to be adhered to the sealing member 24, and thereafter the adhesive 66 is cured.

The power lines 20A, 20B, and 20C are formed on the second substrate 78 before or after the adhesion. The method of forming the power lines 20A, 20B, and 20C may be any one of the well-known methods. However, when the second substrate 78 is a glass epoxy substrate, it is preferable to form a pattern of the power lines 20A, 20B, and 20C on the second substrate 78 from conductor materials, such as copper foils, by a well-known wiring technique (for example, a subtractive method or an active method) for printed boards. Although not shown, the power lines 20A, 20B, and 20C may be protected by an overcoat film. As the overcoat film, for example, there are an $SiO_2$ film, an SiN film, and a combination of them.

Figure 16:
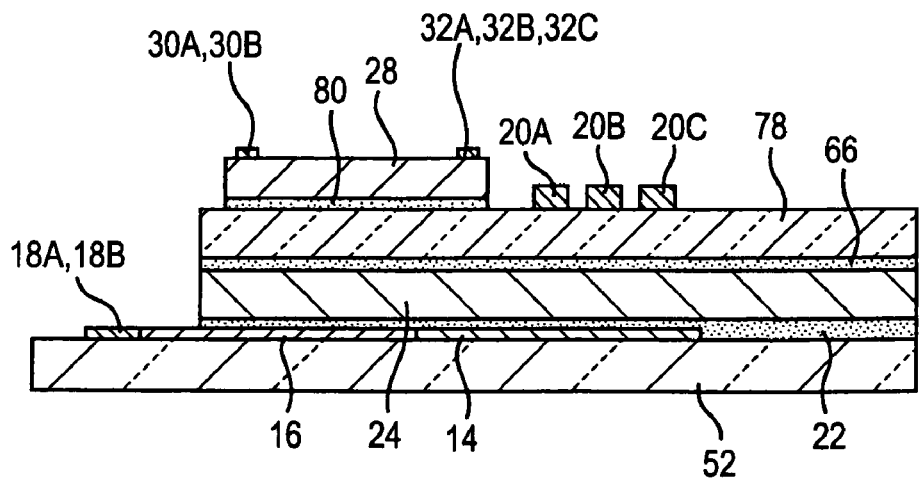
FIG. 16 shows a process subsequent to the process in FIG. 15.

Further, the circuit element 28 is bonded to the second substrate 78. As shown in FIG. 16, the heat-curable or ultraviolet curable adhesive 80 is coated on the bottom surface of the circuit element 28 (its surface opposite to the electrodes 30A, 30B, 32A, 32B, and 32C). Also the circuit element 28 is adhered to the second substrate 78, and thereafter, the adhesive 80 is cured. Further, as shown in FIGS. 10 and 11, by means of a wire bonding method, the bonding wires 34A, 34B, 36A, 36B, and 36C are attached to the above-described predetermined positions, thereby completing the electro-optical device 10.

In the illustrated form, the sealing member 24 and both side ends of the second substrate 78 are made flush with each other, and one side end of the substrate 52 is made flush with the sealing member 24 and one side end of the second substrate 78. However, any one member of them may protrude from the other member.

According to the arrangement of this embodiment, since the circuit element 28 which drives the OLED element 14 is provided on the second substrate 78 which overlaps the sealing member 24 which seals the OLED elements 14, the area of the substrate 52 having the OLED elements 14 formed thereon can be reduced. Accordingly, the substrate 52 can be saved, which contributes to miniaturization of a whole apparatus including the electro-optical device 50.

Further, since the power lines for feeding the plurality of OLED elements and the circuit element with power need to flow a large amount of current therethrough, they have large cross-sectional area. If such power lines are provided on the substrate on which the OLED elements are formed, a substrate having large area becomes necessary. However, according to the arrangement of this embodiment, the power lines 20A, 20B, and 20C for feeding the circuit element 28 and the OLED elements 14 with power are provided on the second substrate 78 provided with the circuit element 28, so that the area of the substrate 52 having the OLED elements 14 formed thereon can be reduced.

In the illustrated form, although all the power lines 20A, 20B, and 20C are formed on the second substrate 78, as the variations of the invention, any one of the power lines 20A, 20B, and 20C may be formed on the substrate 52 or the sealing member 24, and the other(s) may be formed on the second substrate 78. In this case, any one of the power lines 20A, 20B, and 20C is arranged on the sealing member 24 or the second substrate 78, the area of the substrate 52 can be reduced.

Further, when a glass epoxy substrate is used as the second substrate 78, thick power lines 20A, 20B, and 20C are formed by a well-known wiring technique for printed boards. In this case, the wiring technique is easier than a technique by which metal is deposited (vapor-deposited) on a glass substrate to form power lines. Accordingly, the width of the power lines 20A, 20B, and 20C may be reduced. Although the width of the power lines 20A, 20B, and 20C are small in the drawings, it is actually much larger than the width of the OLED element 14. Accordingly, the area of the substrate 52, the sealing member 24, and the second substrate 78 can be considerably reduced by reducing the width of the power lines 20A, 20B, and 20C.

Third Embodiment

Figure 17:
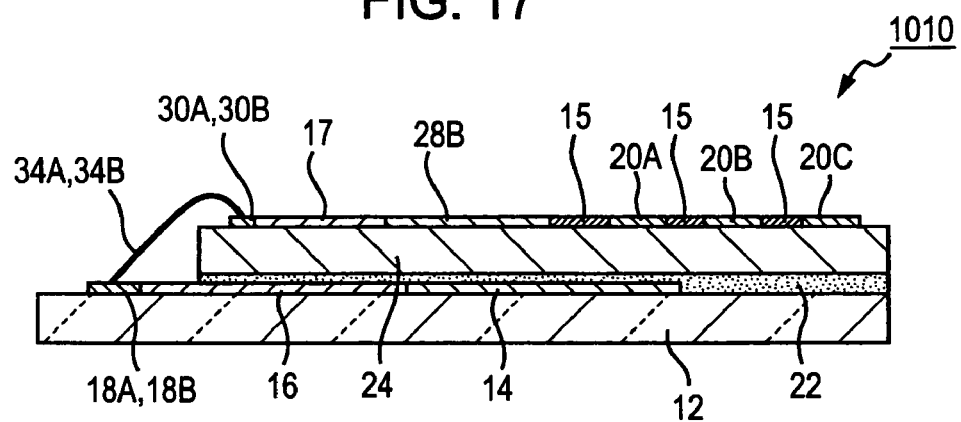
FIG. 17 is a cross-sectional view showing an electro-optical device according to a third embodiment of the invention.
Figure 18:
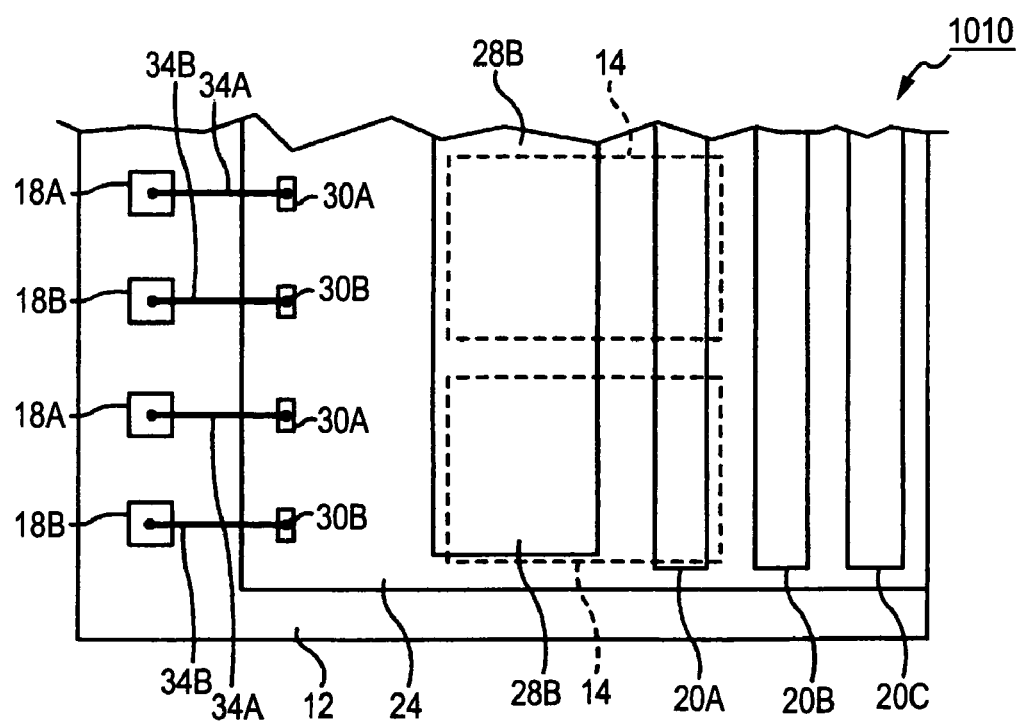
FIG. 18 is a partial plan view of the electro-optical device shown in FIG. 17.

FIG. 17 is a cross-sectional view showing an electro-optical device according to a third embodiment of the invention, and FIG. 18 is a partial plan view of the electro-optical device. The electro-optical device is also used as a line-type optical head for writing a latent image in an image carrier in an image forming apparatus utilizing an electrophotographic method. As shown in these figures, the electro-optical device 1010 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 17. In other words, the electro-optical device is a bottom emission type.

Electrodes 18A and 18B for feeding the OLED elements 14 with power and wiring 16 for connecting the OLED elements 14 with the electrodes 18A and 18B are formed on the substrate 12. The wiring 16 and the electrodes 18A and 18B are formed of, for example, a conductive material, such as aluminum.

Similar to the first embodiment, a sealing member 24 formed of, for example, glass, plastic, or ceramic, such as silicon wafer, is attached to the substrate 12 with a heat-curable or ultraviolet curable adhesive 22 so as to seal the OLED elements 14 in cooperation with the substrate 12. As the type of sealing, any one of the above-described film sealing and the gap sealing may be used. In order to isolate the OLED elements 14 from ambient air to protect them, one or more passivation layers may be provided around the sealing member 24.

Power lines 20A, 20B, and 20C, wiring 15 and 17, electrodes 30A and 30B, and a circuit laminate 28B are formed on the sealing member 24 to drive the OLED element 14. The wiring 15 connects the power lines 20A, 20B, and 20C with the circuit laminate 28B. Although the illustration is omitted, an insulating film is provided on a top surface of the sealing member 24, and the insulating film is interposed between the power lines and the wiring which should not be connected to each other. The wiring 17 connects the electrodes 30A and 30B with the circuit laminate 28B. The electrodes 30A and 30B are respectively connected to the electrodes 18A and 18B on the substrate 12 via bonding wires 34A and 34B. The wiring 15 and 17, the power lines 20A, 20B, and 20C, and the electrodes 30A and 30B are formed of, for example, a conductive material, such as copper or aluminum.

The circuit laminate 28B, which is a driver IC to drive a plurality of OLED elements 14, is formed as a TFT (Thin Film Transistor) array on the sealing member 24. As described below, wiring for feeding the plurality of OLED elements 14 with power and components that switches ON/OFF of power to these OLED elements 14 are incorporated into the circuit laminate 28B. In the circuit laminate 28B, the electrodes 30A and 30B are respectively connected to the electrodes 18A and 18B on the substrate 12 via the bonding wires 34A and 34B, and finally connected to a negative electrode and a positive electrode of each OLED element 14.

The power line 20A is a low potential power line common to the OLED elements 14 and the circuit laminate 28B. The power line 20B is a high potential power line of the OLED elements 14. The power line 20C is a high potential power line of the circuit element 28. These power lines 20A, 20B, and 20C are connected to a power unit via a flexible board (not shown).

Details on each OLED elements 14 is the same as those as described in detail in relation to the first embodiment referring to FIG. 3. The variations of the OLED elements as described above in relation to the first embodiment may be used.

A drive system of the electro-optical device 1010 is similar to the drive system of the electro-optical device 10 as described in detail in relation to the first embodiment referring to FIGS. 4 and 5. However, in FIGS. 4 and 5, the circuit element 28 corresponds to the circuit laminate 28B. The electro-optical device 1010 does not have the bonding wires 36A, 36B, and 36C as used in the first embodiment, and the electrodes (corresponding to the electrodes 32A, 32B, and 32C of the first embodiment) to be connected to the bonding wires 36A, 36B, and 36C of the circuit laminate 28B are not explicitly specified. However, various control signals CTL, a first power potential VIC, and a ground potential GND other than the data signals D0 to D127, are supplied to the circuit laminate 28B. The data signals D0 to D127 are supplied to the data lines L0 to L127 from a data control circuit (not shown). The first power potential VIC is applied from the high potential power line 20C of the circuit laminate 28B, and the ground potential GND is applied from the low potential power line 20A common to the OLED element 14 and the circuit laminate 28B.

Further, the second power potential VEL is supplied to a drain of the driving transistor 282 within the circuit laminate 28B from the high potential power line 20B (without the bonding wire 36B of the first embodiment). A source of the driving transistor 282 is connected to the positive electrode of the OLED element 14 via the electrode 30B of the circuit laminate 28B, the binding wire 34B, and the electrode 18B of the substrate 12. The driving transistor 282 supplies the OLED element 14 with a driving current corresponding to a (binary) voltage written in the storage capacitor. The negative electrode of the OLED element 14 is supplied with the ground potential GND via the electrode 30A of the circuit laminate 28B, the bonding wire 34A, and the electrode 18B on the substrate 12 from the low potential power line 20A (without the bonding wire 36B of the first embodiment). The OLED element 14 emits light with a quantity corresponding to the magnitude of a driving current. As described above, the drive circuit 280 that selects to which pixel block power is supplied, the pixel circuit P (more specifically, and the storage transistor 281 and the driving transistor 282) that commands whether or not power is supplied to an OLED element 14 in the selected pixel block (that switches ON/OFF of power to the OLED element 14) are incorporated into the circuit laminate 28B. It should be noted herein that a circuit equivalent to the drive circuit 280 may be provided outside the circuit laminate 28B, and a control circuit that generates the data signals D0 to D127 or the various control signals CTL may be provided inside the circuit laminate 28. Theses variations are also within the scope of the invention.

Figure 19:
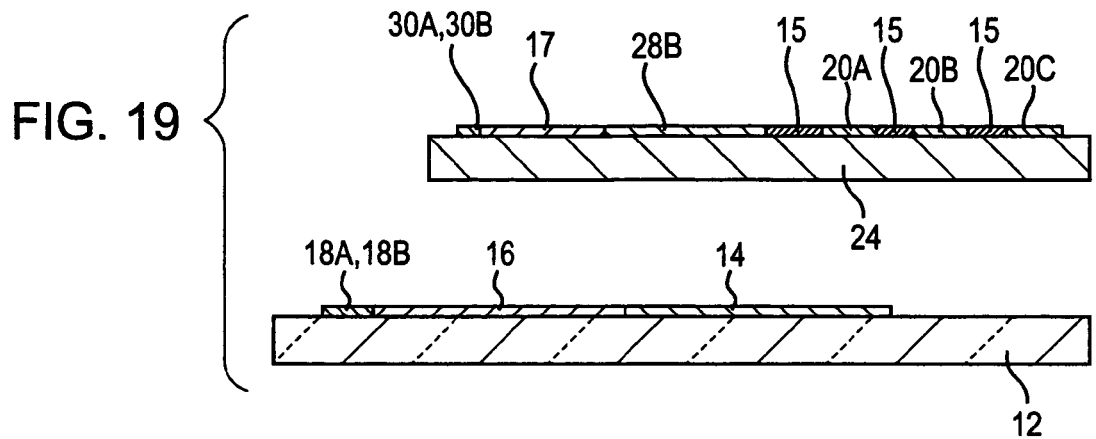
FIG. 19 shows a first process of a procedure of manufacturing the electro-optical device shown in FIG. 17.
Figure 20:
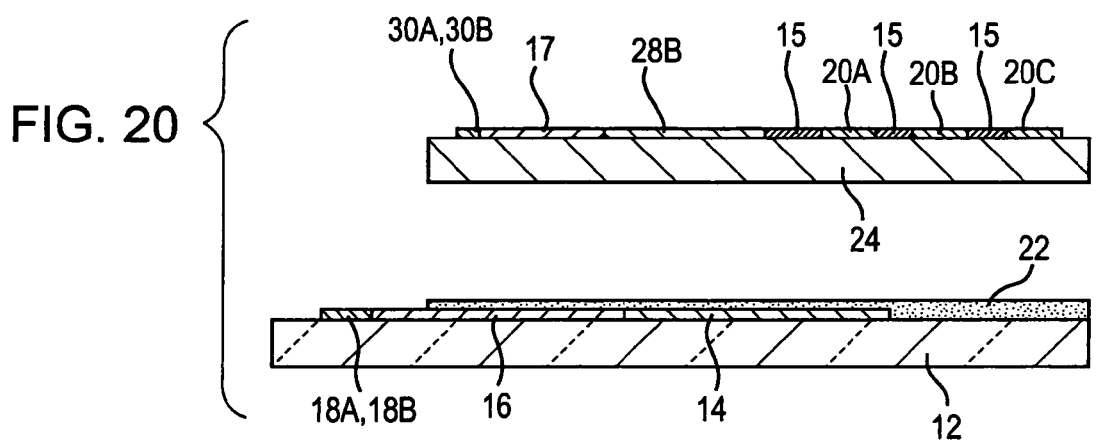
FIG. 20 shows a process subsequent to the process in FIG. 19.

Next, a procedure of manufacturing the electro-optical device 1010 of the third embodiment will be described. First, as shown in FIG. 19, OLED element 14, wiring 16 and electrode 18A, 18B are formed on substrate 12. Further, the power lines 20A, 20B, and 20C, the wiring 15 and 17, the electrodes 30A and 30B, and the circuit laminate 28B are formed on the sealing member 24. Formation of the circuit laminate 28B as a TFT array is performed using LTPS (Low Temperature Polycrystalline Silicon), for example, when the sealing member 24 is made of glass. The forming method may be any one of the known methods, and description thereof will be omitted herein. Although not shown, thereafter, the power lines 20A, 20B, and 20C and the wiring 17 may be protected by an overcoat film. As the overcoat film, for example, there are an $SiO_2$ film, an SiN film, and a combination of them.

Figure 21:
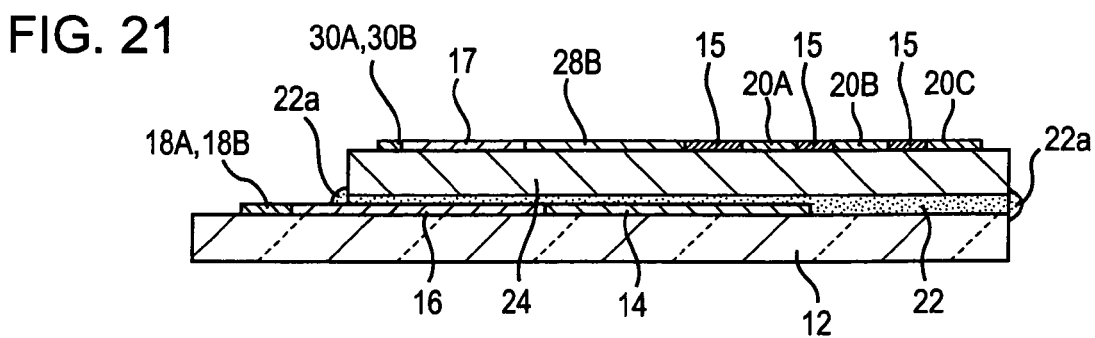
FIG. 21 shows a process subsequent to the process in FIG. 20.

Next, as shown in 20, the heat-curable or ultraviolet curable adhesive 22 for sealing are coated on the substrate 12. Further, as shown in FIG. 21, the sealing member 24 is put on the adhesive 22 to be adhered to the substrate 12, and thereafter, the adhesive 22 is cured. The adhesive 22 for sealing, as shown in FIG. 21, may have a protrusion 22a that protrudes from a space between the substrate 12 and the sealing member 24 to partially cover a side end of the sealing member 24. The provision of such a protrusion 22a enables the sealing effect to be further enhanced. The provision of the protrusion 22a may be made by coating a larger amount of adhesive than the amount to be actually disposed in the space between the substrate 12 and the sealing member 24, on the substrate 12 so that the adhesive protrudes from the space, or by further coating adhesive 22 on the outside thereof after the adhesive is cured.

Next, as shown in FIGS. 17 and 18, by means of a wire bonding method, the bonding wires 34A and 34B are attached to the above-described predetermined positions, thereby completing the electro-optical device 1010.

According to the arrangement of this embodiment, since the circuit laminate 28B which drives the OLED element 14 is provided in the sealing member 24 which overlap the OLED element 14 to seal the OLED elements 14, it is possible to reduce the area of the substrate 12 having the OLED elements 14 formed thereon. Accordingly, the substrate 12 can be saved, which contributes to miniaturization of a whole apparatus including the electro-optical device 1010.

Meanwhile, since the power lines for feeding the plurality of self-emitting elements and the circuit with power need to flow a large amount of current therethrough, they have large cross-sectional area. If such power lines are provided on the substrate having the self-emitting elements formed thereon, a substrate having large area becomes necessary. However, according to the arrangement of this embodiment, since the power lines 20A, 20B, and 20C to feed the OLED element 14 with power are provided on the sealing member 24 which overlaps the OLED element 14 to seal the OLED element 14, it is possible to reduce the area of the substrate 12 having the OLED elements 14 formed thereon.

In addition, in the illustrated form, one side end of the sealing member 24 is made flush with one side end of the substrate 12, but as a variation of the arrangement of the sealing member and the substrate according to the invention, any one member may protrude from the other member. Further, in the illustrated form, all the power lines 20A, 20B, and 20C are formed on the sealing member 24, but as a variation of the arrangement of the sealing member, the substrate, and the power lines, some or all of the power lines 20A, 20B, and 20C may be formed on the substrate 12. In this case, since at least the circuit laminate 28B is disposed on the sealing member 24, the area of the substrate 12 can be reduced.

Fourth Embodiment

Figure 22:
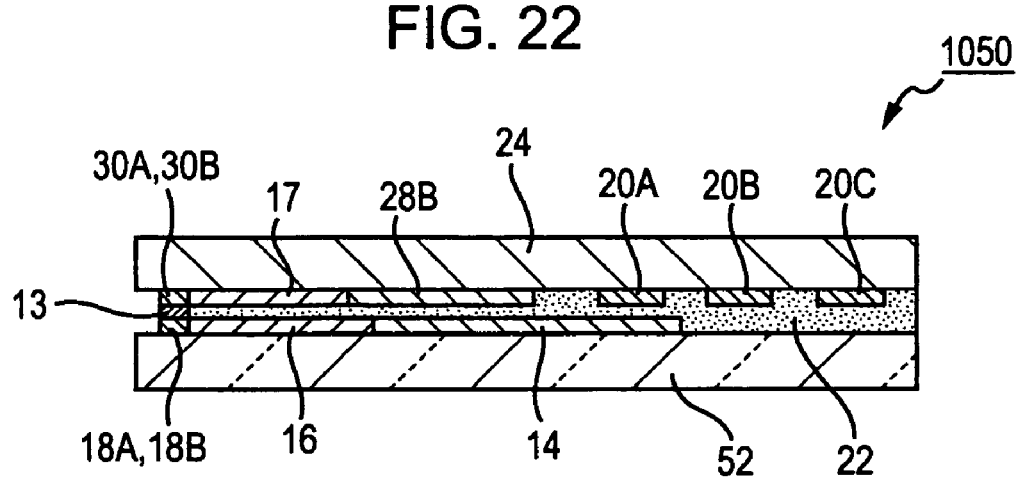
FIG. 22 is a cross-sectional view showing an electro-optical device according to a fourth embodiment of the invention.
Figure 23:
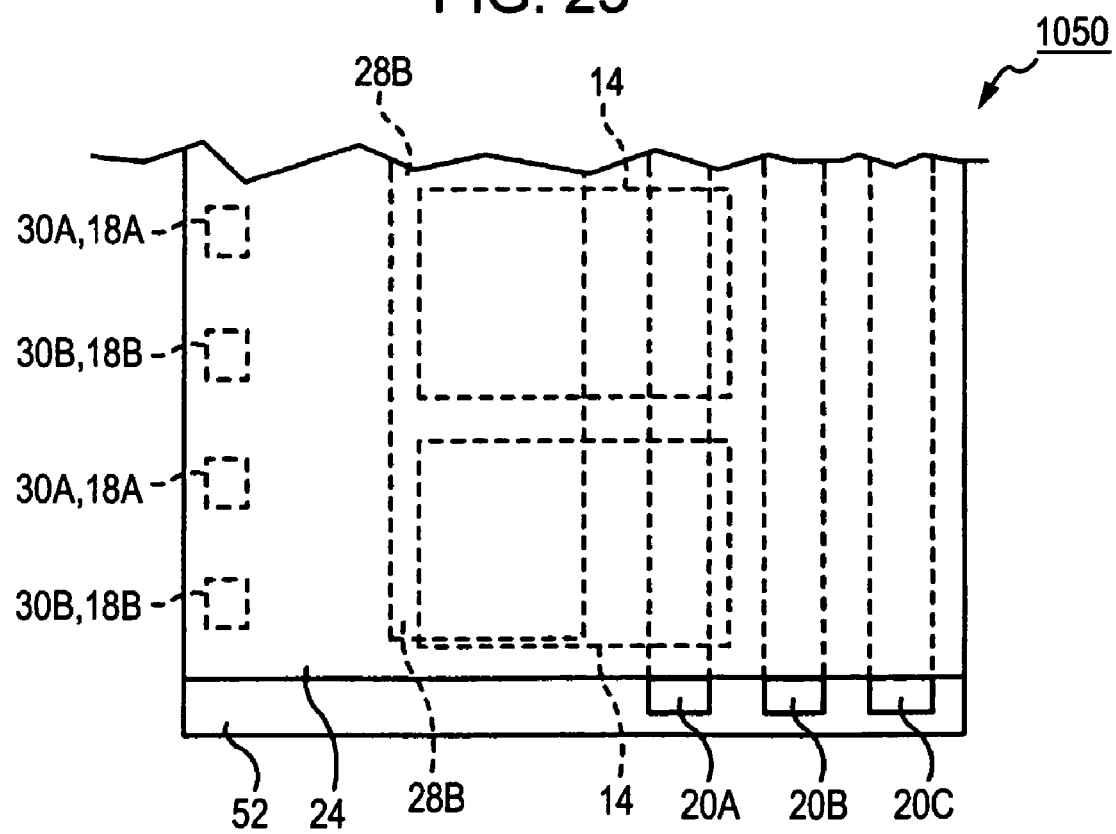
FIG. 23 is a partial plan view of the electro-optical device shown in FIG. 22.

FIG. 22 is a cross-sectional view showing an electro-optical device according to a fourth embodiment of the invention, and FIG. 23 is a partial plan view of the electro-optical device.

The electro-optical device is also used as a line-type optical head for writing a latent image in an image carrier in an image forming apparatus utilizing an electrophotographic method. As shown in these figures, the electro-optical device 1050 preferably includes a transparent substrate 52 that is a flat plate formed of, for example, glass such as quartz glass, or plastic. Similar to the substrate 12 of the third embodiment, the plurality of OLED elements (self-emitting element) 14 is formed on the substrate 52. The electro-optical device is also a bottom emission type.

Electrodes 18A and 18B for feeding the OLED elements 14 with power and wiring 16 for connecting the OLED elements 14 with the electrodes 18A and 18B are formed on the substrate 52. The wiring 16 and the electrodes 18A and 18B are formed of, for example, a conductive material, such as aluminum.

Similar to the third embodiment, a sealing member 24 formed of for example, glass or silicon wafer is attached to the substrate 52 with a heat-curable adhesive or an ultraviolet curable adhesive 22 so as to seal the OLED elements 14 in cooperation with the substrate 52. In this embodiment, the above-described film sealing is used. In order to further isolate the OLED elements 14 from ambient air to protect them, one or more passivation layers may be provided around the sealing member 24.

On the bottom surface of the sealing member 24 which faces the substrate 42, in order to drive the OLED element 14, the power lines 20A, 20B, and 20C, the wiring 15 (not shown), the wiring 17, the circuit laminate 28B, and the electrodes 30A and 30B, all of which are explained in relation to the third embodiment, are formed. Although the illustration is omitted, an insulating film is provided on the bottom surface of the sealing member 24, and the insulating film is interposed between the power lines and the wiring which should not be connected to each other.

The electrodes 18A and 18B on the substrate 52 touches one surface of an anisotropic conductive material 13, and the electrodes 30A and 30B of the sealing member 24 touches the other surface of the anisotropic conductive material 13. In other words, the electrodes 18A and 18B on the substrate 52 respectively face the electrodes 30A and 30B of the sealing member 24 with the anisotropic conductive material 13 therebetween. The anisotropic conductive material 13 electrically connects only the opposed electrodes among the touching electrodes 18A, 18B, 30A and 30B, with each other. As apparent from this, the electrodes 18A and 18B on the substrate 52 are connected to the electrodes 30A and 30B, respectively, via the anisotropic conductive material 13. This construction makes the bonding wires 34A and 34B as needed in the third embodiment unnecessary.

The power lines 20A, 20B, and 20C protrude farther than the substrate 52 or the sealing member 24 at the front side of the sheet of FIG. 22, and are connected to a power unit via a flexible board (not shown). In addition, the power lines 20A, 20B, and 20C may protrude at the backside of the sheet of FIG. 22. As for the details on each OLED element, the drive system of the electro-optical device, and the arrangement of the sealing member, the substrate, and the power lines, the various variations as described in detail in relation to the third embodiment may be employed. In addition, in the illustrated form, both side ends of the sealing member 24 is made flush with both side ends of the substrate 52, but as a variation of the arrangement of the sealing member and the substrate according to the invention, any one member may protrude from the other member at any one of those ends.

Next, a procedure of manufacturing the electro-optical device 1050 of the fourth embodiment will be described.

Figure 24:
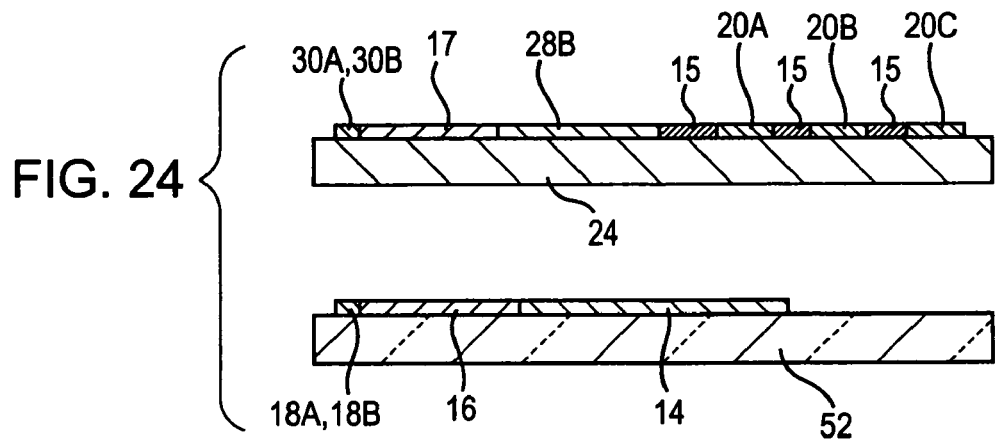
FIG. 24 shows a first process of a procedure of manufacturing the electro-optical device shown in FIG. 22.

First, as shown in FIG. 24, the OLED element 14, the wiring 16 and the electrodes 18A and 18B are formed on the substrate 52. Further, the power lines 20A, 20B, and 20C, the wiring 15 and 17, the electrodes 30A and 30B, and the circuit laminate 28B are formed on the sealing member 24. Formation of the circuit laminate 28B as a TFT (Thin Film Transistor) array is performed using LTPS (Low Temperature Polycrystalline Silicon), for example, when the sealing member 24 is made of glass. The forming method may be any one of the known methods, and description thereof will be omitted herein. Although not shown, thereafter, the power lines 20A, 20B, and 20C and the wiring 17 may be protected by an overcoat film. As the overcoat film, for example, there are an $SiO_2$ film, an SiN film, and a combination of them.

Figure 25:
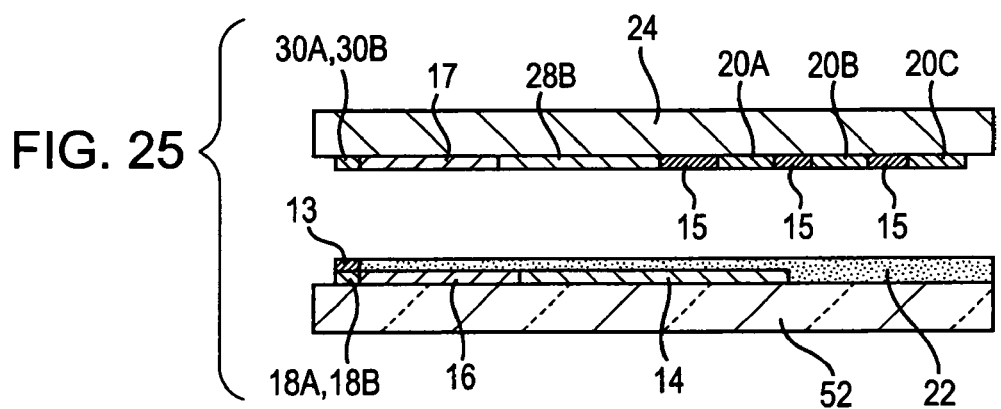
FIG. 25 shows a process subsequent to the process in FIG. 24.

Next, as shown in FIG. 25, the heat-curable or ultraviolet curable adhesive 22 for sealing are coated on the substrate 52. Further, the sealing member 24 is faced down to allow the electrodes 30A and 30B to face the electrodes 18A and 18B, respectively.

Figure 26:
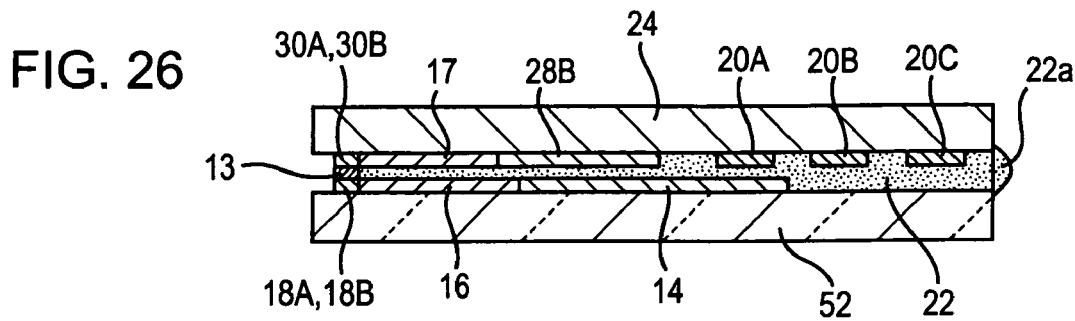
FIG. 26 shows a process subsequent to the process in FIG. 25.

Next, as shown in FIG. 26, the sealing member 24 is put on the adhesive 22 to be adhered to the substrate 52, and thereafter, the adhesive 22 is cured. The electro-optical device 1050 is completed in this way. The adhesive 22 for sealing, as shown in FIG. 26, may have a protrusion 22a that protrudes from a space between the substrate 52 and the sealing member 24 to partially cover a side end of the sealing member 24. Effects resulting from the provision of such a protrusion 22a and a method of providing the protrusion 22a are as described in detail in relation to the third embodiment.

According to the arrangement of this embodiment, similar to the third embodiment, since the circuit laminate 28B which drives the OLED element 14 is provided in the sealing member 24 which overlaps and seals the OLED elements 14, the area of the substrate 52 having the OLED elements 14 formed thereon can be reduced. Accordingly, the substrate 52 can be saved, which contributes to miniaturization of a whole apparatus including the electro-optical device 1050.

Further, similar to the third embodiment, since the power lines 20A, 20B, and 20C to feed the OLED element 14 with power are provided on the sealing member 24 which overlaps the OLED element 14 to seal the OLED element 14, it is possible to reduce the area of the substrate 12 having the OLED elements 14 formed thereon.

By adopting a construction in which the electrodes 18A and 18B on the substrate 52 and the electrodes 30A and 30B of the sealing member 24 are caused to face each other to be connected to each other, respectively, by the anisotropic conductive material 13, the electrodes 30A and 30B overlap the electrodes 18A and 18B, respectively. Therefore, the area of the substrate 52 having the OLED elements 14 formed thereon can be reduced.

Fifth Embodiment

Figure 27:
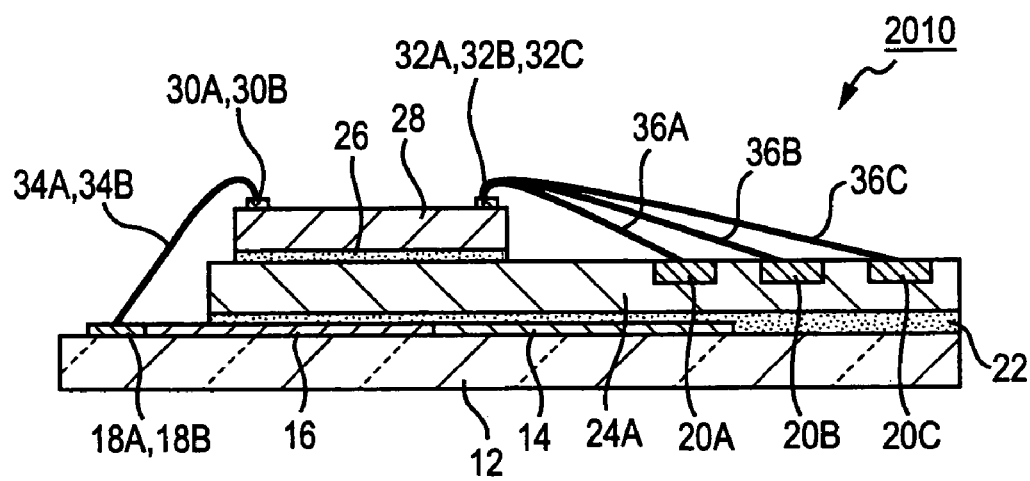
FIG. 27 is a cross-sectional view showing an electro-optical device according to a fifth embodiment of the invention.
Figure 28:
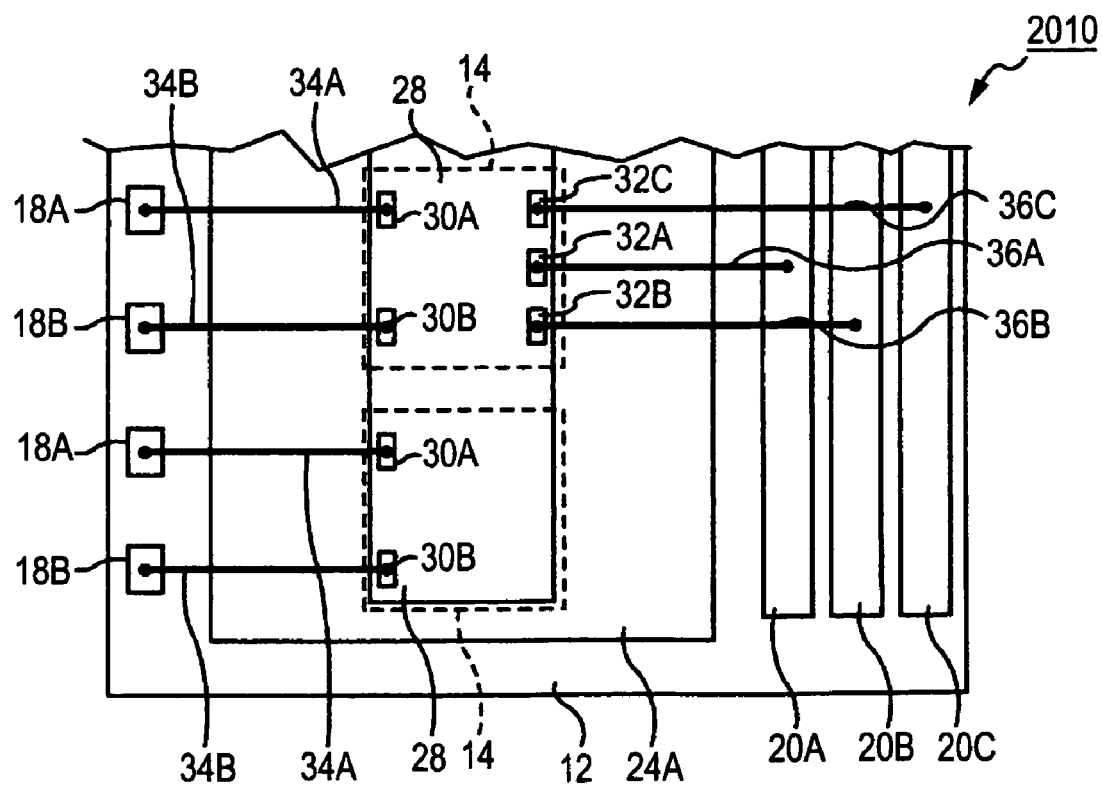
FIG. 28 is a partial plan view of the electro-optical device shown in FIG. 27.

FIG. 27 is a cross-sectional view showing an electro-optical device according to a fifth embodiment of the invention, and FIG. 28 is a partial plan view of the electro-optical device. The electro-optical device is used as a line-type optical head for writing a latent image in an image carrier in an image forming apparatus utilizing an electrophotographic method. As shown in these figures, the electro-optical device 2010 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 27. In other words, the electro-optical device is a bottom emission type.

Electrodes 18A and 18B for feeding the OLED elements 14 with power and wiring 16 for connecting the OLED elements 14 with the electrodes 18A and 18B are formed on the substrate 12. The wiring 16 and the electrodes 18A and 18B are formed of, for example, a conductive material, such as aluminum.

Further, a sealing member 24A is attached to the substrate 12 so as to seal the OLED elements 14 in cooperation with the substrate 12. This sealing allows the OLED elements 14 to be isolated from ambient air, particularly moisture and oxygen, thereby suppressing deterioration thereof. The sealing member 24A is formed of a material having a higher thermal conductivity than the substrate 12 in order to efficiently radiate the heat generated by the OLED element 14. For example, when the substrate 12 is formed of glass, ceramics ($AL_2O_3$, AlN, etc.) and metals (42 alloy (alloy containing nickel of about 42% and iron of about 58%), copper, aluminum, etc.), excluding glass, can be exemplified as the material suitable for the sealing member 24A.

Adhesive 22 is preferably used for attachment of the sealing member 24A to the substrate 12. As the adhesive, for example, a heat-curable adhesive or an ultraviolet curable adhesive is used. As the type of sealing, any one of the above-described film sealing and the gap sealing may be used. In order to isolate the OLED elements 14 from ambient air to protect them, one or more passivation layers may be provided around the sealing member 24A.

Further, power lines 20A, 20B, and 20C are formed on the sealing member 24A to drive the OLED elements 14. The power lines 20A, 20B, and 20C are formed of, for example, a conductive material, such as copper or aluminum. When the sealing member 24A is formed of a conductive material, although not shown, an insulating layer is provided between the sealing member 24A and each of the power lines 20A, 20B, and 20C in order to prevent short circuit of the power lines 20A, 20B, and 20C.

Further, a driver IC, i.e., a circuit element 28 is attached on the sealing member 24A to drive the plurality of OLED elements 14. Adhesive 26 is preferably used for attachment of circuit element 28 to the sealing member 24A. As the adhesive, for example, a heat-curable adhesive or an ultraviolet curable adhesive is used.

The circuit element 28 is the same as the circuit element 28 as described in detail with relation to the first embodiment. Similar to the first embodiment, the electrodes 30A and 30B of the circuit element 28 are respectively connected to the electrodes 18A and 18B on the substrate 12 via bonding wires 34A and 34B, and finally connected to a negative electrode and a positive electrode of each OLED element 14. The electrodes 32A, 32B, and 32C of the circuit elements 28 are connected to the power lines 20A, 20B, and 20C, respectively, via bonding wires 36A, 36B, and 36C.

Details on each OLED elements 14 is the same as those as described in detail in relation to the first embodiment referring to FIG. 3. The variations of the OLED elements as described above in relation to the first embodiment may be used.

A drive system of the electro-optical device 2010 is the same as the drive system of the electro-optical device 10 as described in detail in relation to the first embodiment referring to FIGS. 4 and 5. The variations of the circuit element 28 as described above in relation to the first embodiment may be used.

Figure 29:
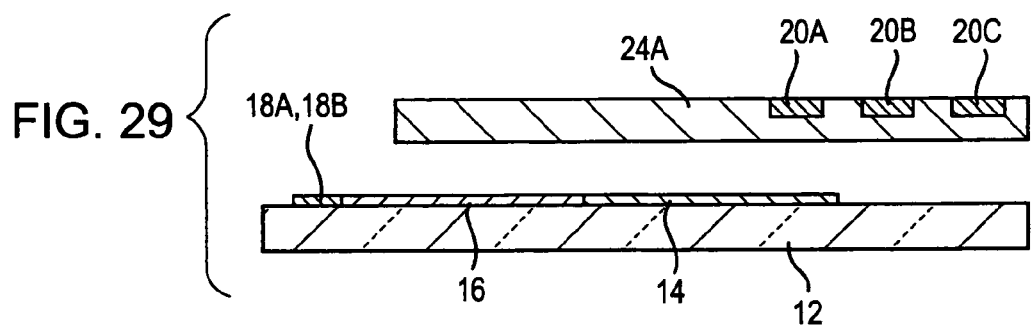
FIG. 29 shows a first process of a procedure of manufacturing the electro-optical device shown in FIG. 27.

Next, a procedure of manufacturing the electro-optical device 2010 of the fifth embodiment will be described. First, as shown in FIG. 29, the OLED element 14, the wiring 16 and the electrodes 18A and 18B are formed on the substrate 12. The forming method may be any one of the known methods, and description thereof will be omitted herein. On the other hand, the power lines 20A, 20B, and 20C are formed on the sealing member 24A. The method of forming the power lines 20A, 20B, and 20C may be any one of the well-known methods, such as plating. Although not shown, thereafter, the power lines 20A, 20B, and 20C may be protected by an overcoat film. As the overcoat film, for example, there are an $SiO_2$ film, an SiN film, and a combination of them.

Figure 30:
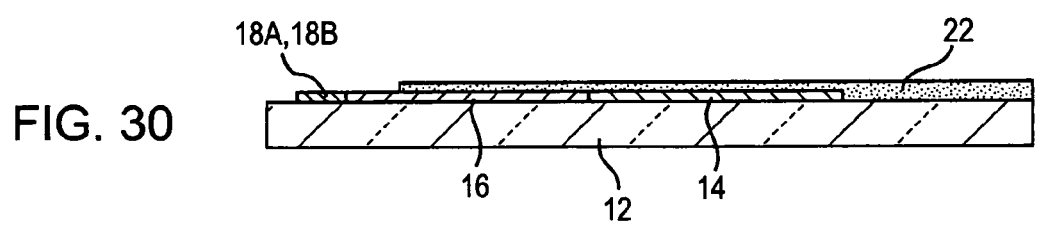
FIG. 30 shows a process subsequent to the process in FIG. 29.
Figure 31:
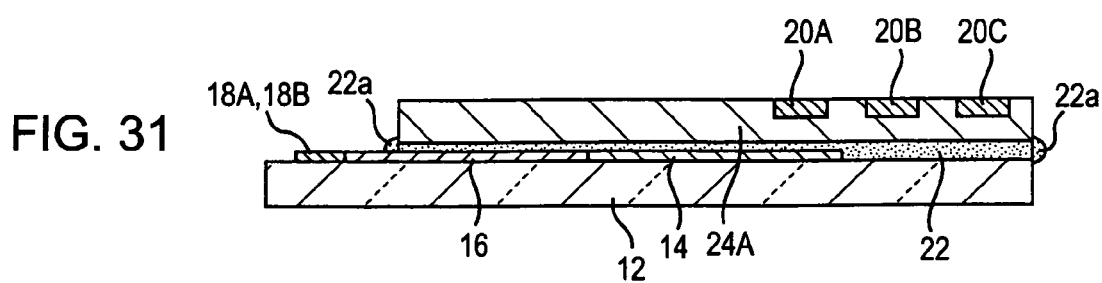
FIG. 31 shows a process subsequent to the process in FIG. 30.

Next, as shown in FIG. 30, the heat-curable or ultraviolet curable adhesive 22 for sealing are coated on the substrate 12. Further, as shown in FIG. 31, the sealing member 24A is put on the adhesive 22 to be adhered to the substrate 12, and thereafter, the adhesive 22 is cured. The adhesive 22 for sealing, as shown in FIG. 31, may have a protrusion 22a that protrudes from a space between the substrate 12 and the sealing member 24A to partially cover a side end of the sealing member 24. The provision of such a protrusion 22a enables the sealing effect to be further enhanced. The provision of the protrusion 22a may be made by coating a larger amount of adhesive than the amount to be actually disposed in the space between the substrate 12 and the sealing member 24A, on the substrate 12 so that the adhesive protrudes from the space, or by further coating adhesive 22 on the outside thereof after the adhesive is cured.

Figure 32:
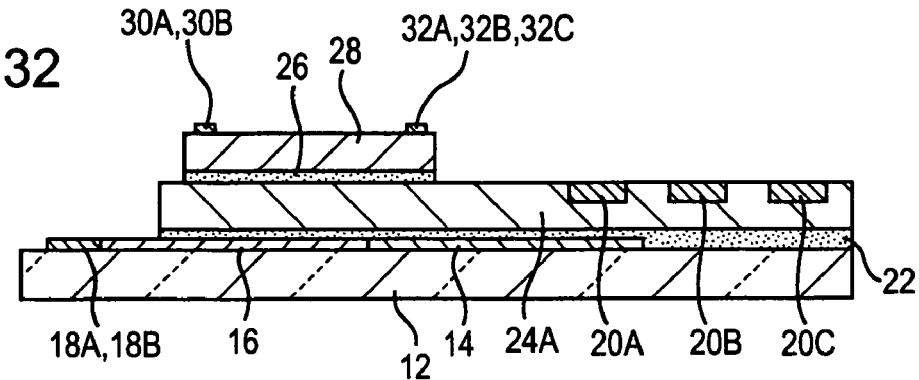
FIG. 32 shows a process subsequent to the process in FIG. 31.

Thereafter, the heat-curable or ultraviolet curable adhesive 22 is coated on the bottom surface of the circuit element 28 (its surface opposite to the electrodes 30A, 30B, 32A, 32B, and 32C). Then, as shown in FIG. 32, the circuit element 28 is adhered to the sealing member 24A, and then the adhesive 26 is cured. Further, as shown in FIGS. 27 and 28, by means of a wire bonding method, the bonding wires 34A, 34B, 36A, 36B, and 36C are attached to the above-described predetermined positions, thereby completing the electro-optical device 2010. It should is noted herein that the adhesion of the circuit element 28 to the sealing member 24A may be performed before the adhesion of the sealing member 24A to the substrate 12.

Since the power lines for feeding the plurality of self-emitting elements and the circuit with power need to flow a large amount of current therethrough, they have large cross-sectional area. If such power lines are provided on the substrate having the self-emitting elements formed thereon, a substrate having large area becomes necessary. However, according to the arrangement of this embodiment, the power lines 20A, 20B, and 20C for feeding the circuit element 28 and the OLED elements 14 with power are provided on the sealing member 24A sealing the OLED element 14, so that the area of the substrate 12 having the OLED elements 14 formed thereon can be reduced. Accordingly, the substrate 12 can be saved, which contributes to miniaturization of a whole apparatus including the electro-optical device 2010.

Further, according to the arrangement of this embodiment, since the circuit element 28 which drives the OLED element 14 is provided so as to overlap the sealing member 24A which seals the OLED elements 14, it is possible to reduce the area of the substrate 12 having the OLED elements 14 formed thereon.

Further, according to this embodiment, the heat generated by the OLED element 14 is efficiently radiated through the sealing member 24A having a higher thermal conductivity than the substrate 12, other heat-radiating measures can be minimized to suppress increases in the number of parts and size of the electro-optical device.

Table 1 shows properties of materials preferred for the sealing member 24A and properties of glass as a typical material of the substrate 12. If attention is paid to only the cooling efficiency of the OLED element 14, it can be said that it is preferable that the above sealing member has a higher thermal conductivity. From this point of view, for example, copper or aluminum is preferable as the material of the sealing member 24A. However, in order to reduce occurrence of distortion caused by heat, it can be said that it is preferable that the coefficient of thermal expansion of the sealing member 24A is close to that of the substrate 12. From this point of view, for example, $Al_2O_3$, AlN, and 42 alloy are preferable as the material of the sealing member 24A.

TABLE 1

| Material | Characteristic | | |
|---|---|---|---|
| | Thermal conductivity cal/(cm · sec · °C.) | Thermal conductivity W/(m · K) | Coefficient of thermal expansion $10^{-6}$/K |
| Glass | 0.001-0.003 | 0.42-1.26 | 3-4 |
| $Al_2O_3$ | 0.03-0.04 | 12.6-19.4 | 7 |
| AlN | 0.14 | 58 | 5 |
| 42 alloy | 0.032 | 13.4 | 4.4 |
| Copper | 0.94 | 390 | 17 |
| Aluminum | 0.57 | 237 | 23.5 |

In the illustrated form, one side end of the sealing member 24A is made flush with one side end of the substrate 12, but as a variation of the arrangement of the sealing member and the substrate according to the invention, any one member may protrude from the other member. Further, in the illustrated form, the power lines 20A, 20B, and 20C are embedded in grooves formed in the top surface of the sealing member 24A so that the top surface of the sealing member 24A is made flush with the top surface of each of the power lines 20A, 20B, and 20C. However, a construction in which the top surface of the sealing member 24A is made flat and then the power lines 20A, 20B, and 20C may swell on the top surface may be employed.

Further, in the illustrated form, all the power lines 20A, 20B, and 20C are formed on the sealing member 24A, but as a variation of the arrangement of the sealing member, the substrate, and the power lines, any one of the power lines 20A, 20B, and 20C may be formed on the sealing member 24A, and the other(s) are on the substrate 12. In this case, any one of the power lines 20A, 20B, and 20C is arranged on the sealing member 24A, so that the area of the substrate 12 can be reduced. Moreover, as another variation, any one of the power lines 20A, 20B, and 20C and the circuit element 28 may be formed on the sealing member 24A, and the other one may be formed on the substrate 12. In this case, any one of the power lines 20A, 20B, and 20C and the circuit element 28 are also arranged on the sealing member 24A, so that the area of the substrate 12 can be reduced.

Sixth Embodiment

Figure 33:
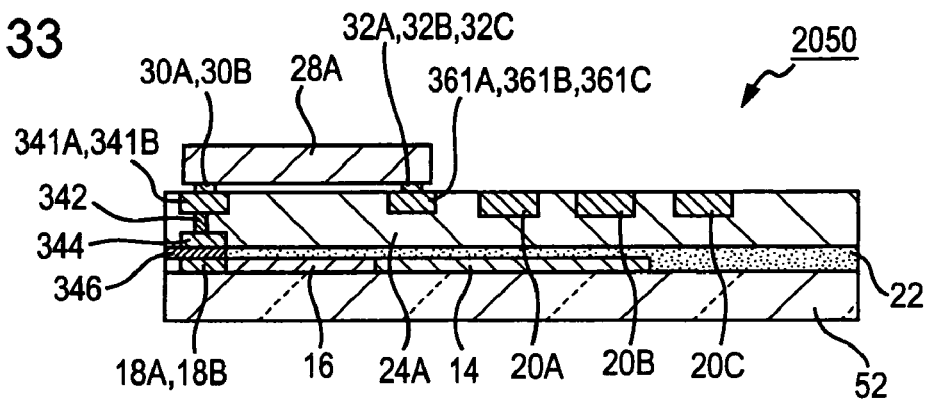
FIG. 33 is a cross-sectional view showing an electro-optical device according to a sixth embodiment of the invention.
Figure 34:
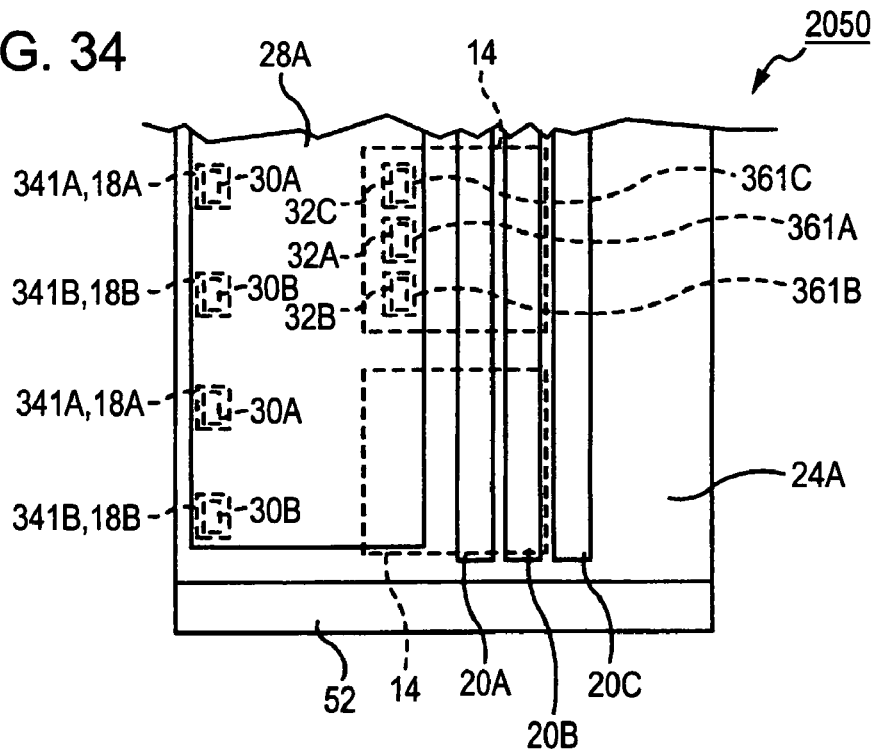
FIG. 34 is a partial plan view of the electro-optical device shown in FIG. 33.

FIG. 33 is a cross-sectional view showing an electro-optical device according to a sixth embodiment of the invention, and FIG. 34 is a partial plan view of the electro-optical device. The electro-optical device is also used as a line-type optical head for writing a latent image in an image carrier in an image forming apparatus utilizing an electrophotographic method. As shown in these figures, the electro-optical device 2050 preferably includes a transparent substrate 52 that is a flat plate formed of, for example, glass such as quartz glass, or plastic. Similar to the substrate 12 of the fifth embodiment, the plurality of OLED elements (self-emitting element) 14 is formed on the substrate 52. The electro-optical device is also a bottom emission type.

Electrodes 18A and 18B for feeding the OLED elements 14 with power and wiring 16 for connecting the OLED elements 14 with the electrodes 18A and 18B are formed on the substrate 52. The wiring 16 and the electrodes 18A and 18B are formed of, for example, a conductive material, such as aluminum.

Similar to the fifth embodiment, a sealing member 24A is attached to the substrate 52 with a heat-curable adhesive or an ultraviolet curable adhesive 22 so as to seal the OLED elements 14 in cooperation with the substrate 52. Similar to the fifth embodiment, the sealing member 24A is formed of a material having a higher thermal conductivity than the substrate 12. Although any type of the above-described film sealing and gap sealing may be used as the sealing, the film sealing is superior to the gap sealing from the viewpoint of the cooling efficiency of the OLED element 14. In order to isolate the OLED elements 14 from ambient air to protect them, one or more passivation layers may be provided around the sealing member 24A.

Moreover, power lines 20A, 20B, and 20C and electrodes 341A, 341B, 361A, 361B and 361C are formed on the top surface of the sealing member 24A to drive the OLED element 14. These elements are formed of, for example, a conductive material, such as aluminum. The power lines 20A, 20B, and 20C are electrically connected to the electrodes 32A, 32B, and 32C, respectively. Although detailed illustration is omitted, wiring that connects the power lines 20A, 20B, and 20C with the electrodes 32A, 32B, and 32C, respectively, and an insulating film are provided on the top surface of the sealing member 24A, and the insulating film is interposed between the power lines and the wiring which should not be connected to each other.

Further, a plurality of electrodes 344 is formed at the bottom of the sealing member 24A. The positions of the electrodes 344 are right in back of electrodes 341A and 341B, and the electrodes 341A and 341B and the corresponding electrodes 344 are electrically connected to each other by through-holes 342 having a conductive material layer formed on their inner surface. These electrodes 344 are connected to the electrodes 18A and 18B, respectively, formed on the substrate 52 via an anisotropic conductive material 346, and finally connected to a negative electrode and a positive electrode of the OLED element 14, respectively. The anisotropic conductive material 346 shows electrical conductivity in a direction that opposed electrodes are connected to each other, and shows insulating properties in other directions. For example, a high polymer material, such as anisotropic conductive paste or anisotropic conductive film can be used as the anisotropic conductive material 346. When the sealing member 24A is formed of a conductive material, although not shown, in order to prevent short circuit of the power lines 20A, 20B, and 20C, the electrodes 341A, 341B, 344, 361A, 361B and 361C, and conductors in the through-holes 342, an insulating layer is provided between the sealing member 24A and these.

Further, a driver IC, i.e., a circuit element 28A is attached on the second substrate 78 to drive the plurality of OLED elements 14. The circuit element 28A is almost the same as the circuit element 28 as described in detail in relation to the first, second, and fifth embodiments. However, in the embodiment, the electrodes 30A, 30B, 32A, 32B, and 32C are formed on the bottom surface (surface opposed to the sealing member 24A) of the circuit element 28A so as to protrude therefrom.

Although the mounting type of the circuit element 28A to the sealing member 24A is not illustrated, flip chip bonding or the same anisotropic conductive material as the anisotropic conductive material 346 is used. The electrodes 30A and 30B on the bottom surface of the circuit element 28A are connected to the electrodes 341A and 341B on the top surface of the sealing member 24A, respectively, by the mounting, and finally connected to a negative electrode and a positive electrode of the OLED element 14 via the through-hole 342, the anisotropic conductive material 346, and the electrodes 18A and 18B on the substrate 52. Further, the electrodes 32A, 32B, and 32C on the bottom surface of the circuit element 28A are connected to the power lines 20A, 20B, and 20C, respectively, via the electrodes 361A, 361B and 361C by the mounting.

The power line 20A is a low potential power line common to the OLED elements 14 and the circuit element 28. The power line 20B is a high potential power line of the OLED elements 14. The power line 20C is a high potential power line of the circuit element 28A. These power lines 20A, 20B, and 20C are connected to a power unit via a flexible board (not shown).

Details on each OLED elements 14 is the same as those as described in detail in relation to the first embodiment referring to FIG. 3. The variations of the OLED elements as described above in relation to the first embodiment may be used.

A drive system of the electro-optical device 2050 is the same as the drive system of the electro-optical device 2010 as described in detail in relation to the first embodiment referring to FIGS. 4 and 5. The variations of the circuit element as described above in relation to the first embodiment may be used.

Figure 35:
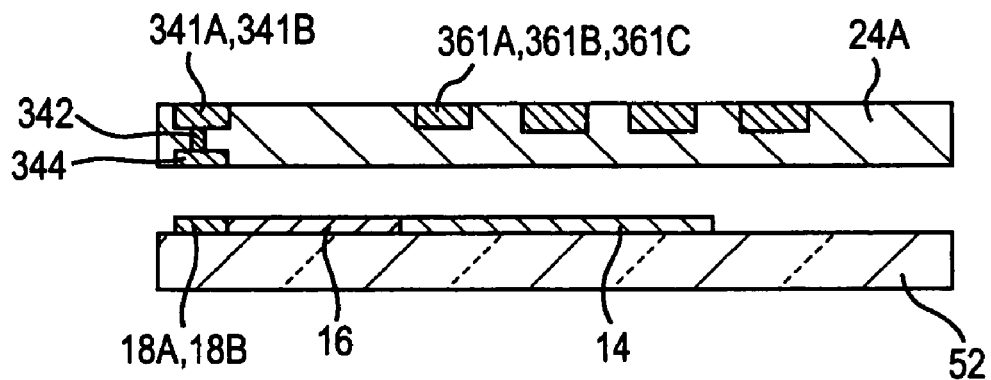
FIG. 35 shows a first process of a procedure of manufacturing the electro-optical device shown in FIG. 33.

Next, a procedure of manufacturing the electro-optical device 2050 of the sixth embodiment will be described. First, as shown in FIG. 35, the OLED element 14, the wiring 16 and the electrodes 18A and 18B are formed on the substrate 52. The forming method may be any one of the known methods, and description thereof will be omitted herein.

On the other hand, as shown in FIG. 35, the through-hole 342, the electrode 341A, 341B, 344, 361A, 361B and 361C are formed on the sealing member 24A. Although not shown, thereafter, the power lines 20A, 20B, and 20C may be protected by an overcoat film. As the overcoat film, for example, there are an SiO$_2$ film, an SiN film, and a combination of them. The forming method may be any one of the known methods, and description thereof will be omitted herein.

Figure 36:
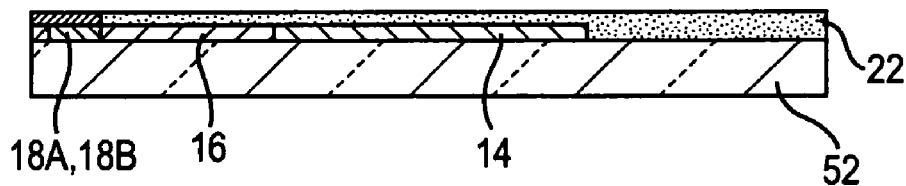
FIG. 36 shows a process subsequent to the process in FIG. 35.
Figure 37:
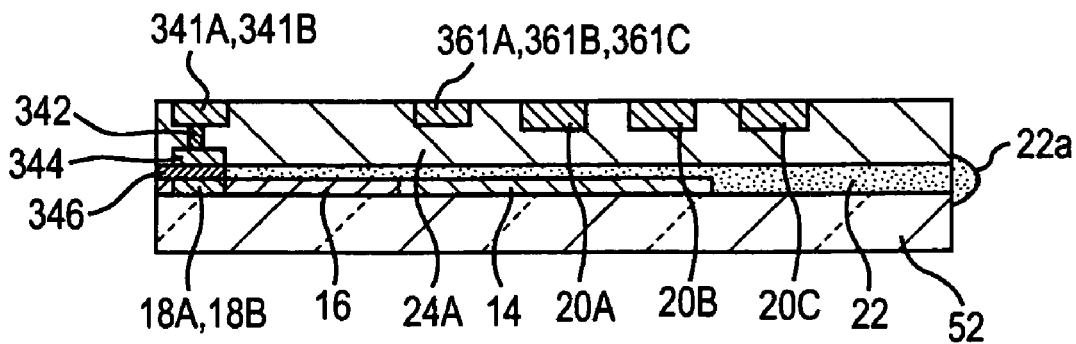
FIG. 37 shows a process subsequent to the process in FIG. 36.

Next, as shown in FIG. 36, the heat-curable or ultraviolet curable adhesive 22 for sealing are coated on the substrate 52. Further, the anisotropic conductive material 346 is coated on the electrodes 18A and 18B on the substrate 52 at positions to overlap it. Further, as shown in FIG. 37, the sealing member 24A is put on the adhesive 22 and the anisotropic conductive material 346 to be adhered to the substrate 52, and thereafter, the adhesive 22 and the anisotropic conductive material 346 are cured. Similar to the fifth embodiment, the adhesive 22 for sealing, as shown in FIG. 37, may have a protrusion 22a that protrudes from a space between the substrate 52 and the sealing member 24A to partially cover a side end of the sealing member 24A.

Thereafter, as shown in FIGS. 33 and 34, the circuit element 28A is mounted at a predetermined position on the sealing member 24A, thereby completing the electro-optical device 2010. It should is noted herein that the mounting of the circuit element 28A to the sealing member 24A may be performed before the adhesion of the sealing member 24A to the substrate 52.

According to the arrangement of this embodiment, the power lines 20A, 20B, and 20C for feeding the circuit element 28A and the OLED elements 14 with power are provided on the sealing member 24A sealing the OLED element 14, so that the area of the substrate 52 having the OLED elements 14 formed thereon can be reduced. Accordingly, the substrate 52 can be saved, which contributes to miniaturization of an apparatus including the electro-optical device 2010 as a whole.

Further, according to the arrangement of this embodiment, since the circuit element 28A which drives the OLED element 14 is provided so as to overlap the sealing member 24A which seals the OLED elements 14, it is possible to reduce the area of the substrate 52 having the OLED elements 14 formed thereon.

Further, according to this embodiment, the heat generated by the OLED element 14 is efficiently radiated through the sealing member 24A having a higher thermal conductivity than the substrate 52, heat-radiating measures can be minimized to suppress increases in the number of parts and size of the electro-optical device.

As for the arrangement of the sealing member 24A, the substrate, and the power lines 20A, 20B, and 20C, the various variations as described in detail in relation to the fifth embodiment may be employed. In addition, in the illustrated form, both side ends of the substrate 52 are made flush with both side ends of the sealing member 24A. However, as a variation of the arrangement of the sealing member and the substrate according to the invention, any one member may protrude from the other member at any one of those ends.

Seventh Embodiment

Figure 38:
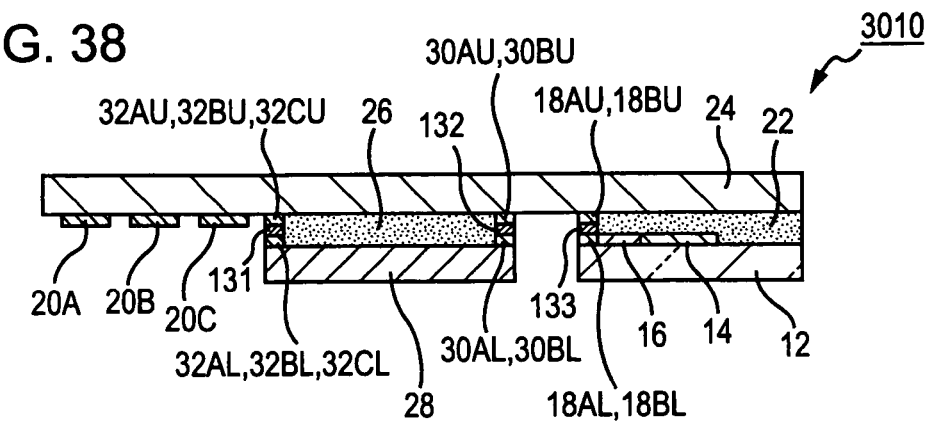
FIG. 38 is a cross-sectional view showing an electro-optical device according to a seventh embodiment of the invention.
Figure 39:
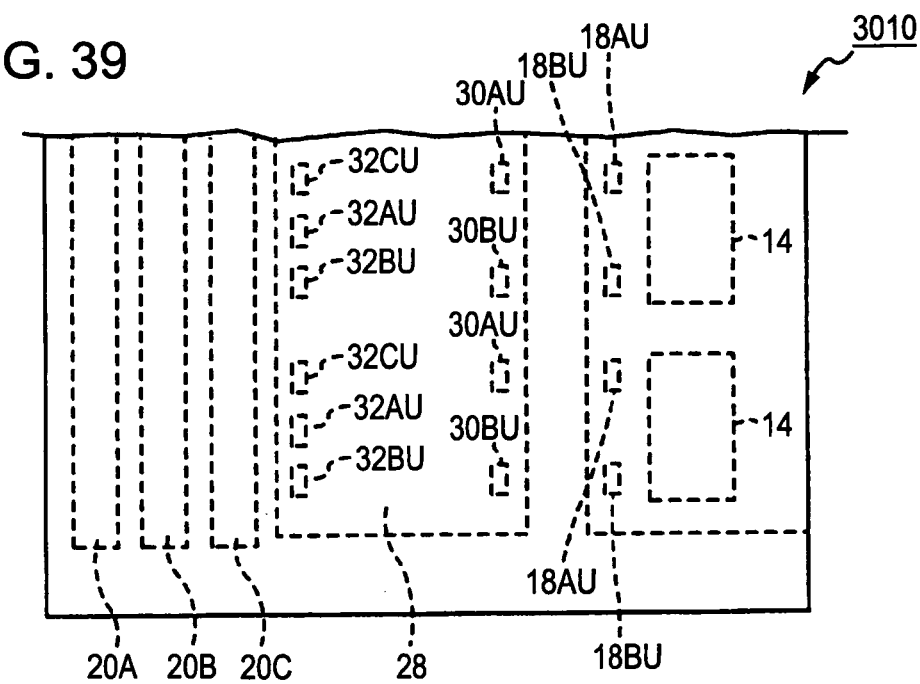
FIG. 39 is a partial plan view of the electro-optical device shown in FIG. 38.

FIG. 38 is a cross-sectional view showing an electro-optical device according to a seventh embodiment of the invention, and FIG. 39 is a partial plan view of the electro-optical device. The electro-optical device is used as a line-type optical head for writing a latent image in an image carrier in an image forming apparatus utilizing an electrophotographic method. As shown in these figures, the electro-optical device 3010 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 38. In other words, the electro-optical device is a bottom emission type.

Electrodes 18AL and 18BL for feeding the OLED elements 14 with power and wiring 16 for connecting the OLED elements 14 with the electrodes 18AL and 18BL are formed on the substrate 12.

Further, a sealing member 24 is attached to the substrate 12 so that the sealing member seals the OLED elements 14 in cooperation with the substrate 12. This sealing allows the OLED elements 14 to be isolated from ambient air, particularly moisture and oxygen, thereby suppressing deterioration thereof. The sealing member 24 is larger than the substrate 12, and formed of, for example, glass, metal, ceramic, or plastic. Of course, when the electro-optical device is a top emission type in which the light emitted from each OLED element 14 passes through the sealing member 24 and then travels upward in FIG. 38, the sealing member 24 should be transparent, and metal cannot be employed as the material for the sealing member. Connecting terminals 18AU and 18BU for feeding the OLED element 14 with power are formed on the surface of the sealing member 24 which faces the substrate 12. Adhesive 22 is preferably used for attachment of the sealing member 24 to the substrate 12. Preferably, an anisotropic conductive material 133 is used for electrical connection between the connecting terminals. As the adhesive, for example, a heat-curable adhesive or an ultraviolet curable adhesive is used.

As the type of sealing, any one of the above-described film sealing and the gap sealing may be used. Even if any sealing is used, the anisotropic conductive material 133 rather than the adhesive 22 is used for electrical connection between the connecting terminal 18AL and the connecting terminal 18AU and for electrical connection between the connecting terminal 18BL and the connecting terminal 18BU. In order to further isolate the OLED elements 14 from ambient air to protect them, one or more passivation layers may be provided above the sealing member 24.

Among the portions of the sealing member 24 that are located on its surface facing the substrate 12 and do not overlap the substrate 12, power lines 20A, 20B, and 20C and connecting terminals 30AU, 30BU, 32AU, 32BU and 32CU are formed to drive the OLED elements 14. Further, although detailed illustration are omitted, wiring for connecting the power lines 20A, 20B, and 20C with the connecting terminals 32AU, 32BU and 32CU and a protective film (insulating film) are provided on the surface of the sealing member and the protective film is interposed between the power lines and the wiring that should not be connected with each other. Among the connecting terminals 32AU, 32BU and 32CU, the connecting terminal 32AU is electrically connected to the power line 20A, the connecting terminal 32BU is electrically connected to the power line 20B, and the connecting terminal 32CU is electrically connected to the power line 20C. Further, although detailed illustration is omitted, wiring that connects the connecting terminals 30AU and 30BU with the connecting terminals 18AU and 18BU are provided on the surface of the sealing member. Among the connecting terminals 30AU and 30BU, the connecting terminal 30AU is electrically connected to the connecting terminal 18AU, and the connecting terminal 30BU is electrically connected to the connecting terminal 18BU.

Moreover, a driver IC, i.e., a circuit element 28 is attached on the sealing member 24 facing the substrate 12 to drive the plurality of OLED elements 14. Adhesive 26 and anisotropic conductive materials 131 and 132 are preferably used for the attachment of the circuit element 28 to the sealing member 24. As the adhesive, for example, a heat-curable adhesive or an ultraviolet curable adhesive is used.

The circuit element 28 is the same as the circuit element 28 as described in detail with relation to the first embodiment. The circuit element 28 has connecting terminals 30AL, 30BL, 32AL, 32BL and 32CL on its surface opposed to the sealing member 24. The connecting terminals 30AL and 30BL are connected to the connecting terminals 30AU and 30BU, respectively, on the sealing member 24 via the anisotropic conductive material 132, and finally connected to a negative electrode and a positive electrode, respectively, of the OLED element 14.

The power line 20A is a low potential power line common to the OLED elements 14 and the circuit element 28. The power line 20B is a high potential power line of the OLED elements 14. The power line 20C is a high potential power line of the circuit element 28. These power lines 20A, 20B, and 20C are connected to a power unit via a flexible board (not shown).

The wiring 16, the connecting terminals 18AL, 18AU, 18BL, 18BU, 30AL, 30AU, 30BL, 30BU, 32AL, 32AU, 32BL, 32BU, 32CL and 32CU, and the power lines 20A, 20B, and 20C are formed of, for example, a conductive material, such as copper or aluminum.

Figure 40:
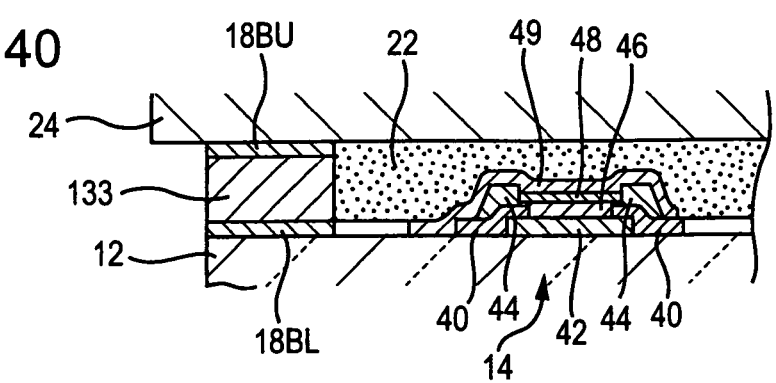
FIG. 40 is a cross-sectional view showing details on an OLED element within the electro-optical device shown in FIG. 38.

FIG. 40 is a cross-sectional view showing details on each OLED element 14. The OLED element 14 has a hole injection layer 46 film-formed on a positive electrode 42 made of transparent ITO (Indium Tin Oxide), a light-emitting layer 48 film-formed on the hole injection layer, and a negative electrode 49 film-formed on the light-emitting layer. The hole injection layer 46 and the light-emitting layer 48 is formed within a concave portion defined by an insulating layer 40 and a partition wall 44. As the material for forming the insulating layer 40, for example, $SiO_2$ is used, and as the material for forming the partition wall 44, for example, polyimide is used.

The positive electrode 42 is connected to the connecting terminal 18BL via a lead wire which is not shown in FIG. 40, and although illustrated in detail in FIG. 40, the negative electrode 49 is connected via the lead wire to the connecting terminal 18AL behind the connecting terminal 18BL. These lead wires are schematically shown as the wiring 16 in FIG. 38. Although the OLED element 14 of this embodiment is constructed as described above, the variation of the OLED element 14 according to the invention may be a type having another layer, such as a type in which an electron injection layer is provided between a negative electrode and a light-emitting layer or a type in which an insulating layer is provided between a positive electrode and a transparent substrate.

A drive system of the electro-optical device 3010 is similar to the drive system of the electro-optical device 10 as described in detail in relation to the first embodiment referring to FIGS. 4 and 5. The variations of the circuit element 28 as described above in relation to the first embodiment may be used.

Figure 41:
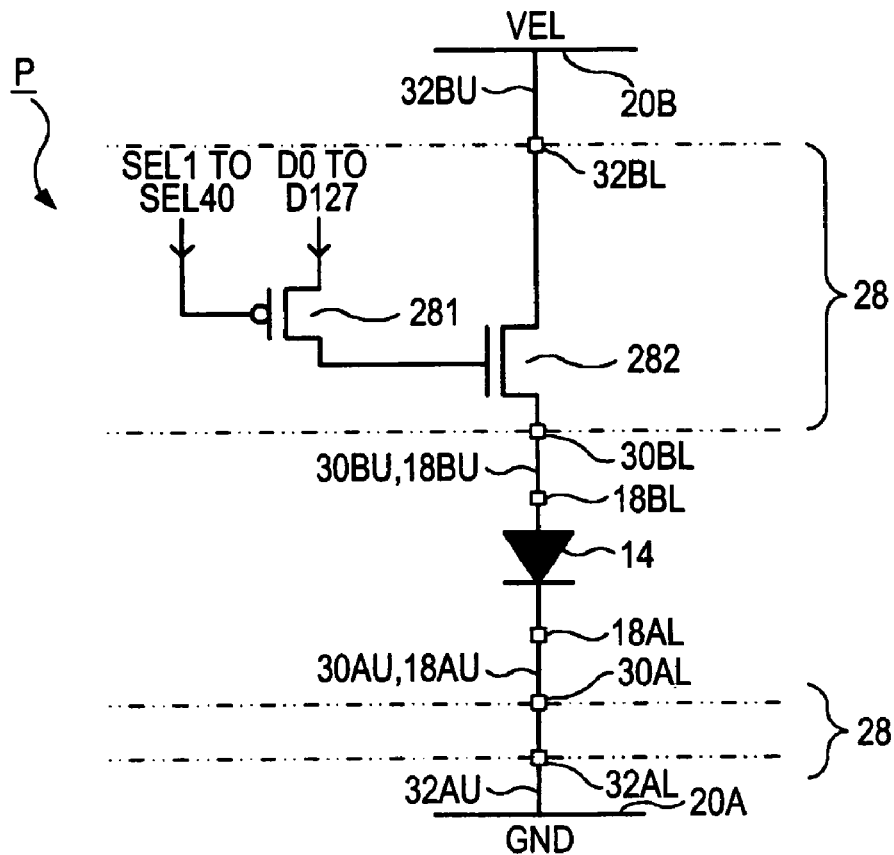
FIG. 41 is a circuit diagram showing each pixel circuit within a drive system of the electro-optical device shown in FIG. 38.

However, as shown in FIG. 41, wiring of a drive system of the electro-optical device 3010 is slightly different from that in the first embodiment (FIG. 5). As shown in FIG. 41, the second power potential VEL is supplied to a drain of the driving transistor 282 via the connecting terminals 32BU and 32BL from the high potential power line 20B. A source of the driving transistor 282 is connected to the positive electrode of the OLED element 14 via the connecting terminals 30BL, 30BU, 18BU and 18BL. The drive transistor 282 supplies the OLED element 14 with a driving current corresponding to a (binary) voltage written in the storage capacitor. The negative electrode of the OLED element 14 is supplied with the ground potential GND via the connecting terminals 32AU, 32AL, 30AL, 30AU, 18AU and 18AL from the low potential power line 20A.

Next, a procedure of manufacturing the electro-optical device 3010 of the seventh embodiment will be described.

Figure 42:
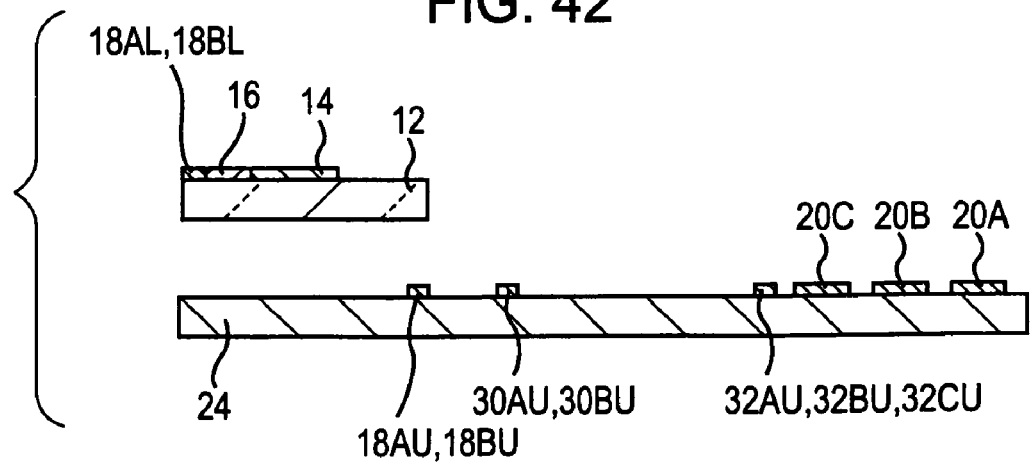
FIG. 42 shows a first process of a procedure of manufacturing the electro-optical device shown in FIG. 38.

As shown in FIG. 42, first, the OLED element 14, the wiring 16, and the connecting terminals 18AL and 18BL are formed on the substrate 12. In actual practice, the OLED element 14, the wiring 16, and the connecting terminals 18AL and 18BL are formed on one large original substrate to be diced into a plurality of substrates 12, and by dicing the original substrate into the plurality of substrates 12, the substrate 12 having the OLED element 14, the wiring 16, and the connecting terminals 18AL and 18BL formed thereon is obtained.

Further, the connecting terminals 18AU, 30AU, 30BU, 32AU, 32BU and 32CU and the power lines 20A, 20B, and 20C are formed on the sealing member 24. In actual practice, the connecting terminals 18AU, 30AU, 30BU, 32AU, 32BU and 32CU and the power lines 20A, 20B, and 20C are formed on one large original substrate to be diced into a plurality of sealing members 24, and by dicing the original substrate into the plurality of sealing members 24, the sealing member 24 having the connecting terminals 18AU, 30AU, 30BU, 32AU, 32BU and 32CU and the power lines 20A, 20B, and 20C formed thereon is obtained.

The positions of the sealing member 24 where the connecting terminals and the power lines are formed are on one surface of the two widest surfaces, and the others than the connecting terminals 18AU and 18BU are within a region (a region that does not overlap the substrate 12 that protrudes from the substrate 12) when the sealing member 24 is adhered to the substrate 12. Although not shown, thereafter, the power lines 20A, 20B, and 20C may be protected by a protective film. As the protective film, for example, there are an $SiO_2$ film, an SiN film, and a combination of them. The forming method may be any one of the known methods, and description thereof will be omitted herein.

In forming OLED elements, wiring, and connecting terminals on a large original substrate from which the substrate 12 is to be diced, layers such as a metal layer, a positive electrode, a light-emitting layer (a hole transport layer, a light-emitting polymer layer, and an electron injection layer), a negative electrode, an insulating layer, a bank, and a protective layer are needed. In other words, types of required materials or required processes are much more than in a case where connecting terminals and power lines are formed on another large original substrate from which a plurality of sealing members 24 are diced. In particular, it takes more time or costs much to form a light-emitting layer. For example, in a method of dripping droplets to form those layers, it takes times because processes of performing coating, drying, and baking are complicated. For example, even in a sputtering method, materials of the light emitting polymer layer are considerably very expensive and much cost is required.

Figure 43:
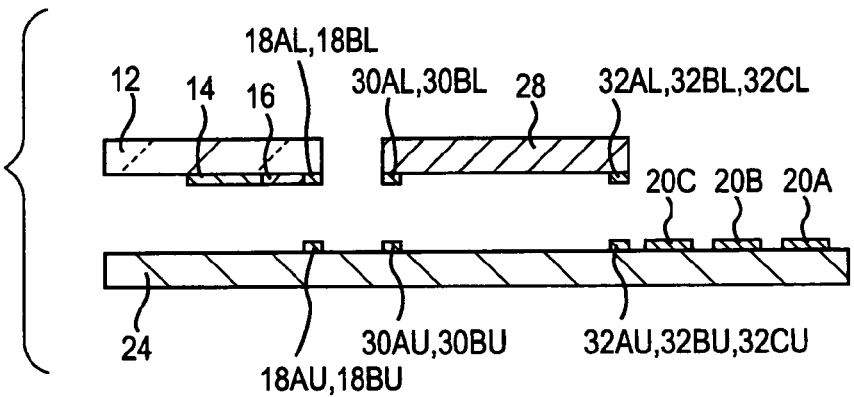
FIG. 43 shows a process subsequent to the process in FIG. 42.

As shown in FIG. 43, the substrate 12 and the circuit element 28 are arranged on the sealing member 24. This arrangement is performed so that the connecting terminals 18AL and 18BL of the substrate 12 are opposed to the connecting terminals 18AU and 18BU of the sealing member 24, respectively, the connecting terminals 30AL and 30BL of the circuit element 28 are opposed to the connecting terminals 30AU and 30BU of the sealing member 24, respectively, and the connecting terminals 32AL, 32BL and 32CL of the circuit element 28 are opposed to the connecting terminals 32AU, 32BU and 32CU of the sealing member 24, respectively.

Figure 44:
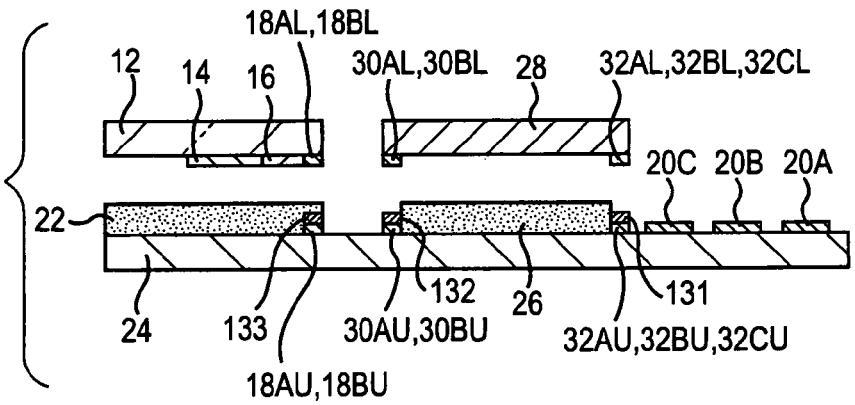
FIG. 44 shows a process subsequent to the process in FIG. 43.

Next, as shown in FIG. 44, heat-curable or ultraviolet curable adhesives 22 and 26 for sealing is coated on the sealing member 24, while anisotropic conductive materials 131, 132 and 133 are coated on the connecting terminals of the sealing member 24. In coating the anisotropic conductive materials, the anisotropic conductive material 131 is coated on the connecting terminals 32AU, 32BU and 32CU, and the anisotropic conductive material 132 is coated on the connecting terminals 30AU and 30BU, and the anisotropic conductive material 132 is coated on the connecting terminal 18AU and 18BU.

Figure 45:
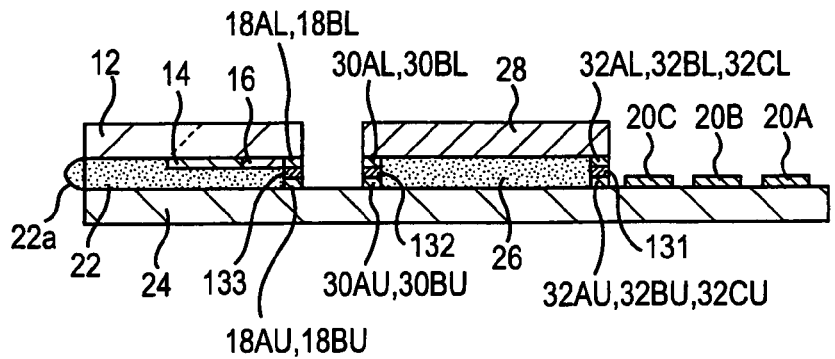
FIG. 45 shows a process subsequent to the process in FIG. 44.

Next, as shown in FIG. 45, the substrate 12 is put on the adhesive 22 and the anisotropic conductive material 133 to be adhered to the sealing member 24, and thereafter, the adhesive 22 is cured. On the other hand, the circuit element 28 is put on the adhesive 26 and the anisotropic conductive materials 131 and 132 to be adhered to the sealing member 24, and thereafter, the adhesive 22 is cured. In this way, the connecting terminals 18AL and 18BL of the substrate 12 are electrically connected to the connecting terminals 18AU and 18BU, respectively, of the sealing member 24 via the anisotropic conductive material 133, the connecting terminals 30AL and 30BL of the circuit element 28 are electrically connected to the connecting terminals 30AU and 30BU, respectively, of the sealing member 24 via the anisotropic conductive material 132, and the connecting terminals 32AL, 32BL and 32CL of the circuit element 28 are electrically connected to the connecting terminals 32AU, 32BU and 32CU, respectively, of the sealing member 24 via the anisotropic conductive material 131. The electro-optical device 3010 is completed in this way.

The adhesive 22 for sealing, as shown in FIG. 45, may have a protrusion 22a that protrudes from a space between the substrate 12 and the sealing member 24 to partially cover side ends of the substrate 12 and the sealing member 24. The provision of such a protrusion 22a enables the sealing effect to be further enhanced. The provision of the protrusion 22a may be made by coating a larger amount of adhesive than the amount to be actually disposed by the space substrate 12 and the sealing member 24, on the substrate 12 so that the adhesive protrudes from the space, or by further coating adhesive 22 on the outside thereof after the adhesive is cured.

According to the arrangement of this embodiment, since the circuit element 28 and the power lines 20A, 20B, and 20C which drive the OLED element 14 are provided in the sealing member 24, the size of the substrate 12 can be reduced compared to when any one of both is provided on the substrate 12. Accordingly, the number of substrates 12 which can be diced from one large original substrate can be increased. Since the formation of OLED elements costs much, the more the number of substrates 12 obtained from one large original substrate is, that is, the more the number of OLED elements which can be formed on the larger original substrate in a lump, the smaller the resulting manufacturing cost of element substrates 12 is. From the foregoing, according to this arrangement, the manufacturing cost of the electro-optical device 3010 can be reduced. This leads to reduction in the manufacturing cost of the overall apparatus including the electro-optical device 3010.

Further, since the circuit element 28 and the power lines 20A, 20B, and 20C do not overlap the substrate 12, even if the electro-optical device is of a bottom emission type as in the present embodiment, or even if it is of a top emission type in which the light from the OLED element 14 travels through the sealing member, the light from the OLED element 14 is not shielded by the circuit element 28 and the power lines 20A, 20B, and 20C. In other words, the electro-optical device of the invention can be applied to both the types.

Eighth Embodiment

Figure 46:
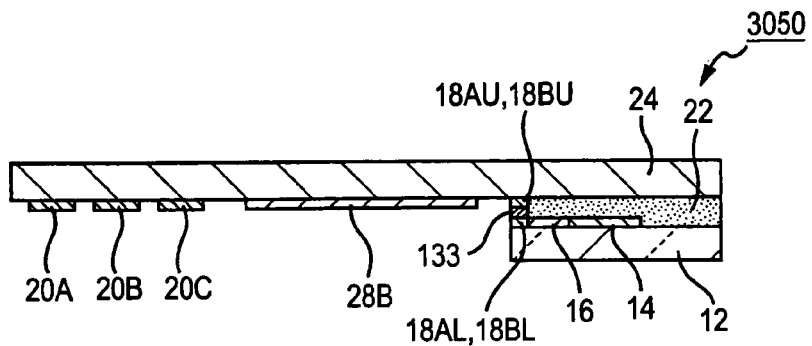
FIG. 46 is a cross-sectional view showing an electro-optical device according to an eighth embodiment of the invention.
Figure 47:
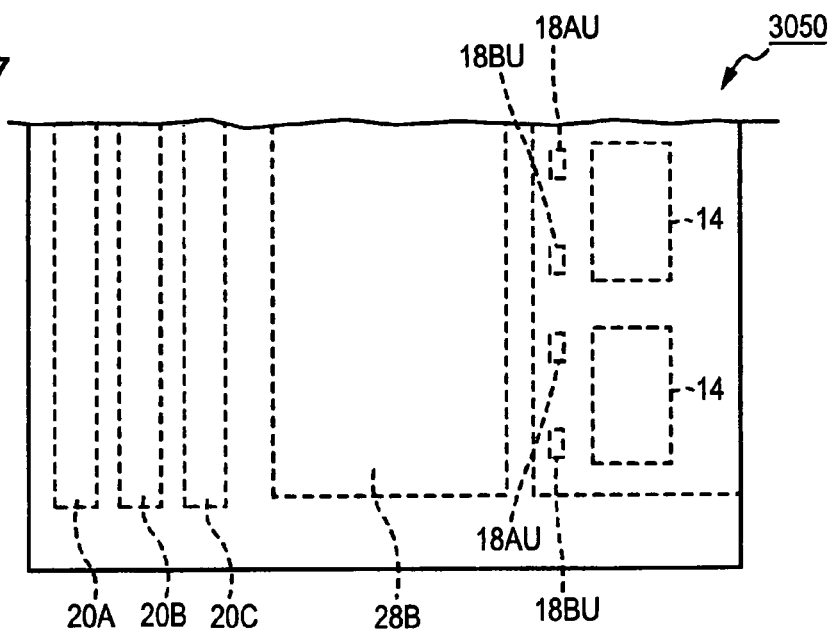
FIG. 47 is a partial plan view of the electro-optical device shown in FIG. 46.

FIG. 46 is a cross-sectional view showing an electro-optical device according to an eighth embodiment of the invention, and FIG. 47 is a partial plan view of the electro-optical device. An electro-optical device 3050 of this embodiment is different from the above-mentioned electro-optical device 3010 in that the circuit element 28 is not attached to the sealing member 24, but a circuit laminate 28B having the same function as the circuit element 28 is formed on the sealing member 24. Similar to the circuit laminate 28B of the third embodiment, the circuit laminate 28B is a driver IC to drive the plurality of OLED elements 14, and is formed as a TFT array on the sealing member 24. However, any other structure in which the circuit laminate 28B is formed so as to be laminated on the sealing member 24 may be adopted.

Since the circuit laminate 28B is formed on the sealing member 24, the connecting terminals 30AL, 30AU, 30BL, 30BU, 32AL, 32AU, 32BL, 32BU, 32CL, 32CU, the anisotropic conductive materials 131 and 132, and the adhesive 26 are unnecessary. In other words, in the electro-optical device 3050, the circuit laminate 28B constitutes a circuit equivalent to the circuit element 28 in FIG. 41 without using the connecting terminals, the anisotropy conductive materials, and the adhesive.

Next, a procedure of manufacturing the electro-optical device 3050 of the eighth embodiment will be described.

Figure 48:
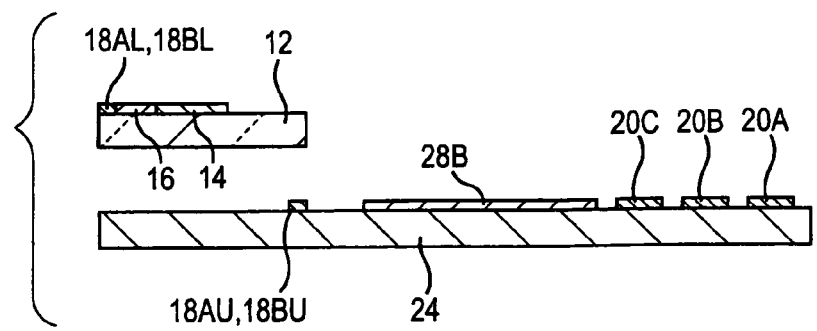
FIG. 48 shows a first process of a procedure of manufacturing the electro-optical device shown in FIG. 46.

As shown in FIG. 48, first, the OLED element 14, the wiring 16, and the connecting terminals 18AL and 18BL are formed on the substrate 12. Details on this formation are as described in relation to the seventh embodiment. Further, the connecting terminals 18AU, 30AU, 30BU, 32AU, 32BU and 32CU, the power lines 20A, 20B, and 20C, and the circuit laminate 28B are formed on the sealing member 24. In actual practice, the connecting terminals 18AU, 30AU, 30BU, 32AU, 32BU and 32CU, the power lines 20A, 20B, and 20C, and the circuit laminate 28B are formed on one large original substrate to be diced into a plurality of sealing members 24, and by dicing the original substrate into the plurality of sealing members 24, the sealing member 24 having the connecting terminals 18AU, 30AU, 30BU, 32AU, 32BU and 32CU, the power lines 20A, 20B, and 20C, and the circuit laminate 28B formed thereon is obtained.

The positions of the sealing member 24 where the connecting terminals, the power lines, and the circuit laminate are formed are on one surface of the two widest surfaces, and the others than the connecting terminals 18AU and 18BU are within a region (a region that does not overlap the substrate 12) that protrudes from the substrate 12 when the sealing member 24 is adhered to the substrate 12. Thereafter, although not shown, the power lines 20A, 20B, and 20C may be protected by a protective film as described in relation to the seventh embodiment.

Figure 49:
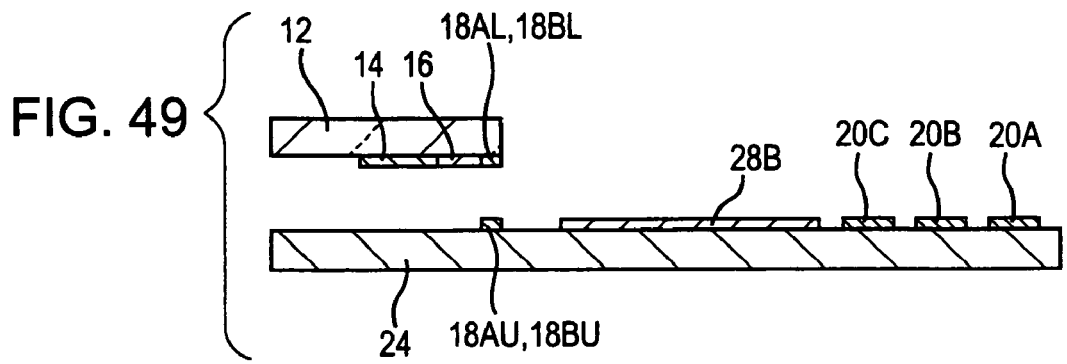
FIG. 49 shows a process subsequent to the process in FIG. 48.

As shown in FIG. 49, the substrate 12 is then disposed on the sealing member 24. The arrangement is performed so that the connecting terminals 18AL and 18BL of the substrate 12 are opposed to the connecting terminals 18AU and 18BU, respectively, of the sealing member 24.

Figure 50:
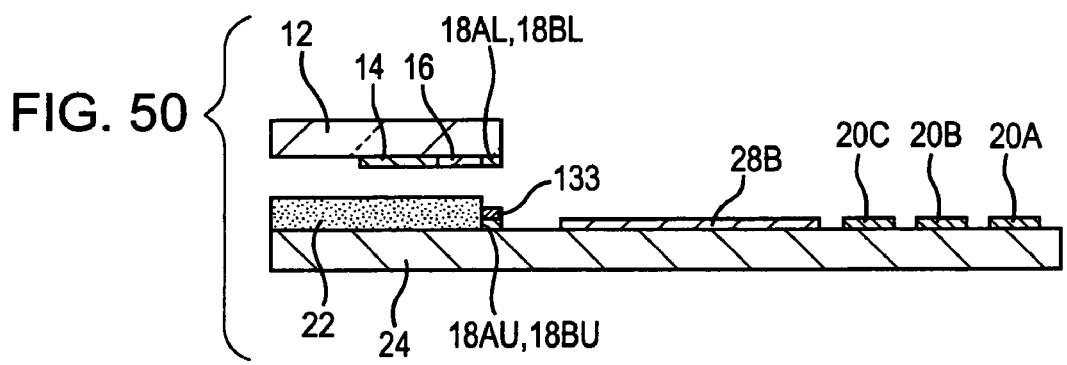
FIG. 50 shows a process subsequent to the process in FIG. 49.

Next, as shown in FIG. 50, heat-curable or ultraviolet curable adhesive 22 for sealing is coated on the sealing member 24, while an anisotropic conductive material 133 is coated on the connecting terminals 18AU and 18BU of the sealing member 24.

Figure 51:
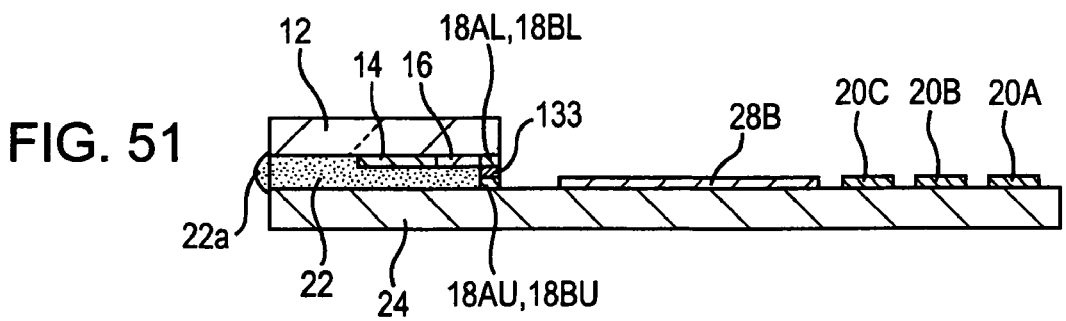
FIG. 51 shows a process subsequent to the process in FIG. 50.

Next, as shown in FIG. 51, the substrate 12 is put on the adhesive 22 and the anisotropic conductive material 133 to be adhered to the sealing member 24, and thereafter, the adhesive 22 is cured. In this way, the connecting terminals 18AL and 18BL of the substrate 12 are connected to the connecting terminals 18AU and 18BU, respectively, of the sealing member 24 via the anisotropic conductive material 133. The electro-optical device 3050 is completed in this way.

According to the arrangement of this embodiment, since the circuit laminate 28B and the power lines 20A, 20B, and 20C which drive the OLED element 14 are formed in the sealing member 24, the size of the substrate 12 can be reduced compared to when any one of both is provided on the substrate 12. Accordingly, the number of substrates 12 which can be diced from one large original substrate can be increased. Since the formation of OLED elements costs much, the more the number of substrates 12 obtained from one large original substrate is, that is, the more the number of OLED elements which can be formed on the larger original substrate in a lump, the smaller the resulting manufacturing cost of element substrates 12 becomes. From the foregoing, according to this arrangement, the manufacturing cost of the electro-optical device 3050 can be reduced. This leads to reduction in the manufacturing cost of the overall apparatus including the electro-optical device 3050. Further, since the circuit laminate 28B and the power lines 20A, 20B, and 20C do not overlap the substrate 12, the electro-optical device of the invention can be applied to both of a bottom emission type and a top emission type as described in relation to the seventh embodiment.

Further, since a circuit that drives the OLED element 14 is the circuit laminate 28B formed on the sealing member 24, electrical connection by some connecting terminals becomes unnecessary. This simplifies the manufacturing process of the electro-optical device. Further, since electrical connection by some connecting terminals becomes unnecessary and thereby probability of occurrence of poor electrical conduction decreases, the reliability of the electro-optical device improves. Further, since the circuit laminate 28B is smaller than the circuit element 28, it contributes to miniaturization of the electro-optical device.

Ninth Embodiment

Figure 52A:
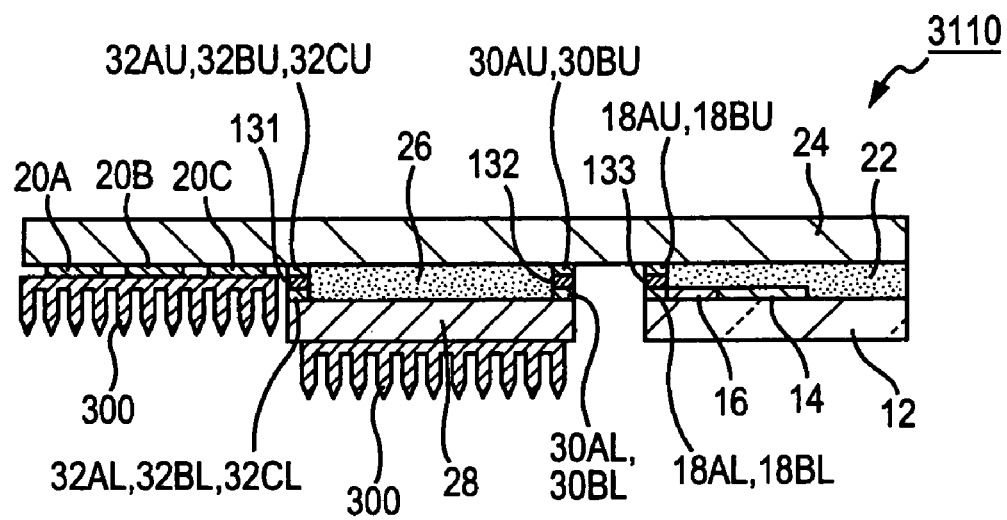
FIG. 52A is a cross-sectional view showing an electro-optical device according to a ninth embodiment of the invention.
Figure 52B:
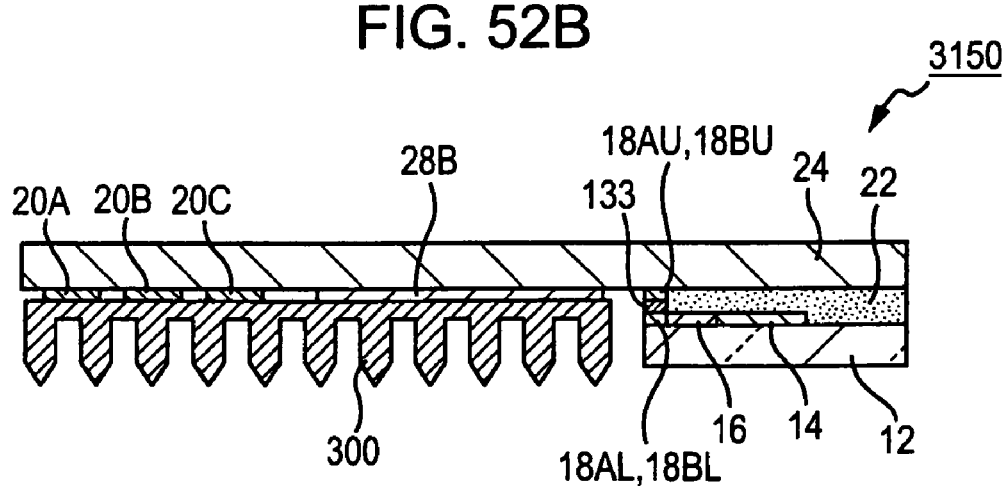
FIG. 52B is a cross-sectional view showing another electro-optical device according to a ninth embodiment of the invention.

FIG. 52A is a cross-sectional view showing an electro-optical device 3110 according to a ninth embodiment of the invention, and FIG. 52B is a cross-sectional view showing another electro-optical device 3150 according to a ninth embodiment of the invention. The electro-optical device according to the ninth embodiment is obtained by modifying the electro-optical device 3010 or the electro-optical device 3050. The electro-optical device according to this embodiment is different from the above-described the electro-optical device 3010 or the electro-optical device 3050 in that it is hard for the heat emitted by power lines 20A, 20B, and 20C and a drive/control circuit (circuit element 28 and the circuit laminate 28B) to reach the OLED element 14.

The power lines 20A, 20B, and 20C and the drive/control circuit emit quite a few heat. On the other hand, the OLED element 14 is apt to be affected by heat. Therefore, it is desirable that it is hard for the heat from the power lines 20A, 20B, 20C and the drive/control circuit to reach the OLED element 14. In order to realize this, a construction in which the sealing member 24 is formed of a material having a lower thermal conductivity than the substrate 12, while a heat-radiating mechanism (heat radiation fins 300) to discharge heat to ambient air by thermal conduction is attached to the sealing member 24 is adopted in this embodiment.

For example, when the substrate 12 is formed of glass, the sealing member 24 is formed of steatite and forsterite having a lower thermal conductivity than glass. Of course, although the sealing member 24 may be formed of materials other than these materials, it is necessary to select materials having the characteristics that is essential to the sealing member 24 which does not allows water and oxygen to permeate. In addition, which of steatite and forsterite is employed may be determined according to whether either a low thermal conductivity or a high light transmittance is made much of. For example, if the lower thermal conductivity is made much of, it is appropriate to employ steatite, and if the high light transmittance is made much of, it is appropriate to employ forsterite.

The heat radiation fins 300 is formed of metallic materials having a high thermal conductivity, such as aluminum or copper, and are attached to the surface of the sealing member in which the power lines 20A, 20B, and 20C and the drive/control circuit are formed. More specifically, the heat radiation fins are directly adhered to the power lines 20A, 20B, and 20C and the drive/control circuit. However, there is an insulating protective film between the power lines 20A, 20B, and 20C and the heat radiation fin 300. The shape and number of the heat radiation fin 300 are arbitrary. For example, in the electro-optical device 3110, one heat radiation fin 300 may be adhered to cover the power lines 20A, 20B, and 20C, separate heat radiation fins 300 may be adhered to cover the circuit element 28, and one bent heat radiation fin 300 may be adhered to cover the power lines 20A, 20B, and 20C and the circuit element 28.

The adhesion of the heat radiation fin 300 to the power lines 20A, 20B, and 20C and the circuit are performed by bonding the power lines 20A, 20B, and 20C and the drive/control circuit to the heat radiation fin 300. The time when the adhesion is performed is arbitrary. For example, the time may be between a process shown in FIG. 42 and a process shown in FIG. 43, and may be between a process shown in FIG. 48 and a process shown in FIG. 49. Otherwise, for example, the time may be after a process shown in FIG. 46, and may be after a process shown in FIG. 51.

According to the arrangement of this embodiment, since the thermal conductivity of a material for the sealing member 24 where the power lines 20A, 20B, and 20C and the drive/control circuit are arranged is lower than the thermal conductivity of a material for the substrate 12, the heat to reach the OLED element 14 can be reduced compared to when the power lines 20A, 20B, and 20C and the drive/control circuit are arranged on the substrate 12. This can reduce the bad influence of the heat from the power lines 20A, 20B, and 20C and the drive/control circuit on the OLED element 14.

Further, since the provision of the heat radiation fin 300 promotes discharge of the heat emitted by the power lines 20A, 20B, and 20C and the drive/control circuit to ambient air, compared to a case in which no heat radiation fin 300 is provided, the heat to reach the OLED element 14 from the power lines 20A, 20B, and 20C and the drive/control circuit can be reduced. Therefore, the bad influence of the heat from the power lines 20A, 20B, and 20C and the drive/control circuit on the OLED element 14 can be reduced. The heat radiation fin 300 as shown is preferably used as a heat-radiating mechanism, but a heat-radiating mechanism other than the fin, for example, a rectangular solid formed of a material having a high thermal conductivity may be used.

Tenth Embodiment

Figure 53:
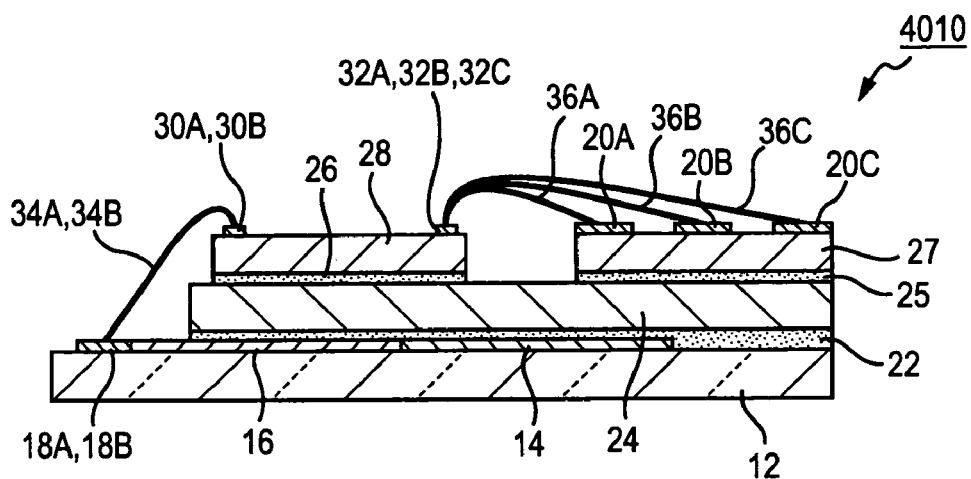
FIG. 53 is a cross-sectional view showing an electro-optical device according to a tenth embodiment of the invention.
Figure 54:
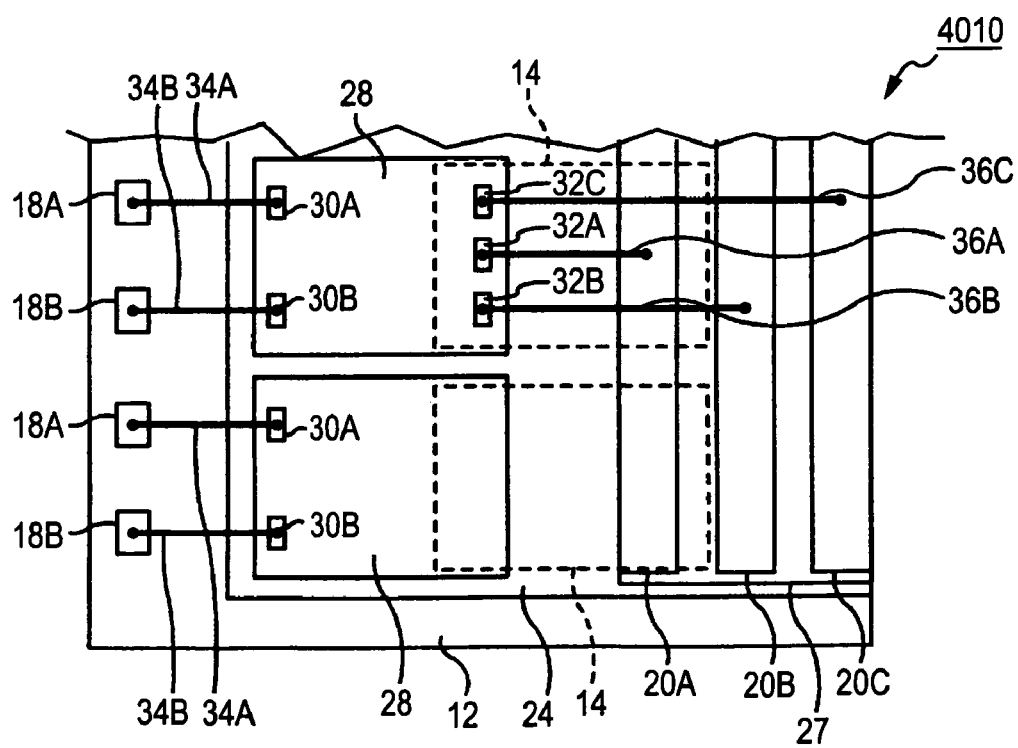
FIG. 54 is a partial plan view of the electro-optical device shown in FIG. 53.

FIG. 53 is a cross-sectional view showing an electro-optical device according to a tenth embodiment of the invention, and FIG. 54 is a partial plan view of the electro-optical device. The electro-optical device is used as a line-type optical head for writing a latent image in an image carrier in an image forming apparatus utilizing an electrophotographic method. As shown in these figures, the electro-optical device 4010 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 53. In other words, the electro-optical device is a bottom emission type.

Connecting terminals 18A and 18B for feeding the OLED elements 14 with power and wiring 16 for connecting the OLED elements 14 with the electrodes 18A and 18B are formed on the substrate 12. The wiring 16 and the connecting terminals 18A and 18B are formed of, for example, a conductive material, such as aluminum.

Similar to the first embodiment, a sealing member 24 formed of, for example, glass, metal, ceramic, or plastic is attached to the substrate 52 with adhesive 22, such as a heat-curable adhesive or an ultraviolet curable adhesive, so that the sealing member seals the OLED elements 14 in cooperation with the substrate 52. As the type of sealing, any one of the above-described film sealing and the gap sealing may be used. As the adhesive 22, for example, heat-curable adhesive or ultraviolet curable adhesive is used, and adhesive having a high light-shielding effect is preferably used. In order to isolate the OLED elements 14 from ambient air to protect them, one or more passivation layers may be provided around the sealing member 24.

A driver IC, i.e., a circuit element 28 is attached on the sealing member 24 to drive the plurality of the OLED elements 14. Adhesive 26 is preferably used for attachment of circuit element 28 to the sealing member 24. As the adhesive, for example, heat-curable adhesive or ultraviolet curable adhesive is used, and adhesive having a high light-shielding effect is preferably used.

Further, a wiring board 27 is attached on the sealing member 24. Adhesive 25 is preferably used for attachment of the wiring board 27 to the sealing member 24. As the adhesive, for example, heat-curable adhesive or ultraviolet curable adhesive is used, and preferably, adhesive having a high light-shielding effect and having a coefficient of thermal expansion between the coefficient of thermal expansion of the sealing member 24 and the coefficient of thermal expansion of the wiring board 27 is preferably used. Adhesive having a high light-shielding effect is obtained by, for example, kneading carbon in an adhesive. Further, adhesive having a coefficient of thermal expansion between the coefficient of thermal expansion of glass and the coefficient of thermal expansion of glass epoxy is obtained by filling adhesive with glass as filler.

The wiring board 27 is a multi-layer board where a wiring layer to transmit signals and an insulating layer are laminated alternately. The insulating layer is formed of, for example, glass epoxy or plastic. Elements, such as a control circuit to control power lines 20A, 20B, and 20C and a circuit element 28, a power supply circuit, and a circuit to convert signals from the outside are formed on the wiring layer on the top face of the wiring board 27 to drive the OLED element 14. The power lines 20A, 20B, and 20C, which feed the circuit element 28 and the OLED element 14 with power, is formed of a conductive material, for example, copper. The wiring layer on the bottom surface of the wiring board 27 is used for grounding. The heat radiation effect may be improved by employing a copper foil spreading on one surface as the wiring layer. Wiring lines between the above elements and the ground are formed in all the wiring layers of the wiring board 27. In addition, the wiring board 27 has, for example, four layers or six layers, and may include a wiring layer which is not used.

The power line 20A is a low potential power line common to the OLED elements 14 and the circuit element 28. The power line 20B is a high potential power line of the OLED elements 14. The power line 20C is a high potential power line of the circuit element 28. These power lines 20A, 20B, and 20C are connected to a power unit via a flexible board (not shown).

The circuit element 28 is the same as the circuit element 28 as described in detail with relation to the first embodiment. Similar to the first embodiment, the electrodes 30A and 30B of the circuit element 28 are respectively connected to the electrodes 18A and 18B on the substrate 12 via bonding wires 34A and 34B, and finally connected to a negative electrode and a positive electrode of each OLED element 14. The electrodes 32A, 32B, and 32C of the circuit elements 28 are connected to the power lines 20A, 20B, and 20C, respectively, via bonding wires 36A, 36B, and 36C. Although illustration is omitted, the circuit element 28 includes connecting terminals other than the above elements and is connected to respective elements on the wiring board 27 via bonding wires.

Details on each OLED elements 14 is the same as those as described in detail in relation to the first embodiment referring to FIG. 3. The variations of the OLED elements as described above in relation to the first embodiment may be used.

A drive system of the electro-optical device 4010 is the same as the drive system of the electro-optical device 10 as described in detail in relation to the first embodiment referring to FIGS. 4 and 5. The variations of the circuit element 28 as described above in relation to the first embodiment may be used.

Figure 55:
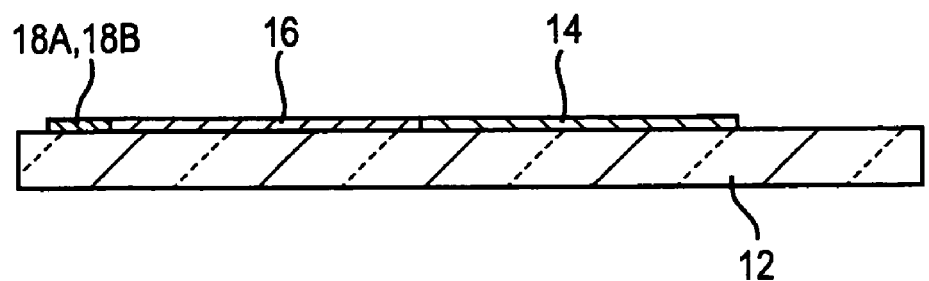
FIG. 55 shows a first process of a procedure of manufacturing the electro-optical device shown in FIG. 53.

Next, a procedure of manufacturing the electro-optical device 4010 of the tenth embodiment will be described. As shown in FIG. 55, first, the OLED element 14, the wiring 16, and the connecting terminals 18A and 18B are formed on the substrate 12. The forming method may be any one of the known methods, and description thereof will be omitted herein.

Figure 56:
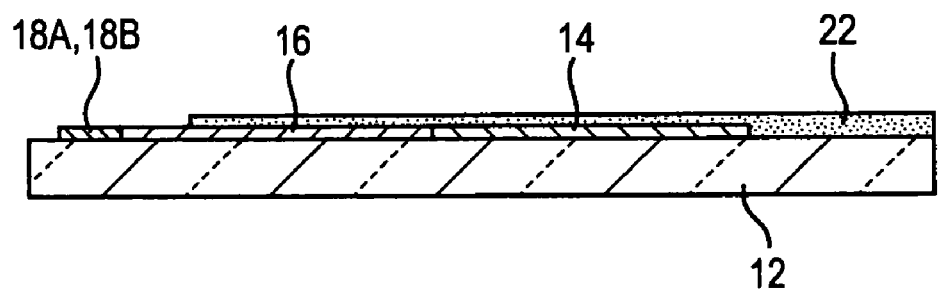
FIG. 56 shows a process subsequent to the process in FIG. 55.
Figure 57:
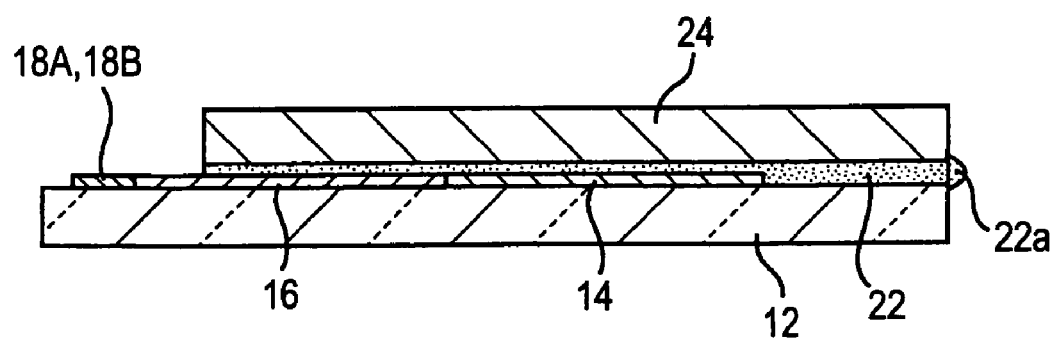
FIG. 57 shows a process subsequent to the process in FIG. 56.

Next, as shown in FIG. 56, the heat-curable or ultraviolet curable adhesive 22 for sealing are coated on the substrate 12. Further, as shown in FIG. 57, the sealing member 24 is put on the adhesive 22 to be adhered to the substrate 12, and thereafter, the adhesive 22 is cured. The adhesive 22 for sealing, as shown in FIG. 57, may have a protrusion 22a that protrudes from a space between the substrate 12 and the sealing member 24 to partially cover a side end of the sealing member 24. The provision of such a protrusion 22a enables the sealing effect to be further enhanced. The provision of the protrusion 22a may be made by coating a larger amount of adhesive than the amount to be actually disposed by the space between the substrate 12 and the sealing member 24, on the substrate 12 so that the adhesive protrudes from the space, or by further coating adhesive 22 on the outside thereof after the adhesive is cured.

Figure 58:
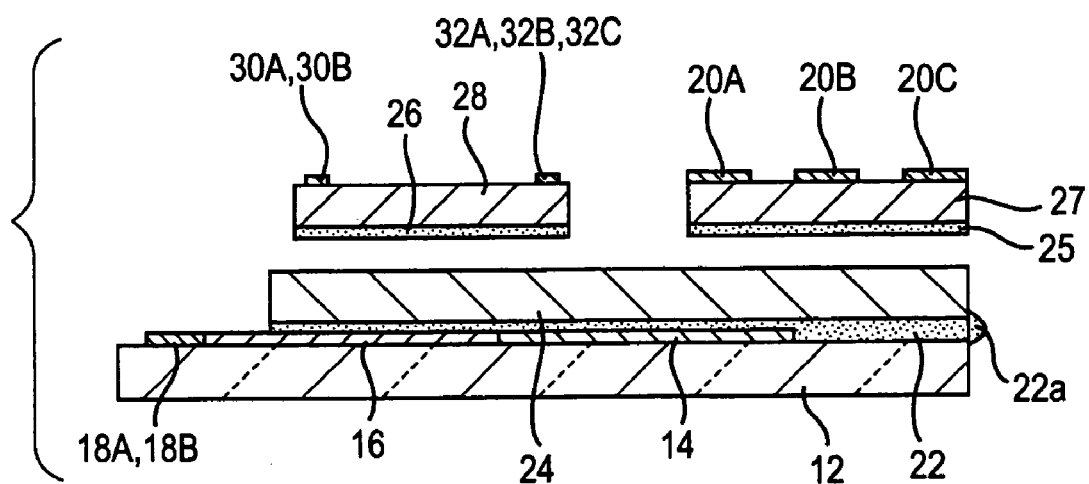
FIG. 58 shows a process subsequent to the process in FIG. 57.

Next, as shown in FIG. 58, the heat-curable or ultraviolet curable adhesive 25 is coated on the bottom surface of the wiring board 27, while the heat-curable or ultraviolet curable adhesive 26 is coated on the bottom surface of the circuit element 28. Prior to this coating, the above elements including the power lines 20A, 20B, and 20C are formed on the top surface of wiring board 27. The forming method may be any one of the known methods, and description thereof will be omitted herein. Further, the formed power lines 20A, 20B, and 20C may be protected by a protective film. As the protective film, for example, there are an $SiO_2$ film, an SiN film, and a combination of them.

Figure 59:
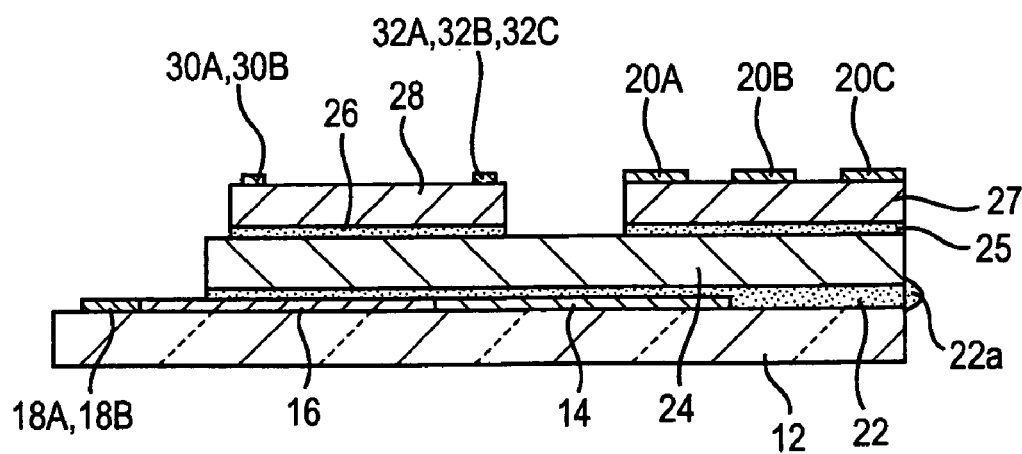
FIG. 59 shows a process subsequent to the process in FIG. 58.

Next, as shown in FIG. 59, the wiring board 27 and the circuit element 28 is adhered on the sealing member 24, and thereafter, the adhesive 25 and 26 are cured. After this curing, the power lines 20A, 20B, and 20C may be formed on the top surface of the wiring board 27. It is noted herein that the formation of the power lines should be performed before work to be described below.

Next, as shown in FIG. 53, the bonding wires 34A, 34B, 36A, 36B, and 36C are attached by a wire bonding method. Thereby, the connecting terminals 30A and 30B are connected to the connecting terminals 18A and 18B, respectively, and the connecting terminals 32A, 32B, and 32C are connected to the power lines 20A, 20B, and 20C, respectively. Thereafter, resin may be piled and cured to cover the circuit element 28. The resin preferably has a high light-shielding effect. The electro-optical device 4010 is completed in this way. In addition, the adhesion of the wiring board 27 and the circuit element 28 to the sealing member 24 may be performed before the adhesion of the sealing member 24 to the substrate 12.

Since the power lines for feeding the plurality of self-emitting elements and the circuit with power need to flow a large amount of current therethrough, they have large cross-sectional area. If such power lines are provided on the substrate having the self-emitting elements formed thereon, a substrate having large area becomes necessary. However, according to the arrangement of this embodiment, since the power lines 20A, 20B, and 20C overlap the sealing member 24 which seals the OLED elements 14, it is possible to reduce the area of the substrate 12 having the OLED elements 14 formed thereon. Accordingly, the substrate 12 can be saved, which contributes to miniaturization of an apparatus including the electro-optical device 4010 as a whole.

Further, according to the arrangement of this embodiment, since the circuit element 28 which drives the OLED element 14 is attached to the sealing member 24 which seals the OLED elements 14, it is possible to reduce the area of the substrate 12 having the OLED elements 14 formed thereon.

Further, according to the arrangement of this embodiment, the connecting terminals 30A, 30B, 32A, 32B, and 32C of the circuit element 28 and the power lines 20A, 20B, and 20C are separated from the substrate 12 and the sealing member 24. On the other hand, the connecting terminals 30A, 30B, 32A, 32B, and 32C of the circuit element 28 and power lines 20A, 20B, and 20C are heated at the time of attachment of the bonding wires 36A, 36B, and 36C. The heating is performed by spot heating using a laser beam. Since the OLED element 14 is weak to heat, the OLED element 14 may be damaged or deteriorated when the heat from the connecting terminals 30A, 30B, 32A, 32B, and 32C of the circuit element 28 and the power lines 20A, 20B, and 20C reaches the OLED element 14. Accordingly, when the wire bonding method is employed in manufacturing general electro-optical devices, manufacturing processes are limited. However, according to this arrangement, since it is hard for the heat from the connecting terminal 30A, 30B, 32A, 32B, and 32C of the circuit element 28 and the power lines 20A, 20B, and 20C to reach the OLED element 14, the degree of freedom in manufacturing processes can be increased.

Since the circuit element 28 is formed using semiconductors, it may malfunction when exposed to light. The light to which the circuit element 28 is exposed includes the light emitted from the OLED element 14 and reflected by the substrate 12. According to the above-described embodiment, since a light-shielding film is formed between the substrate 12 and the circuit element 28 to cover a part of circuit element 28 by using adhesive having a high light-shielding effect as the adhesives 22 and 26, the quantity of light to arrive at the circuit element 28 decreases, so that the probability of malfunction of the circuit element 28 can be reduced. Further, in the above-described embodiment, since the light-shielding film is formed around the circuit element 28 even when resin having a high light-shielding effect is piled and cured to cover the circuit element 28, the quantity of light to arrive at the circuit element 28 decreases, so that the probability of malfunction of the circuit element 28 can be reduced. As can be appreciated from the above, according to the above-described embodiment, the probability of malfunction of the circuit element 28 can be reduced by covering a part or all of the circuit element 28 with the light-shielding film.

In the illustrated form, the wire bonding method is used as a method of electrically connecting the OLED element 14, the wiring board 27, and the circuit element 28, but other methods may be used. If one of the other methods is a method where heating of the power lines 20A, 20B, and 20C is accompanied, the effect that the possibility of damage or deterioration of the OLED element 14 can be reduced is maintained. Further, at least one of the adhesives 22, 25 and 27 may be adhesive having a high light-shielding effect. Further, the formation of the light-shielding film may be performed by forming a metallic film having a high light-shielding effect. For example, the formation of the metallic film is performed by sputtering.

Further, in the illustrated form, one side end of the sealing member 24 is made flush with one side end of the substrate 12, but a variation of the arrangement of the sealing member and the substrate according to the invention, one member may protrude from the other member. Further, in the illustrated form, all the power lines 20A, 20B, and 20C are formed on the wiring board 27, but as a variation of a substrate and a sealing member according to the invention, at least one of the power lines 20A, 20B, and 20C is formed on the wiring board 27, and the others may be formed on at least one of the substrate 12 and the sealing member 24. In this case, since at least one of the power lines 20A, 20B, and 20C overlaps the sealing member 24, the area of the substrate 12 can be reduced, and since at least one of the power lines 20A, 20B, and 20C is formed on the wiring board 27, the possibility of damage or deterioration of the OLED element 14 can be reduced.

Eleventh Embodiment

Figure 60:
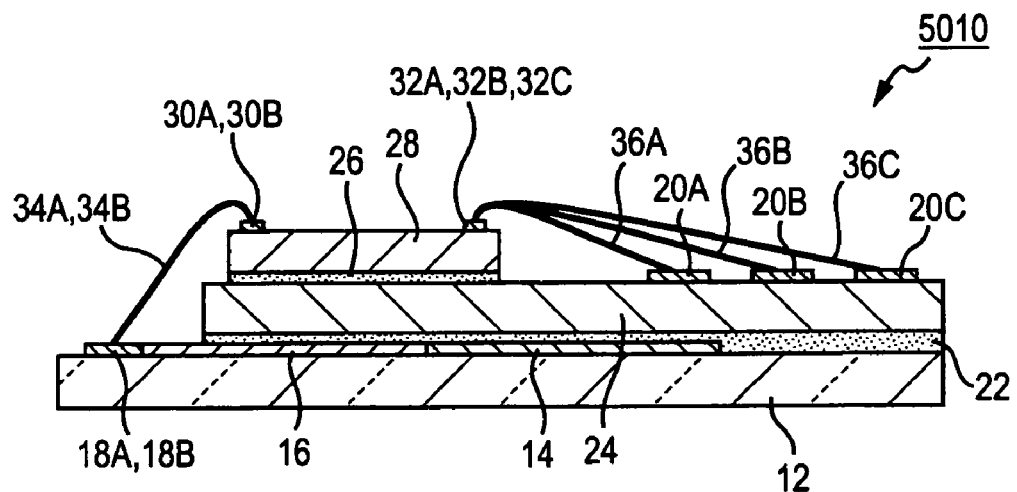
FIG. 60 is a cross-sectional view showing an electro-optical device according to an eleventh embodiment of the invention.
Figure 61:
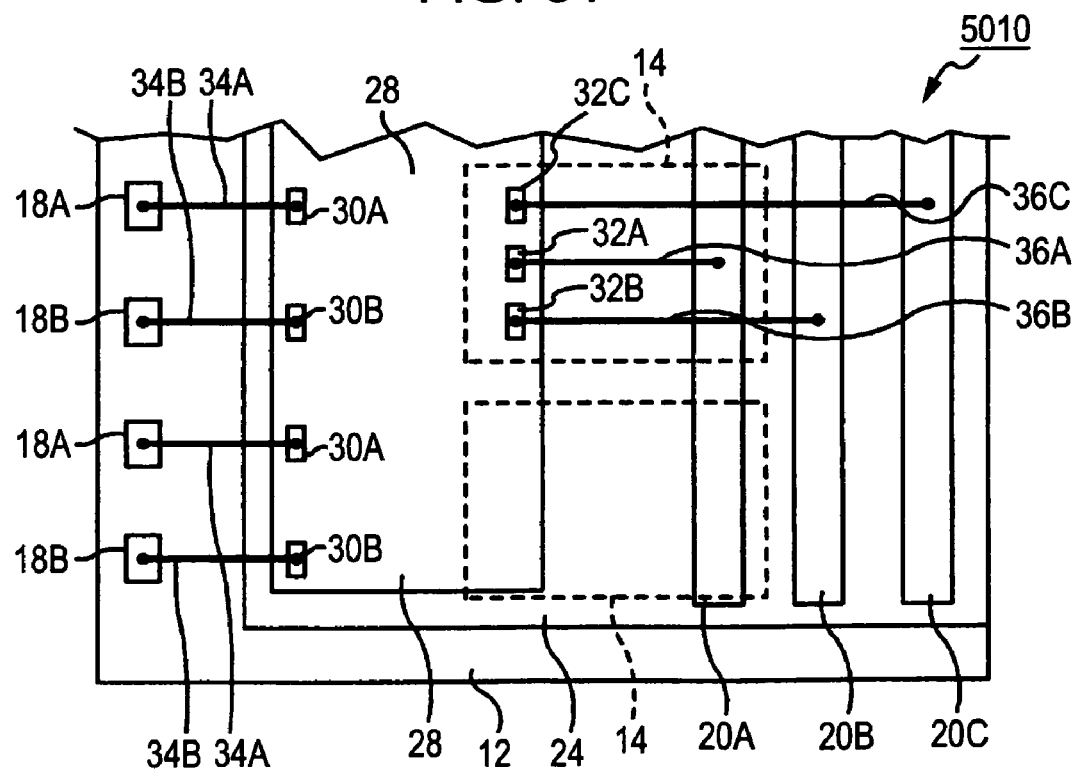
FIG. 61 is a partial plan view of the electro-optical device shown in FIG. 60.

FIG. 60 is a cross-sectional view showing an electro-optical device according to an eleventh embodiment of the invention, and FIG. 61 is a partial plan view of the electro-optical device. The electro-optical device is used as a line-type optical head for writing a latent image in an image carrier in an image forming apparatus utilizing an electrophotographic method. As shown in these figures, the electro-optical device 5010 includes a transparent substrate 12 and a plurality of OLED elements 14 (self-emitting elements) formed on the substrate 12. Preferably, the substrate 12 is a flat plate formed of, for example, glass such as quartz glass, or plastic. The plurality of OLED elements (self-emitting elements) 14 are arrayed in one row or in other appropriate patterns on the substrate 12. In the illustrated form, the light emitted from each OLED element 14 passes through the transparent substrate 12 and then travels downward in FIG. 60. In other words, the electro-optical device is a bottom emission type.

Electrodes 18A and 18B for feeding the OLED elements 14 with power and wiring 16 for connecting the OLED elements 14 with the electrodes 18A and 18B are formed on the substrate 12. The wiring 16 and the electrodes 18A and 18B are formed of, for example, a conductive material, such as copper or aluminum.

Similar to the first embodiment, a sealing member 24 formed of, for example, glass, metal, ceramic, or plastic is attached to the substrate 12 with adhesive 22, such as a heat-curable adhesive or an ultraviolet curable adhesive, so that the sealing member seals the OLED elements 14 in cooperation with the substrate 12. As the type of sealing, any one of the above-described film sealing and the gap sealing may be used. In order to isolate the OLED elements 14 from ambient air to protect them, one or more passivation layers may be provided around the sealing member 24.

Further, power lines 20A, 20B, and 20C are formed on the sealing member 24 to drive the OLED elements 14. The power lines 20A, 20B, and 20C are formed of, for example, a conductive material, such as copper or aluminum. Moreover, a driver IC, i.e., a circuit element 28 is attached on the sealing member 24 to drive the plurality of the OLED elements 14. Adhesive 26 is preferably used for attachment of circuit element 28 to the sealing member 24. As the adhesive, for example, a heat-curable adhesive or an ultraviolet curable adhesive is used.

The circuit element 28 is the same as the circuit element 28 as described in detail with relation to the first embodiment. Similar to the first embodiment, the electrodes 30A and 30B of the circuit element 28 are respectively connected to the electrodes 18A and 18B on the substrate 12 via bonding wires 34A and 34B, and finally connected to a negative electrode and a positive electrode of each OLED element 14. The electrodes 32A, 32B, and 32C of the circuit elements 28 are connected to the power lines 20A, 20B, and 20C, respectively, via bonding wires 36A, 36B, and 36C.

The power line 20A is a low potential power line common to the OLED elements 14 and the circuit element 28. The power line 20B is a high potential power line of the OLED elements 14. The power line 20C is a high potential power line of the circuit element 28. These power lines 20A, 20B, and 20C are connected to a power unit via a flexible board (not shown).

Details on each OLED elements 14 is the same as those as described in detail in relation to the first embodiment referring to FIG. 3. The variations of the OLED elements as described above in relation to the first embodiment may be used.

A drive system of the electro-optical device 5010 is the same as the drive system of the electro-optical device 10 as described in detail in relation to the first embodiment referring to FIGS. 4 and 5. The variations of the circuit element 28 as described above in relation to the first embodiment may be used.

Figure 62:
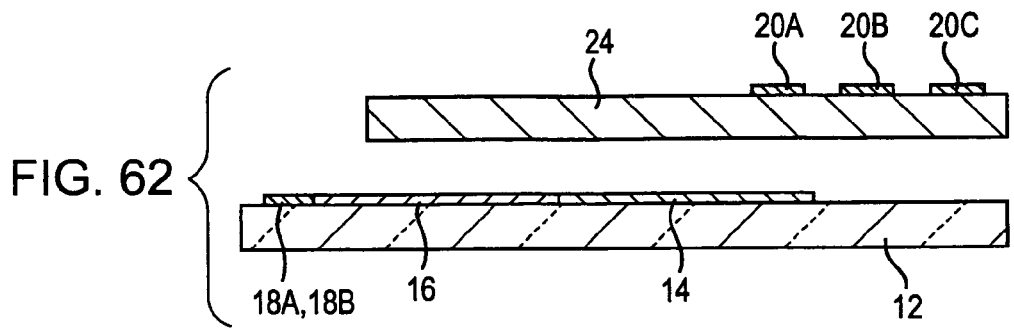
FIG. 62 shows a first process of a procedure of manufacturing the electro-optical device shown in FIG. 60.

Next, a procedure of manufacturing the electro-optical device 5010 of the eleventh embodiment will be described. First, as shown in FIG. 62, the OLED element 14, the wiring 16 and the electrodes 18A and 18B are formed on the substrate 12. Further, the power lines 20A, 20B, and 20C are formed on the sealing member 24. The forming method may be any one of the known methods, and description thereof will be omitted herein. Although not shown, thereafter, the power lines 20A, 20B, and 20C may be protected by an overcoat film. As the overcoat film, for example, there are an $SiO_2$ film, an SiN film, and a combination of them.

Figure 63:
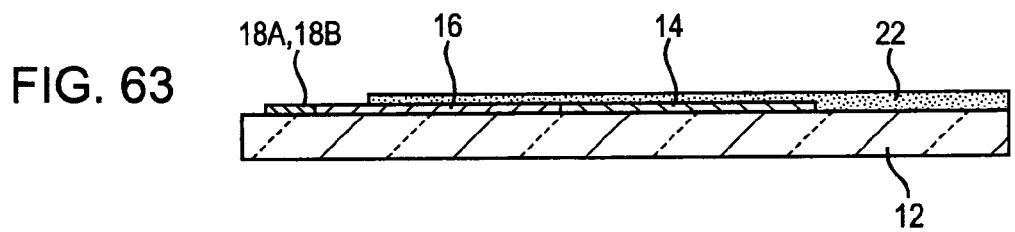
FIG. 63 shows a process subsequent to the process in FIG. 62.
Figure 64:
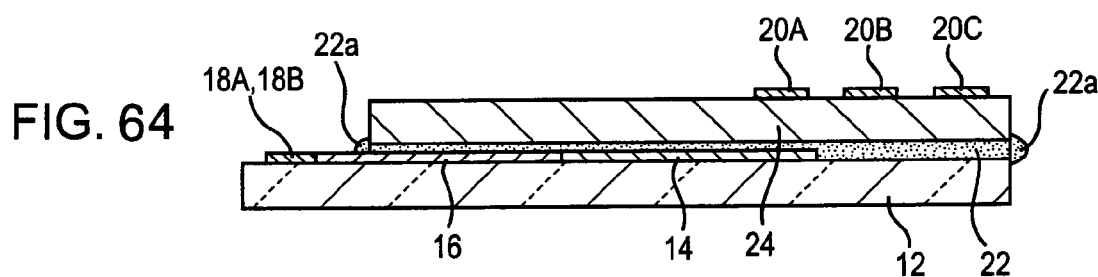
FIG. 64 shows a process subsequent to the process in FIG. 63.

Next, as shown in FIG. 63, the heat-curable or ultraviolet curable adhesive 22 for sealing are coated on the substrate 12. Further, as shown in FIG. 64, the sealing member 24 is put on the adhesive 22 to be adhered to the substrate 12, and thereafter, the adhesive 22 is cured. The adhesive 22 for sealing, as shown in FIG. 64, may have a protrusion 22a that protrudes from a space between the substrate 12 and the sealing member 24 to partially cover a side end of the sealing member 24. The provision of such a protrusion 22a enables the sealing effect to be further enhanced. The provision of the protrusion 22a may be made by coating a larger amount of adhesive than the amount to be actually disposed by the space substrate 12 and the sealing member 24, on the substrate 12 so that the adhesive protrudes from the space, or by further coating adhesive 22 on the outside thereof after the adhesive is cured.

Figure 65:
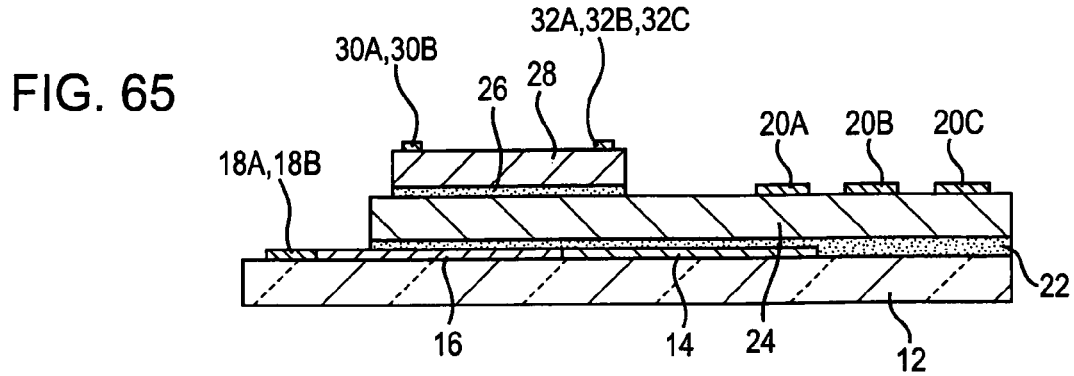
FIG. 65 shows a process subsequent to the process in FIG. 64.

As shown in FIG. 65, the heat-curable or ultraviolet curable adhesive 26 is coated on the bottom surface of the circuit element 28 (its surface opposite to the electrodes 30A, 30B, 32A, 32B, and 32C). Then, as shown in FIG. 65, the circuit element 28 is adhered to the sealing member 24, and then the adhesive 26 is cured. Further, as shown in FIGS. 60 and 61, by means of a wire bonding method, the bonding wires 34A, 34B, 36A, 36B, and 36C are attached to the above-described predetermined positions, thereby completing the electro-optical device 5010. It should is noted herein that the adhesion of the circuit element 28 to the sealing member 24 may be performed before the adhesion of the sealing member 24 to the substrate 12.

Since the power lines for feeding the plurality of self-emitting elements and the circuit with power need to flow a large amount of current therethrough, they have large cross-sectional area. If such power lines are provided on the substrate having the self-emitting elements formed thereon, a substrate having large area becomes necessary. However, according to the arrangement of this embodiment, the power lines 20A, 20B, and 20C for feeding the circuit element 28 and the OLED elements 14 with power are provided on the sealing member 24 sealing the OLED element 14, so that the area of the substrate 12 having the OLED elements 14 formed thereon can be reduced. Accordingly, the substrate 12 can be saved, which contributes to miniaturization of an apparatus including the electro-optical device 5010 as a whole.

Further, according to the arrangement of this embodiment, since the circuit element 28 which drives the OLED element 14 is provided so as to overlap the sealing member 24 which seals the OLED element 14, it is possible to reduce the area of the substrate 12 having the OLED elements 14 formed thereon. In the illustrated form, one side end of the sealing member 24 is made flush with one side end of the substrate 12, but as a variation of the arrangement of the sealing member and the substrate according to the invention, any one member may protrude from the other member.

Further, in the illustrated form, all the power lines 20A, 20B, and 20C are formed on the sealing member 24, but as a variation of the arrangement of the sealing member, the substrate, and the power lines, any one of the power lines 20A, 20B, and 20C may be formed on the sealing member 24, and the other(s) are on the substrate 12. In this case, any one of the power lines 20A, 20B, and 20C is arranged on the sealing member 24, so that the area of the substrate 12 can be reduced.

Twelfth Embodiment

Figure 66:
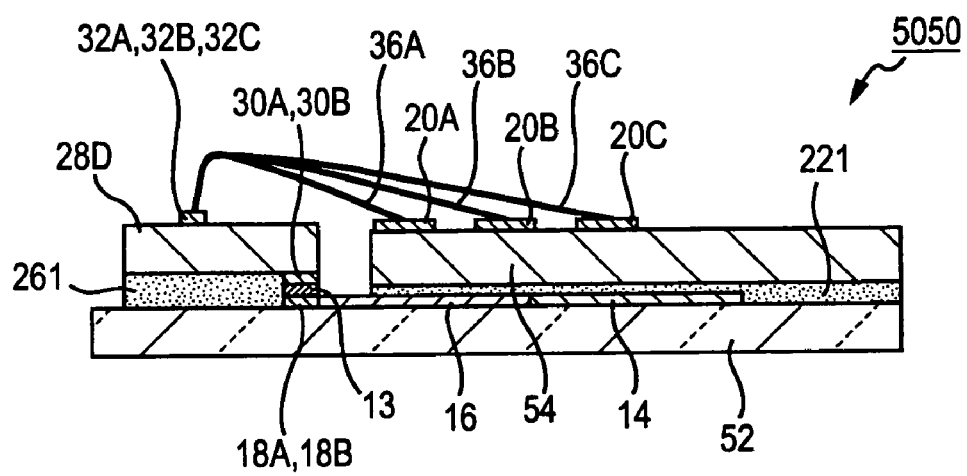
FIG. 66 is a cross-sectional view showing an electro-optical device according to a twelfth embodiment of the invention.
Figure 67:
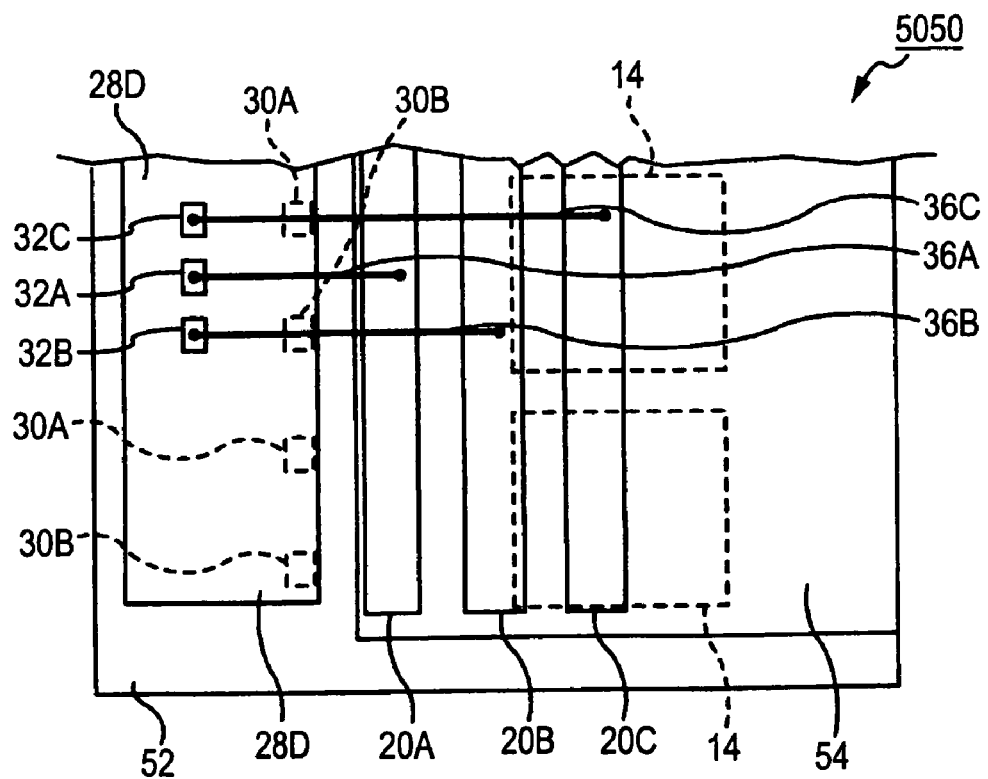
FIG. 67 is a partial plan view of the electro-optical device shown in FIG. 66.

FIG. 66 is a cross-sectional view showing an electro-optical device according to a twelfth embodiment of the invention, and FIG. 67 is a partial plan view of the electro-optical device. The electro-optical device is also used as a line-type optical head for writing a latent image in an image carrier in an image forming apparatus utilizing an electrophotographic method. As shown in these figures, the electro-optical device 5050 includes a transparent substrate 52 that is a flat plate formed of, preferably, glass, quartz, or plastic. Similar to the substrate 12 of the first embodiment, the plurality of OLED elements (self-emitting element) 14 is formed on the substrate 52. The electro-optical device is also a bottom emission type.

Electrodes 18A and 18B for feeding the OLED elements 14 with power and wiring 16 for connecting the OLED elements 14 with the electrodes 18A and 18B are formed on the substrate 52. The wiring 16 and the electrodes 18A and 18B are formed of, for example, a conductive material, such as aluminum.

Similar to the first embodiment, a sealing member 54 formed of, for example, glass, metal, ceramic, or plastic is attached to the substrate 52 with adhesive 221, such as a heat-curable adhesive or an ultraviolet curable adhesive, so that the sealing member seals the OLED elements 14 in cooperation with the substrate 52. As the type of sealing, any one of the above-described film sealing and the gap sealing may be used. In order to further isolate the OLED elements 14 from ambient air to protect them, one or more passivation layers may be provided around the sealing member 54.

Further, power lines 20A, 20B, and 20C are formed on the sealing member 54 to drive the OLED elements 14. The power lines 20A, 20B, and 20C are formed of, for example, a conductive material, such as copper or aluminum.

A driver IC, i.e., a circuit element 28D is attached on the substrate 52 to drive the plurality of the OLED elements 14. Adhesive 261 is preferably used for attachment of the circuit element 28D to the substrate 52. As the adhesive, for example, a heat-curable adhesive or an ultraviolet curable adhesive is used.

The circuit element 28D is the same driver IC as the circuit element 28 as described in detail in relation to the first embodiment. The circuit element 28D has the electrodes 30A and 30B on its bottom surface, whereas the circuit element 28 has the electrodes 30A and 30B its bottom surface. The electrodes 30A and 30B of the circuit element 28D attached on the substrate 52 touch on one surface of the anisotropic conductive material 13. The electrodes 18A and 18B formed on the substrate 52 touch the other surface of the anisotropic conductive materials 13. In other words, the electrodes 30A and 30B are opposed to electrodes 18A and 18B, respectively, with the anisotropic conductive material 13 therebetween. The anisotropic conductive material 13 shows electrical conductivity in a direction that opposed electrodes are connected to each other, and shows insulating properties in other directions. For example, a high polymer material, such as anisotropic conductive paste or anisotropic conductive film can be used as the anisotropic conductive material 13. As can be appreciated from the above, the electrodes 30A and 30B on the bottom surface of the circuit element 28D attached to the substrate 52 are connected to the electrodes 18A and 18B, respectively, formed on the substrate 52 via the anisotropic conductive material 13 and finally connected to a negative electrode and a positive electrode, respectively, of the OLED element 14. Further, similar to the first embodiment, the electrodes 32A, 32B, and 32C of the circuit element 28D are connected to the power lines 20A, 20B, and 20C, respectively, via the bonding wires 36A, 36B, and 36C.

The power line 20A is a low potential power line common to the OLED elements 14 and the circuit element 28D. The power line 20B is a high potential power line of the OLED elements 14. The power line 20C is a high potential power line of the circuit element 28D. These power lines 20A, 20B, and 20C are connected to a power unit via a flexible board (not shown).

Details on each OLED elements 14 is the same as those as described in detail in relation to the first embodiment referring to FIG. 3. The variations of the OLED elements as described above in relation to the first embodiment may be used.

A drive system of the electro-optical device 5050 is the same as the drive system of the electro-optical device 10 as described in detail in relation to the first embodiment referring to FIGS. 4 and 5. The variations of the circuit element as described above in relation to the first embodiment may be used.

With the arrangement of the sealing member 54, the substrate 52, and the power lines 20A, 20B, and 20C, a variation of the arrangement of the sealing member and the substrate as described above in relation to the first embodiment, and a variation of the arrangement of a sealing member a substrate and power lines as described in relation to the first embodiment may be used.

According to the arrangement of this embodiment, the power lines 20A, 20B, and 20C for feeding the OLED elements 14 with power are provided on the sealing member 54 sealing the OLED element 14, so that the area of the substrate 52 having the OLED elements 14 formed thereon can be reduced. Accordingly, the substrate 52 can be saved, which contributes to miniaturization of an apparatus including the electro-optical device 5050 as a whole.

Further, since the electrodes 30A and 30B are respectively overlapped with the electrodes 18A and 18B by attaching the circuit element 28D having the electrodes 30A and 30B on the substrate 52 so as to oppose the substrate 52, and by connecting the electrodes 30A and 30B to the electrodes 18A and 18B on the substrate 52 via the anisotropic conductive material 13, the area of the substrate 52 having the OLED elements 14 formed thereon can be reduced.

Thirteenth Embodiment

Figure 68:
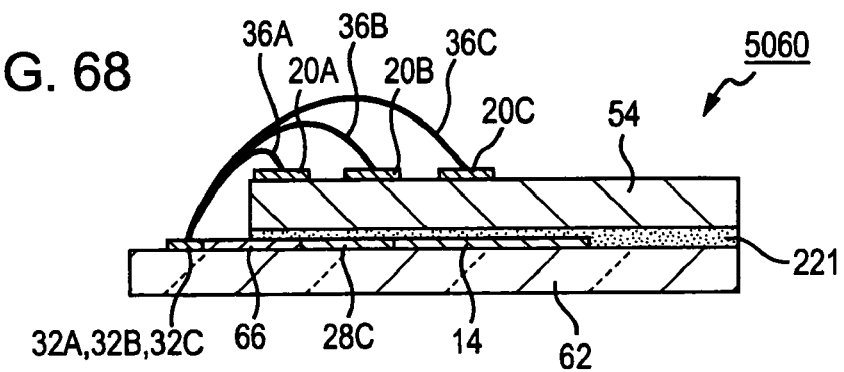
FIG. 68 is a cross-sectional view showing an electro-optical device according to a thirteenth embodiment of the invention.
Figure 69:
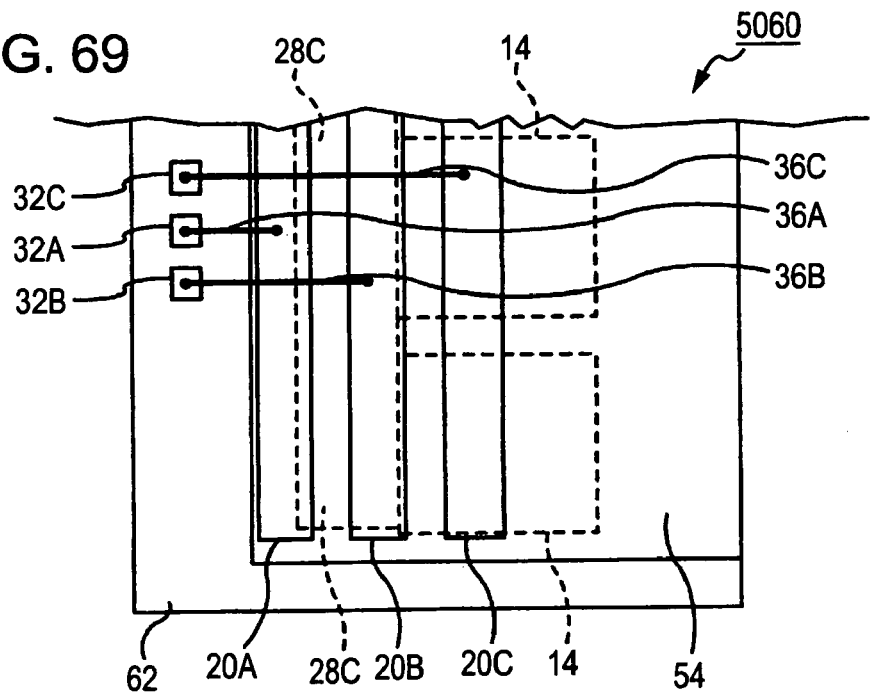
FIG. 69 is a partial plan view of the electro-optical device shown in FIG. 68.

FIG. 68 is a cross-sectional view showing an electro-optical device according to a thirteenth embodiment of the invention, and FIG. 69 is a partial plan view of the electro-optical device. The electro-optical device is also used as a line-type optical head for writing a latent image in an image carrier in an image forming apparatus utilizing an electrophotographic method. As shown in these figures, the electro-optical device 5060 includes a transparent substrate 62 that is a flat plate formed of, preferably, glass, quartz, or plastic. Similar to the substrate 12 of the first embodiment, the plurality of OLED elements (self-emitting element) 14 is formed on the substrate 62. The electro-optical device is also a bottom emission type.

Electrodes 32A, 32B, and 32C respectively connected to power lines 20A, 20B, and 20C, a circuit laminate 28C, and wiring 66 that connects the circuit laminate 28C with the electrodes 32A, 32B, and 32C are formed on the substrate 62. Similar to the circuit laminate 28B of the third and eighth embodiment, the circuit laminate 28C is a driver IC to drive the plurality of OLED elements 14, and is formed as a TFT array on the substrate 62. However, the circuit laminate 28C may be any other structures in which it is formed so as to be laminated on the substrate 62. The circuit laminate 28C has a circuit equivalent to the circuit element 28 as described in detail in relation to the first embodiment. The wiring 66 and the electrodes 32A, 32B, and 32C are formed of, for example, a conductive material, such as aluminum.

Figure 70:
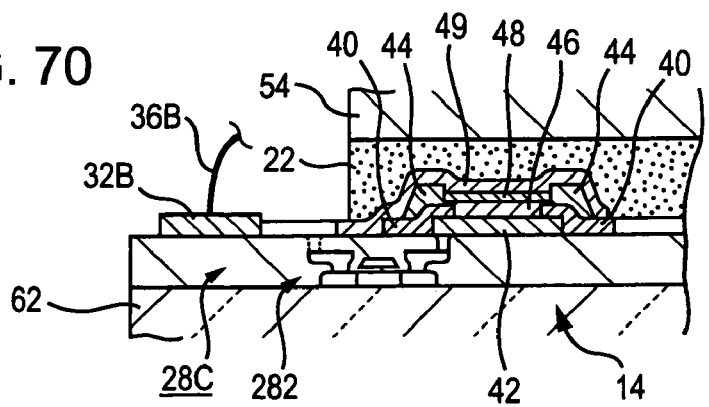
FIG. 70 is a cross-sectional view showing details on an OLED element and a circuit laminate within the electro-optical device shown in FIG. 68.

FIG. 70 is a cross-sectional view showing details on the OLED element 14 and the circuit laminate 28C. As shown in this drawing, the circuit laminate 28C is film-formed on the substrate 62, similar to the OLED element 14. Formation of the OLED element 14 and the circuit laminate 28C is performed so that a high potential-side terminal of a driving transistor 282 is directly connected to a positive electrode 42 of the OLED element 14, and a low potential-side terminal of the driving transistor 282 is directly connected to a negative electrode 49 of the OLED element 14. On account of this, the electrodes 18A and 18B and the bonding wires connected thereto which are required in the eleventh embodiment becomes unnecessary in this embodiment.

As shown in FIGS. 68 and 69, similar to the first embodiment, a sealing member 54 is attached to the substrate 62 with heat-curable or ultraviolet curable adhesive 221. As the type of sealing, any one of the above-described film sealing and the gap sealing may be used. Of course, one or more passivation layers may be provided around the sealing member 54. Moreover, the power lines 20A, 20B, and 20C as described in detail in relation to the first embodiment are formed on the sealing member 54 so as to overlap the OLED element 14. Further, similar to the first embodiment, the electrodes 32A, 32B, and 32C on the substrate 62 are connected to the power lines 20A, 20B, and 20C, respectively, via the bonding wires 36A, 36B, and 36C.

As for the details on each OLED element, the drive system of the electro-optical device, and the arrangement of the sealing member, the substrate, and the power lines, the various variations as described in detail in relation to the first embodiment may be employed.

According to this embodiment, the power lines 20A, 20B, and 20C for feeding the OLED elements 14 with power are provided on the sealing member 54 sealing the OLED element 14, so that the area of the substrate 62 on which the OLED elements 14 are formed can be reduced. Accordingly, the substrate 62 can be saved, which contributes to miniaturization of an apparatus including the electro-optical device 5060 as a whole.

Further, the area of the substrate 62 on which the OLED element 14 is formed can be reduced by forming, as a laminate, a circuit to drive and control the OLED element 14, on the substrate 62 forming the OLED element 14.

Fourteenth Embodiment

Figure 71:
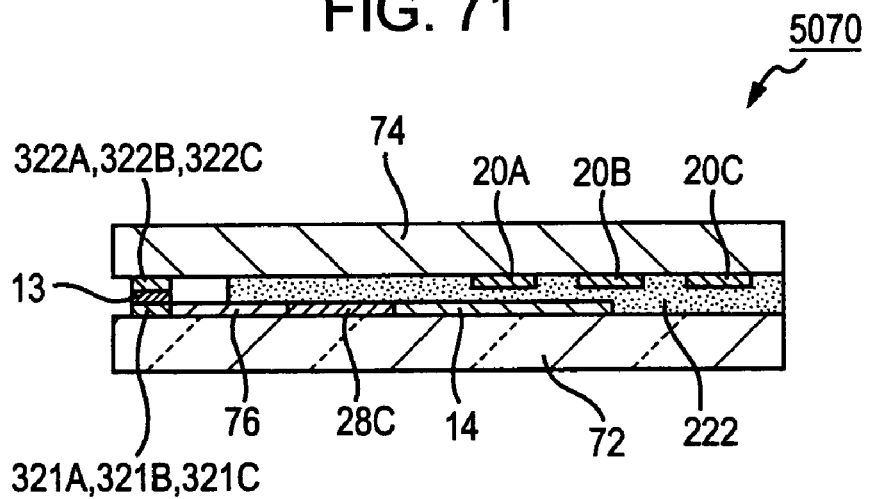
FIG. 71 is a cross-sectional view showing an electro-optical device according to a fourteenth embodiment of the invention.
Figure 72:
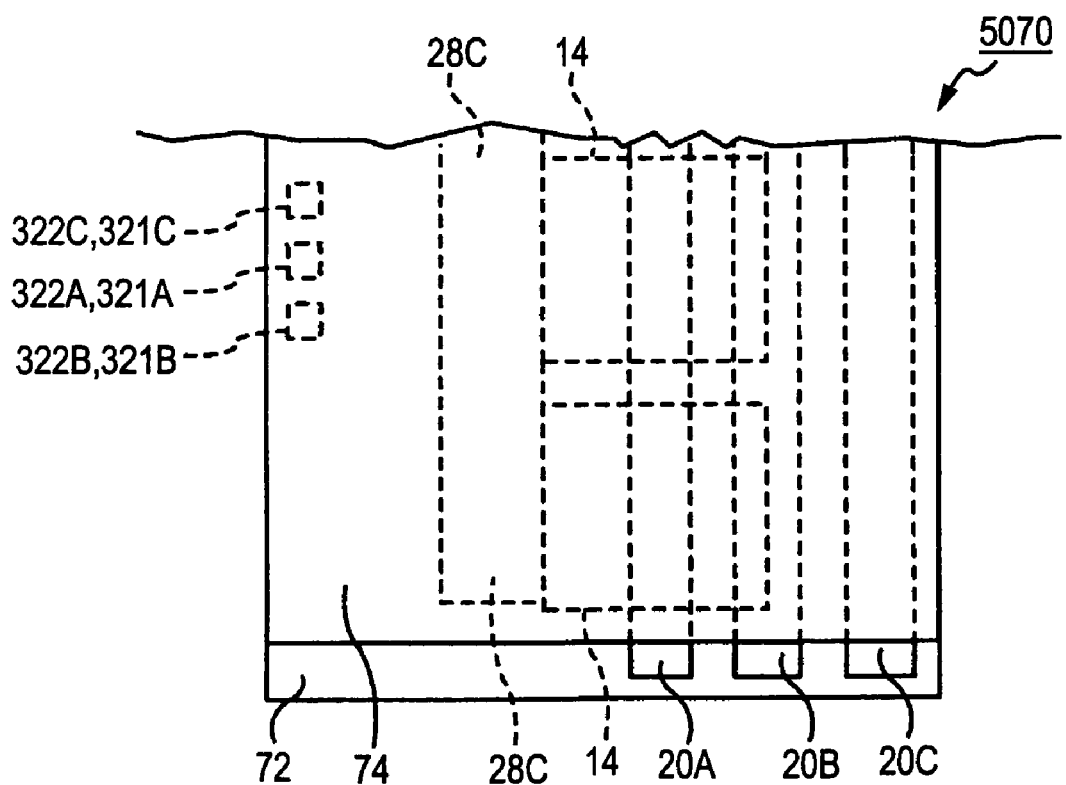
FIG. 72 is a partial plan view of the electro-optical device shown in FIG. 71.

FIG. 71 is a cross-sectional view showing an electro-optical device according to a fourteenth embodiment of the invention, and FIG. 72 is a partial plan view of the electro-optical device. The electro-optical device is also used as a line-type optical head for writing a latent image in an image carrier in an image forming apparatus utilizing an electrophotographic method. As shown in these figures, the electro-optical device 5070 includes a transparent substrate 72 that is a flat plate formed of, preferably, glass, quartz, or plastic. Similar to the substrate 12 of the first embodiment, the plurality of OLED elements (self-emitting element) 14 is formed on the substrate 72. The electro-optical device is also a bottom emission type.

Electrodes 321A, 321B, and 321C, a circuit laminate 28C as described in detail in relation to the thirteenth embodiment, and wiring 76 that connects the circuit laminate 28C with the electrodes 321A, 321B, and 321C are formed on the substrate 72. The electrodes 321A, 3211B, and 321C are connected to the power lines 20A, 20B, and 20C, respectively, via electrodes 322A, 322B, and 322C to be described below, and the anisotropic conductive material 13 as described in detail in relation to the twelfth embodiment. The wiring 76 and the electrodes 32A, 32B, and 32C are formed of, for example, a conductive material, such as aluminum.

Similar to the first embodiment, a sealing member 74 formed of, for example, glass, metal, ceramic, or plastic is attached to the substrate 72 with adhesive 222, such as a heat-curable adhesive or an ultraviolet curable adhesive, so that the sealing member seals the OLED elements 14 in cooperation with the substrate 72. In this embodiment, the above-described film sealing is used. Of course, one or more passivation layers may be provided around the sealing member 74. The power lines 20A, 20B, and 20C as described in detail in relation to the eleventh embodiment, and the previously described electrodes 322A, 322B, and 322C are provided on the surface of the sealing member 74 opposed to the substrate 72. The power lines 20A, 20B, and 20C are electrically connected to the electrodes 322A, 322B, and 322C, respectively. Although detailed illustration is omitted, wiring that connects the power lines with the electrodes and an insulating film are provided on the bottom surface of the sealing member 74, and the insulating film is interposed between the power lines and the wiring which should not be connected to each other. The power lines 20A, 20B, and 20C protrude farther than the substrate 72 or the sealing member 74 at the front side or reverse side of the sheet of FIG. 71, and are connected to a power unit via a flexible board (not shown).

When the sealing member 74 is bonded to the substrate 72, the electrodes 322A, 322B, and 322C are provided so as to oppose the electrodes 321A, 321B, and 321C, respectively, on the substrate 72, with the above-mentioned anisotropic conductive material 13 therebetween. The anisotropic conductive material 13 makes the opposed electrodes among the electrodes 322A, 322B, and 322C and the electrodes 321A, 321B, and 321C be electrically connected to each other.

As can be appreciated from the above, the electrodes 321A, 321B, and 321C are connected to the power lines 20A, 20B, and 20C, respectively, via the anisotropic conductive material 13 and the electrodes 322A, 322B, and 322C. This construction makes the bonding wires 36A, 36B and 36C as needed in the eleventh to thirteenth embodiments unnecessary. Further, as described in detail in the twelfth embodiment, the electrodes 18A and 18B and the bonding wires connected thereto become unnecessary.

As for the details on each OLED element, the drive system of the electro-optical device, and the arrangement of the sealing member and the substrate, the various variations as described in detail in relation to the first embodiment may be employed. In addition, in the illustrated form, both side ends of the sealing member 74 is made flush with both side ends of the substrate 72, but as a variation of the arrangement of the sealing member and the substrate according to the invention, any one member may protrude from the other member at any one of those ends.

According to this embodiment, the power lines 20A, 20B, and 20C for feeding the OLED elements 14 with power are provided on the sealing member 74 sealing the OLED element 14, so that the area of the substrate 72 on which the OLED elements 14 are formed can be reduced. Accordingly, the substrate 72 can be saved, which contributes to miniaturization of an apparatus including the electro-optical device 5070 as a whole.

Further, the area of the substrate 72 on which the OLED element 14 is formed can be reduced by forming, as a laminate, a circuit to drive and control the OLED element 14, on the substrate 72 forming the OLED element 14.

<Image Forming Apparatus>

As described above, any one of the electro-optical devices of the embodiments can be used as a line-type optical head for writing a latent image in an image carrier in an image forming apparatus utilizing an electrophotographic method. As examples of the image forming apparatus, there are a printer, a printing unit of a copying machine, and a printing unit of a facsimile.

Figure 73:
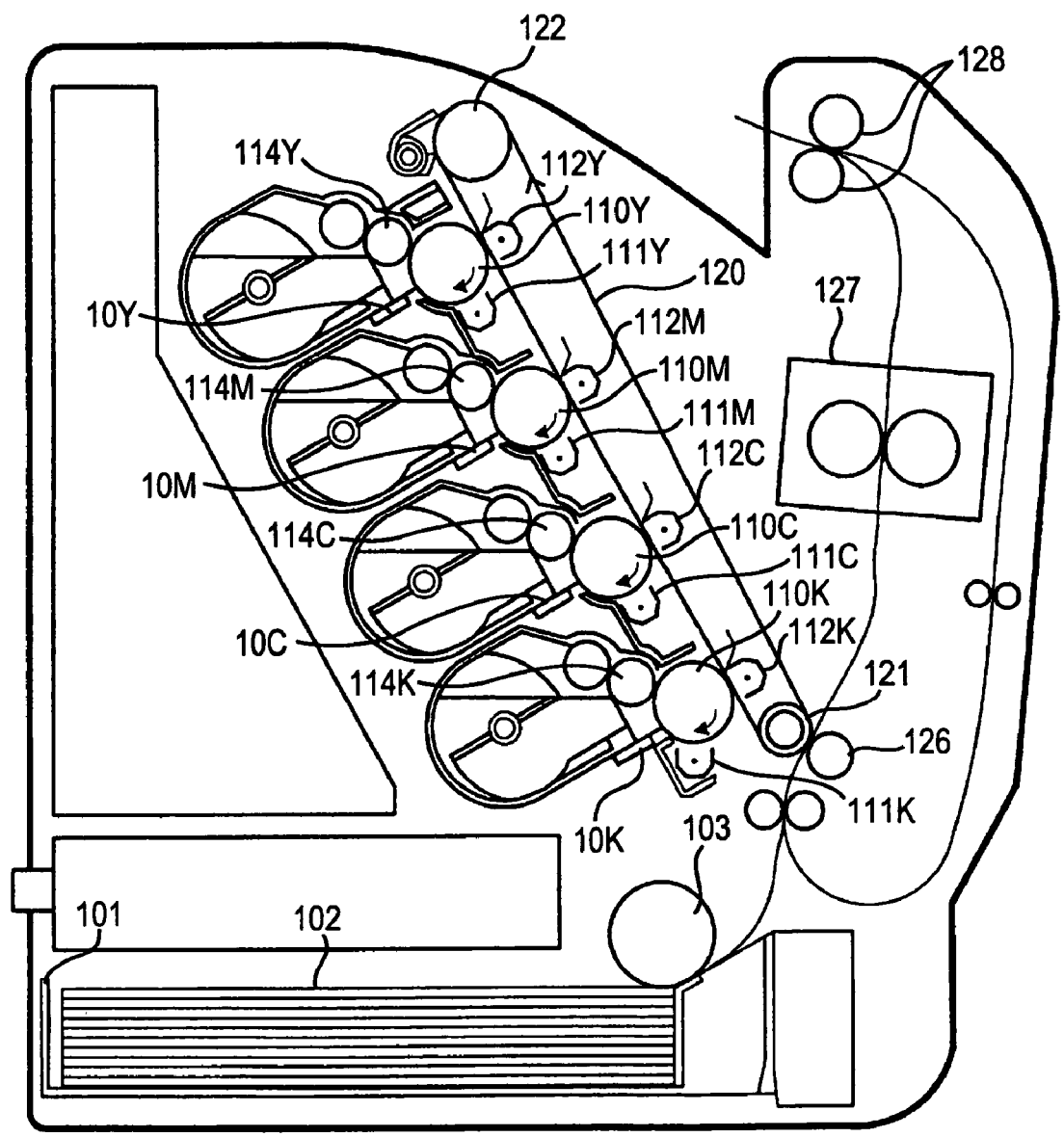
FIG. 73 is a longitudinal sectional view showing an example of image forming apparatuses using the electro-optical devices of the embodiments.

FIG. 73 is a longitudinal sectional view showing an example of image forming apparatuses using any one of the above-described electro-optical devices as the line-type optical head. The image forming apparatus is a tandem-type full-color image forming apparatus using a belt intermediate transfer body method.

In the image forming apparatus, four organic EL array exposing heads 10K, 10C, 10M, and 10Y having the same configuration are arranged at exposure positions of four corresponding photoconductor drums (image carriers) 110K, 110C, 110M, and 110Y having the same configuration. The organic EL array exposing heads 10K, 11C, 10M, and 10Y are the above-described electro-optical devices.

As shown in FIG. 73, the image forming apparatus is provided with a driving roller 121 and a follower roller 122, and an endless intermediate transfer belt 120 is wound around these rollers 121 and 122 so as to be rotate around the rollers 121 and 122 as indicated by the arrow. Although not shown, the image forming apparatus may be provided with tension applying means, such as a tension roller, that applies a tension to the intermediate transfer belt 120.

The photoconductor drums 110K, 110C, 110M, and 110Y each having a photosensitive layer on its outer peripheral surface are arranged at a predetermined distance from each other around the intermediate transfer belt 120. The suffixes K, C, M, and Y means that the photoconductor drums are used for forming a visualized image in black, cyan, magenta, and yellow, respectively. This is true of the other members. The photoconductor drums 110K, 110C, 110M, and 110Y are driven to rotate in synchronization with driving of the intermediate transfer belt 120.

A corona charging device 111 (K, C, M, and Y), the organic EL array exposing head 10 (K, C, M, and Y), and a developing device 114 (K, C, M, and Y) are arranged around each photoconductor drum 110 (K, C, M, and Y). The corona charging device 111 (K, C, M, and Y) uniformly charges the outer peripheral surface of the corresponding photoconductor drum 110 (K, C, M, and Y). The organic EL array exposing head 10 (K, C, M, and Y) writes an electrostatic latent image on the charged outer peripheral surface of the photoconductor drum. Each organic EL array exposing head 10 (K, C, M, or Y) is arranged such that the arrayed direction of a plurality of organic EL elements 14 is aligned with the generatrix (main scanning direction) of each photoconductor drum 110 (K, C, M, or Y). The writing of an electrostatic latent image is performed by irradiating photoconductor drums with light from the plurality of OLED elements 14. The developing device 114 (K, C, M, and Y) deposits toner as developer on the electrostatic latent image so that a visualized image, i.e., a visible image is formed on a corresponding photoconductor drum.

The respective visualized images of black, cyan, magenta, and yellow formed by such four single-color visualized image forming stations are primarily transferred sequentially onto the intermediate transfer belt 120 so that they are superposed onto each other on the intermediate transfer belt 120. As a result, a full-color visualized image is obtained. Four primary transfer corotrons (transferring device) 112 (K, C, M, and Y) are arranged inside the intermediate transfer belt 120. The primary transfer corotrons 112 (K, C, M, and Y) are arranged in the vicinity of the photoconductor drums 110 (K, C, M, and Y), respectively, and electrostatically attract visualized images from the photoconductor drums 110 (K, C, M, and Y) to transfer the visualized images to the intermediate transfer belt 120 passing between the photoconductor drums and the primary transfer corotrons.

A sheet 102 as a target on which an image is to be finally formed is fed one by one from a sheet feed cassette 101 by a pickup roller 103, and then sent to a nip between the intermediate transfer belt 120 abutting the driving roller 121 and a secondary transfer roller 126. The full-color visualized image on the intermediate transfer roller 120 is secondarily transferred onto one side of the sheet 102 all at once by the secondary transfer roller 126, and then passes between a pair of fixing rollers 127 as a fixing unit to be fixed on the sheet 102. Thereafter, the sheet 102 is discharged onto a sheet discharge cassette, which is formed on the top of the image forming apparatus, by a pair of sheet discharge rollers 128.

Since the imager forming apparatus shown in FIG. 73 utilizes the electro-optical device having the organic EL array as a writing unit, it is possible to miniaturize the image forming apparatus compared to a case in which a laser scan optical system is utilized. Further, as described above, since the electro-optical device has the elements which can be made smaller than those in the related art, it can be disposed at a position close to the photoconductor drums 110K, 110C, 110M, and 110Y, which makes it possible to further miniaturize the image forming apparatus.

Next, an image forming apparatus according to another embodiment of the invention will be described.

Figure 74:
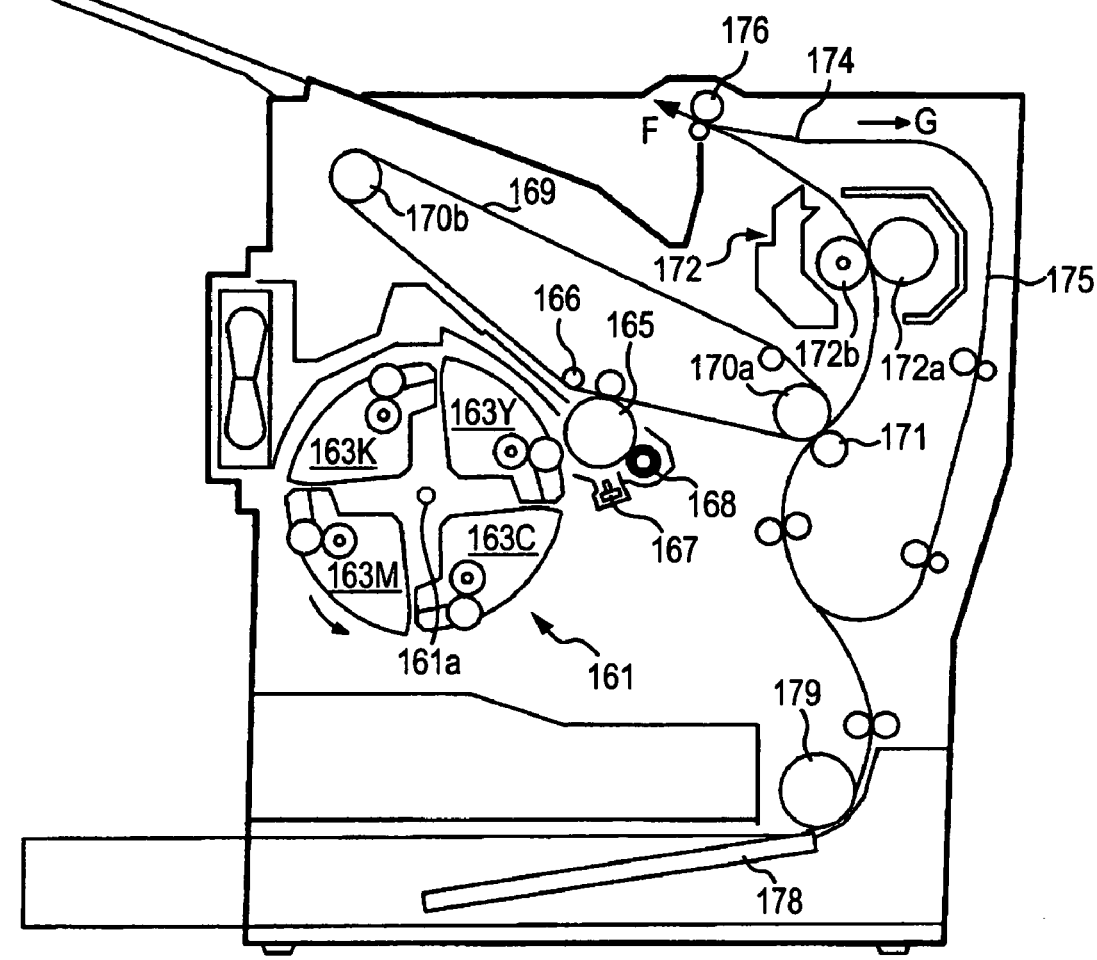
FIG. 74 is a longitudinal sectional view showing another example of image forming apparatuses using the electro-optical devices of the embodiments.

FIG. 74 is a longitudinal sectional view showing another image forming apparatuses using the electro-optical devices as a line-type optical head. The image forming apparatus is a rotary-development-type full-color image forming apparatus using a belt intermediate transfer body method. In an image forming apparatus shown in FIG. 74, a corona charging device 168, a rotary developing unit 161, an organic EL array exposing head 167, and an intermediate transfer belt 169 are provided around a photoconductor drum (image carrier) 165. The corona charging device 168 uniformly charges an outer peripheral surface of the photoconductor drum 165.

The corona charging device 168 uniformly charges an outer peripheral surface of the photoconductor drum 165. The organic EL array exposing head 167 writes an electrostatic latent image on the charged outer peripheral surface of the photosensitive drum 165. The organic EL array exposing head 167, which is any one of the above-described electro-optical devices, is arranged such that the arrayed direction of a plurality of OLED elements 14 is aligned with the generatrix (main scanning direction) of the photoconductor drum 165. The writing of an electrostatic latent image is performed by irradiating photosensitive drums with light from the plurality of OLED elements 14.

The developing unit 161 is a drum in which four developing devices 163Y, 163C, 163M, and 163K are arranged at intervals of 90 degrees, and is rotatable around a shaft 161a counterclockwise. The developing devices 163Y, 163C, 163M, and 163K supply yellow, cyan, magenta and black toners to the photoconductor drum 165, respectively, to deposit the toners as developer on an electrostatic latent image so that a visualized image, i.e., a visible image is formed on the photosensitive drum 165.

The endless intermediate transfer belt 169 is wound around a driving roller 170a, a follower roller 170b, a first transfer roller 166, and a tension roller so as to rotate around these rollers in a direction as indicated by the arrow. The primary transfer roller 166 electrostatically attract a visualized image from the photoconductor drum 165 to transfer the visualized image to the intermediate transfer belt 169 passing between this photoconductor drum and the primary transfer roller 166.

Specifically, during the first one turn of the photoconductor drum 165, an electrostatic latent image for a yellow (Y) image is written by the exposing head 167, a visualized image with the same color is then formed by the developing device 163Y, and the visualized image is then transferred to the intermediate transfer belt 169. During the next one turn of the photoconductor drum, an electrostatic latent image for a cyan (C) image is written by the exposing head 167, a visualized image with the same color is then formed by the developing device 163C, and the visualized image is then transferred to the intermediate transfer belt 169 so as to be superposed on the yellow visualized image. While the photoconductor drum 165 makes four turns in this way, visualized images with yellow, cyan, magenta, and black are sequentially superposed on the intermediate transfer belt 169. As a result, a full-color visualized image is formed on the transfer belt 169. When visualized images are formed on both sides of a sheet as a target on which the image is to be finally formed, full-color images are formed on the intermediate transfer belt 169 in such a manner that visualized images with the same color are transferred to the surface and reverse side of the intermediate transfer belt 159, and then visualized imaged with the next same color are transferred to the surface and reverse side of the intermediate transfer belt 169.

A sheet conveying path 174 is formed in the image forming apparatus for allowing a sheet to pass therethrough. A sheet is withdrawn one by one by a pickup roller 179 from a sheet feed cassette 178, is advanced by a conveying roller along the sheet conveying path 174, and passes through a nip between the intermediate transfer belt 169 abutting the driving roller 170a and the secondary transfer roller 171. The secondary transfer roller 171 electrostatically attract a full-color visualized image from the intermediate transfer belt 169 all at once to transfer the visualized image to one side of the sheet. The secondary transfer roller 171 is adapted to approach and separate from the intermediate transfer belt 169 by a clutch (not shown). While a full-color image is transferred to a sheet, the secondary transfer roller 171 is brought into abutment with the intermediate transfer belt 169, and while a visualized image is superposed on the intermediate transfer belt 169, the secondary transfer roller 171 is separated from the intermediate transfer roller.

The sheet having the visualized image transferred thereto in the above manner is conveyed to the fixing unit 172, and then passes between a heating roller 172a and a pressure roller 172b of the fixing unit 172, so that the visualized image on the sheet is fixed. The sheet after the fixing treatment is drawn into a pair of sheet discharge rollers 176 to advance in the direction indicated by an arrow F. In a case of double-sided printing, after most of a sheet has past between the pair of sheet discharge rollers 176, the pair of sheet discharge rollers 176 is rotated in a reverse direction so that the sheet is introduced into a conveying path 175 for double-sided printing, as indicated by an arrow G. Then, the visualized image is transferred to the other side of the sheet by the secondary transfer roller 171 to be subjected to a fixing treatment by a re-fixing unit 172, and thereafter the sheet is discharged by the pair of sheet discharge rollers 176.

Since the image forming apparatus shown in FIG. 74 utilizes the exposing head (electro-optical device) 167 having the organic EL array as a writing unit, it is possible to miniaturize the image forming apparatus compared to a case in which a laser scan optical system is utilized. Further, as described above, since the electro-optical device has the elements which can be made smaller than those in the related art, it can be disposed at a position close to the photo conductor drum 165, which makes it possible to further miniaturize the image forming apparatus.

Although the image forming apparatus to which the electro-optical device can be applied has been exemplified hitherto, the electro-optical device can also be applied to other electrophotographic image forming apparatuses. Such image forming apparatuses are within the scope of the invention. For example, the electro-optical device can also be applied to an image forming apparatus of a type that a visualized image is directly transferred onto a sheet from a photoconductor drum without using an intermediate transfer belt, and to an image forming apparatus which forms a monochrome image.

<Image Reader>

Further, any one of the above-described electro-optical devices can be used as a line-type optical head for irradiating an object to be read in an image reader with light. As an example of the image reader, there are a scanner, a reading unit of a copying machine, a reading unit of a facsimile, a bar code reader, and a two-dimensional image code reader that reads two-dimensional bar codes, such as QR codes (registered trademark).

Figure 75:
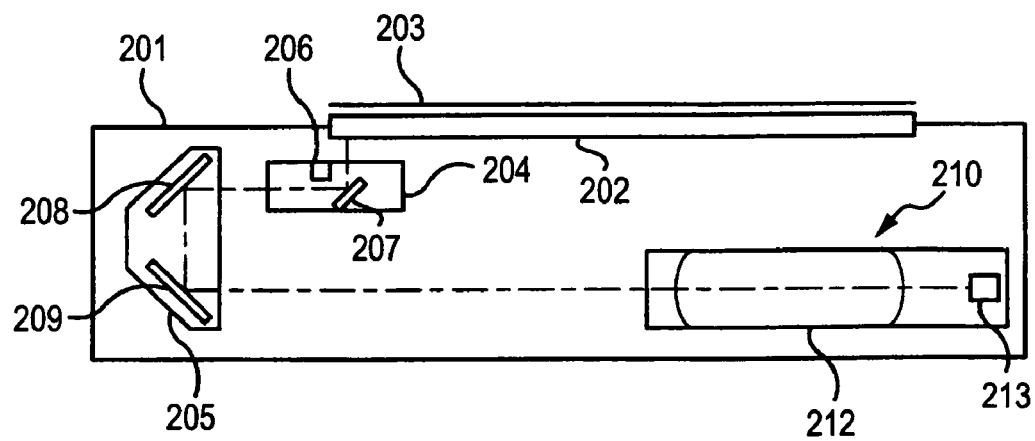
FIG. 75 is a longitudinal sectional view showing an example of reading apparatuses using the electro-optical devices of the embodiments.

FIG. 75 is a longitudinal sectional view showing an example of image readers using any one of the above-described electro-optical devices as a line-type. A flat platen glass 202 is provided in an upper portion of a cabinet 201 of the image reader, and an original document 203 is put on the platen glass 202 with its image surface down. Then, a platen cover (not shown) presses the original document 203 against the platen glass 202.

A high-speed carriage 204 and a low-speed carriage 205 are arranged inside the cabinet 201 so as to be movable laterally. The high-speed carriage 204 is mounted with an organic EL array exposing head 206 which irradiates the original document 203 with light and a reflecting mirror 207, and the low-speed carrier 205 is mounted with reflecting mirrors 208 and 209. The organic EL array exposing head 206 and the reflecting mirrors 207, 208, and 209 extend in the direction (main scanning direction) perpendicular to the paper surface in FIG. 75. Further, the organic EL array exposing head 206 is installed so that the arrayed direction of a plurality of OLED element 14 is aligned with the main scanning direction.

Further, an original document reading unit 210 is disposed at a fixed position inside the cabinet 201. The original document reading unit 201 includes a line sensor (a light receiver) 213 composed of a focusing lens 212 and a plurality of photosensitive pixels (charge-coupling elements). The line sensor 213 extends in the direction (main scanning direction) perpendicular to the paper surface in FIG. 75, and is installed so that the arrayed direction of the plurality of photosensitive pixels is aligned with the main scanning direction.

The light emitted from the organic EL array exposing head 206 is transmitted through the platen glass 202 and then reflected by the bottom surface of the original document 203. The reflected light from the original document 203 is transmitted through the platen glass 202, reflected by the reflecting mirrors 207 to 209, and then focused on the line sensor 213 by the focusing sensor 212. The high-speed carriage 204 moves laterally so that the entire surface of the original document 203 is irradiated by the organic EL array exposing head 206, and the low-speed carriage 205 moves at half the speed of the high-speed carriage 204 so that the length of an optical path for reflected light from the original document 203 to the line sensor 213 is kept constant.

As described above, the electro-optical device is used as the organic EL array exposing head 206 that is an illumination device of the image reader. In this case, in this type of illumination device, it is preferable that all of OLED elements 14 within a range equivalent to the width of an original document simultaneously and intermittently emit light for a prolonged period of time. Accordingly, in the drive system shown in FIGS. 4 and 5, it is desirable that the pixel blocks within a range equivalent to the width of an original document are intermittently supplied with selection signals for a period of time equivalent to at least the length of the original document without driving the pixel blocks B1 to B40 in a four-division manner. Moreover, it is desirable that all the selection signals D0 to D127 are simultaneously turned on for the period of time. Otherwise, the data lines L0 to L127 and the storage transistor 281 which transmits the data signals D0 to D127 may be eliminated.

Although the image reader to which the electro-optical device can be applied has been exemplified hitherto, the electro-optical device can also be applied to other image readers. Such image readers are within the scope of the invention. For example, a light receiver may be moved along with an electro-optical device as an illumination device, and a light receiver and an electro-optical device may be fixed together and an original document or an object to be read may be moved so as to be read.

<Other Applications>

Although the invention has been illustrated and described in detail referring to the preferred embodiments thereof, a person skilled in the art will appreciate that various changes can be made to forms and details within the spirit and scope of the invention as set forth in the claims. The applicant intends that these changes, alternations, and modifications are to be included in the scope of the invention.

For example, the electro-optical device according to the invention can be applied to various exposing devices, illumination devices, and image display devices.

What is claimed is:

1. An electro-optical device comprising:
    a substrate;
    a plurality of emitting elements formed on the substrate;
    a sealing member attached to the substrate so as to seal the emitting elements in cooperation with the substrate, the sealing member having an outer surface facing away from the emitting elements;
    a circuit that is attached to the outer surface of the sealing member and that drives or controls the emitting elements, the circuit having an outer surface facing away from the sealing member;
    a power line provided on the substrate;
    an electrode on the outer surface of the circuit; and
    a bonding wire connecting the power line to the electrode.

2. An image reader comprising:
    the electro-optical device, according to claim 1, having a plurality of the emitting elements arrayed therein; and
    a light receiver that receives light emitted from the emitting elements and reflected from an object to be read, and converts the reflected light into electrical signals.

* * * * *

UNITED STATES PATENT AND TRADEMARK OFFICE
CERTIFICATE OF CORRECTION

PATENT NO. : 7,541,619 B2
APPLICATION NO. : 11/217455
DATED : June 2, 2009
INVENTOR(S) : Toshinori Tanaka It is certified that error appears in the above-identified patent and that said Letters Patent is hereby corrected as shown below:

Title page,
Please remove
Item "[75], Inventor, Kazunori Sakurai, Chino (JP)"

Signed and Sealed this

First Day of September, 2009

David J. Kappos
*Director of the United States Patent and Trademark Office*